United States Patent
Or-Bach et al.

(10) Patent No.: US 9,023,688 B1
(45) Date of Patent: May 5, 2015

(54) METHOD OF PROCESSING A SEMICONDUCTOR DEVICE

(71) Applicant: Monolithic 3D Inc., San Jose, CA (US)

(72) Inventors: Zvi Or-Bach, San Jose, CA (US); Brian Cronquist, San Jose, CA (US); Albert Karl Henning, Palo Alto, CA (US)

(73) Assignee: Monolithic 3D Inc., San Jose, CA (US)

(*) Notice: Subject to any disclaimer, the term of this patent is extended or adjusted under 35 U.S.C. 154(b) by 0 days.

(21) Appl. No.: 14/298,917

(22) Filed: Jun. 7, 2014

Related U.S. Application Data

(60) Provisional application No. 61/889,500, filed on Oct. 10, 2013, provisional application No. 61/832,922, filed on Jun. 9, 2013.

(51) Int. Cl.
| | |
|---|---|
| *H01L 21/00* | (2006.01) |
| *H01L 21/8238* | (2006.01) |
| *H01L 21/20* | (2006.01) |
| *H01L 21/44* | (2006.01) |
| *H01L 21/768* | (2006.01) |

(52) U.S. Cl.
CPC ............... *H01L 21/76885* (2013.01)

(58) Field of Classification Search
USPC .............. 438/109, 122, 199, 584, 663; 257/E21.532, E21.602, E21.614
See application file for complete search history.

(56) References Cited

U.S. PATENT DOCUMENTS

| | | | |
|---|---|---|---|
| 2002/0175401 A1* | 11/2002 | Huang et al. | 257/686 |
| 2004/0156172 A1* | 8/2004 | Lin et al. | 361/704 |
| 2008/0142937 A1* | 6/2008 | Chen et al. | 257/675 |

* cited by examiner

*Primary Examiner* — Mohsen Ahmadi

(57) ABSTRACT

A method for processing a semiconductor device, the method including; providing a first semiconductor layer including first transistors; forming interconnection layers overlying the transistors, where the interconnection layers include copper or aluminum; forming a shielding heat conducting layer overlaying the interconnection layers; forming an isolation layer overlaying the shielding heat conducting layer; forming a second semiconductor layer overlying the isolation layer, and processing the second semiconductor layer at a temperature greater than about 400° C., where the interconnection layers are kept at a temperature below about 400° C.

20 Claims, 22 Drawing Sheets

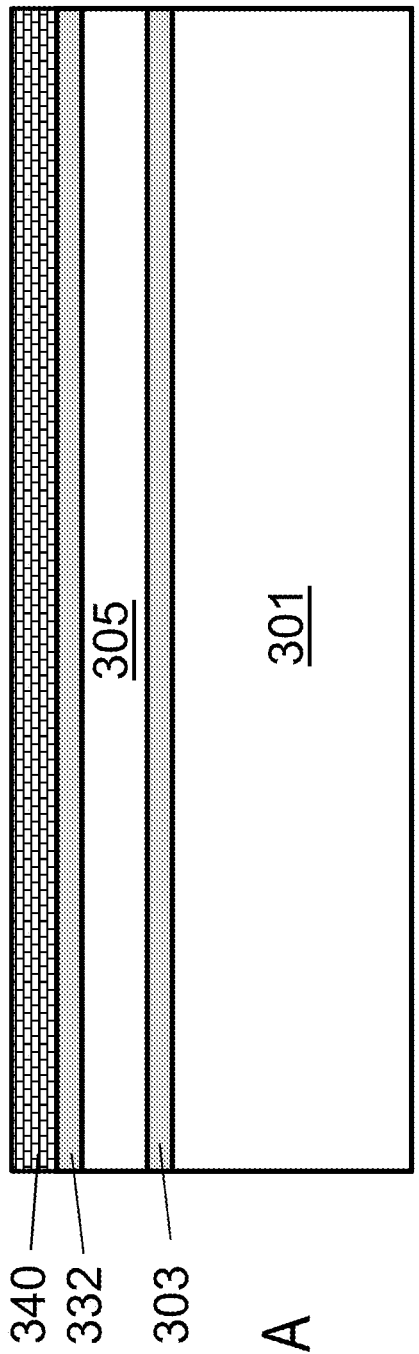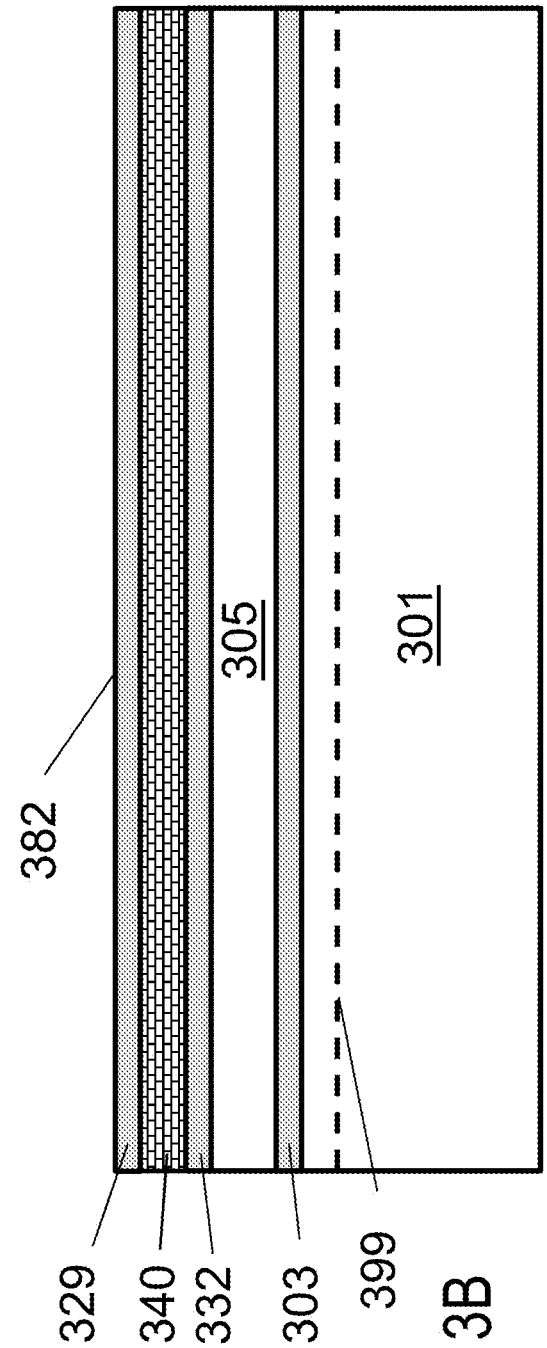
Fig. 3A
Fig. 3B

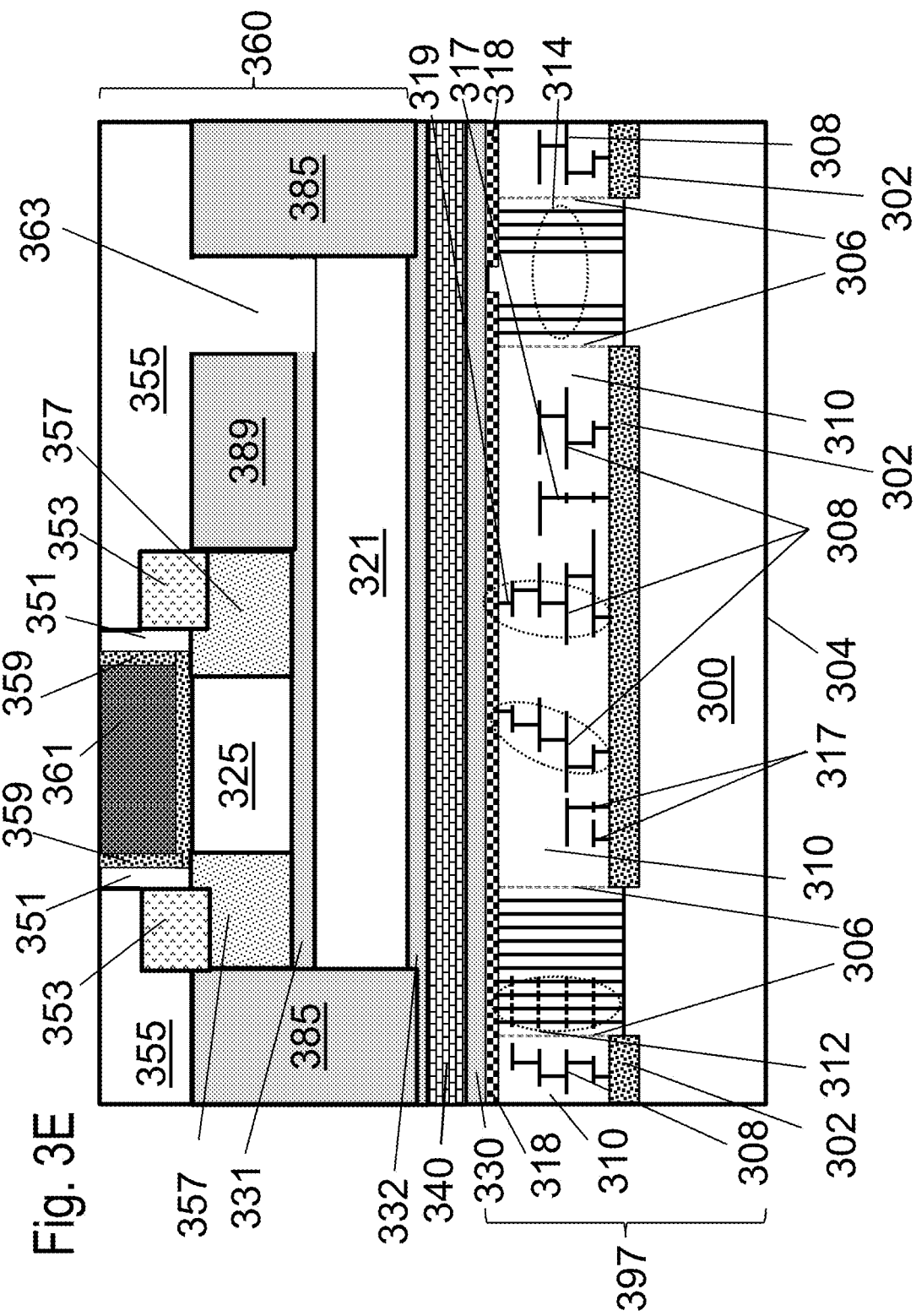

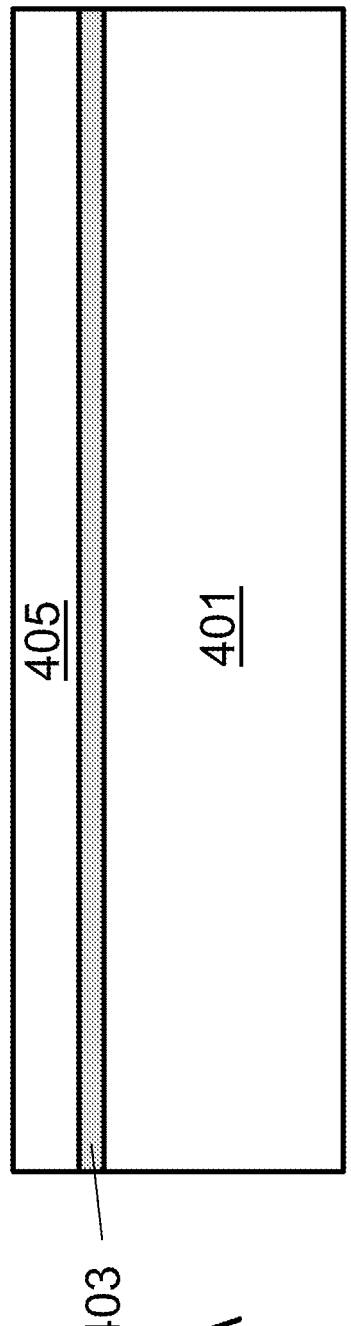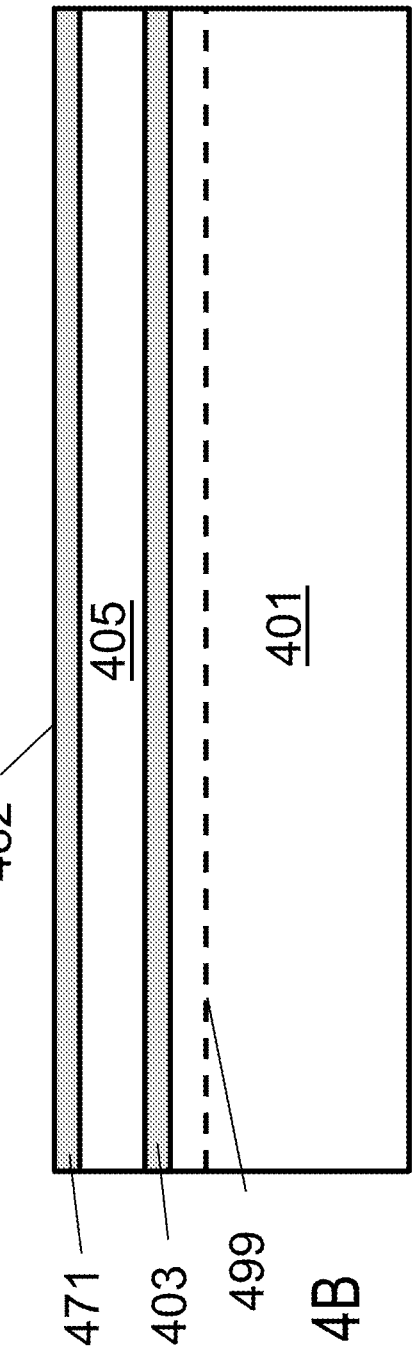

METHOD OF PROCESSING A SEMICONDUCTOR DEVICE

This application claims benefit of provisional U.S. Patent Application No. 61/889,500, filed on Oct. 10, 2013, and provisional U.S. Patent Application No. 61/832,922, filed on Jun. 9, 2013. This application claims priority to the foregoing applications. The contents of the foregoing applications are incorporated herein by reference.

BACKGROUND OF THE INVENTION

1. Field of the Invention

This application relates to the general field of Integrated Circuit (IC) devices and fabrication methods, and more particularly to multilayer or Three Dimensional Integrated Circuit (3D-IC) devices and fabrication methods.

2. Discussion of Background Art

Over the past 40 years, there has been a dramatic increase in functionality and performance of Integrated Circuits (ICs). This has largely been due to the phenomenon of "scaling"; i.e., component sizes within ICs have been reduced ("scaled") with every successive generation of technology. There are two main classes of components in Complementary Metal Oxide Semiconductor (CMOS) ICs, namely transistors and wires. With "scaling", transistor performance and density typically improve and this has contributed to the previously-mentioned increases in IC performance and functionality. However, wires (interconnects) that connect together transistors degrade in performance with "scaling". The situation today is that wires dominate the performance, functionality and power consumption of ICs.

3D stacking of semiconductor devices or chips is one avenue to tackle the wire issues. By arranging transistors in 3 dimensions instead of 2 dimensions (as was the case in the 1990s), the transistors in ICs can be placed closer to each other. This reduces wire lengths and provides low wiring delay and interconnect energy costs.

There are many techniques to construct 3D stacked integrated circuits or chips including:

Through-silicon via (TSV) technology: Multiple layers of transistors (with or without wiring levels) can be constructed separately. Following this, they can be bonded to each other and connected to each other with through-silicon vias (TSVs).

Monolithic 3D technology: With this approach, multiple layers of transistors and wires can be monolithically constructed. Some monolithic 3D approaches are described in U.S. Pat. Nos. 8,273,610, 8,557,632, 8,581, 349, 8,163,581, 8,378,715, 8,379,458, 8,742,476, 8,642, 416, 8,687,399, US patent publications 2013/0083589 and 2013/0241026, and pending U.S. patent application Ser. Nos. 13/274,161, 13/803,437, 13/836,080 and 13/796,930. The contents of the foregoing patents, publications, and applications are incorporated herein by reference.

An early work on monolithic 3D was presented in U.S. Pat. No. 7,052,941 and follow-on work in related patents includes U.S. Pat. No. 7,470,598. A technique which has been used over the last 20 years to build SOI wafers, called "Smart-Cut" or "Ion-Cut", was presented in U.S. Pat. No. 7,470,598 as one of the options to perform layer transfer for the formation of a monolithic 3D device. Yet in a related patent disclosure, by the same inventor of U.S. Pat. No. 7,470,598, U.S. application Ser. No. 12/618,542 it states: "In one embodiment of the previous art, exfoliating implant method in which ion-implanting Hydrogen into the wafer surface is known. But this exfoliating implant method can destroy lattice structure of the doped layer 400 by heavy ion-implanting. In this case, to recover the destroyed lattice structure, a long time thermal treatment in very high temperature is required. This long time/high temperature thermal treatment can severely deform the cell devices of the lower region." Moreover, in U.S. application Ser. No. 12/635,496 by the same inventor is stated: [0034] Among the technologies to form the detaching layer, one of the well known technologies is Hydrogen Exfoliating Implant. This method has a critical disadvantage which can destroy lattice structures of the substrate because it uses high amount of ion implantation. In order to recover the destroyed lattice structures, the substrate should be cured by heat treatment in very high temperature long time. This kind of high temperature heat treatment can damage cell devices in the lower regions." Furthermore, in U.S. application Ser. No. 13/175,652 it is stated: "Among the technologies to form the detaching layer 207, one technology is called as exfoliating implant in which gas phase ions such as hydrogen is implanted to form the detaching layer, but in this technology, the crystal lattice structure of the multiple doped layers 201, 203, 205 can be damaged. In order to recover the crystal lattice damage, a thermal treatment under very high temperature and long time should be performed, and this can strongly damage the cell devices underneath." In fact the Inventor had posted a video infomercial on his corporate website, and was up-loaded on YouTube on Jun. 1, 2011, clearly stating in reference to the Smart Cut process: "The wafer bonding and detaching method is well-known SOI or Semiconductor-On-Insulator technology. Compared to conventional bulk semiconductor substrates, SOI has been introduced to increase transistor performance. However, it is not designed for 3D IC either. Let me explain the reasons . . . . The dose of hydrogen is too high and, therefore, semiconductor crystalline lattices are demolished by the hydrogen ion bombardment during the hydrogen ion implantation. Therefore, typically annealing at more than 1,100 Celsius is required for curing the lattice damage after wafer detaching. Such high temperature processing certainly destroys underlying devices and interconnect layers. Without high temperature annealing, the transferred layer should be the same as a highly defective amorphous layer. It seems that there is no way to cure the lattice damage at low temperatures. BeSang has disruptive 3D layer formation technology and it enables formation of defect-free single crystalline semiconductor layer at low temperatures . . . "

In at least one embodiment presented herein, at least one innovative method and device structure to repair the crystal lattice damage caused by the hydrogen implant is described.

Regardless of the technique used to construct 3D stacked integrated circuits or chips, heat removal is a serious issue for this technology. For example, when a layer of circuits with power density P is stacked atop another layer with power density P, the net generated power density is 2P. Removing the heat produced due to this power density is a significant challenge. In addition, many heat producing regions in 3D stacked integrated circuits or chips have a high thermal resistance to the heat sink, and this makes heat removal even more difficult.

Several solutions have been proposed to tackle this issue of heat removal in 3D stacked integrated circuits and chips. These are described in the following paragraphs.

Publications have suggested passing liquid coolant through multiple device layers of a 3D-IC to remove heat. This is described in "Microchannel Cooled 3D Integrated Systems", Proc. Intl. Interconnect Technology Conference, 2008 by D. C. Sekar, et al., "Forced Convective Interlayer Cooling in Vertically Integrated Packages," Proc. Intersoc. Conference on Thermal Management (ITHERM), 2008 by T. Brunschweiler, et al., and "High Performance Heat Sinking for VLSI," IEEE Electron Device Letters, vol. EDL-2, No. 5, May 1981, by D. B. Tuckerman and R. F. W. Pease.

Thermal vias have been suggested as techniques to transfer heat from stacked device layers to the heat sink. Use of power and ground vias for thermal conduction in 3D-ICs has also been suggested. These techniques are described in "Allocating Power Ground Vias in 3D ICs for Simultaneous Power and Thermal Integrity" ACM Transactions on Design Automation of Electronic Systems (TODAES), May 2009 by Hao Yu, Joanna Ho and Lei He.

In addition, thermal limitations during IC fabrication have been a big obstacle on the road to monolithic three-dimensional ICs. The semiconductor and microelectronic processing techniques to form transistors, circuits, and devices, such as, for example, to form some silicon oxides or nitrides, repair damages from processes such as etching and ion-implantation, annealing and activation of ion implanted species, and epitaxial regrow techniques, have processing temperatures (for example, greater than 400° C.) and times at temperature that would damage and harm the underlying metallization and/or device layers and structures. These processes may involve transient (short timescales, such as less than 500 ns short or long wavelength laser pulses) heat exposures to the wafer/substrate being processed, or steady state applications (such as RTA, RTO, spike, flash, CVD, ALD, furnace/oven) of heat and/or heated material, substrates, susceptors or gases that may have processing times of seconds, minutes, or hours.

The passage of thermal energy through an insulating material may occur through three mechanisms; solid conductivity, gaseous conductivity, and radiative (infrared) transmission. The sum of these three components gives the total thermal conductivity of the material. Solid conductivity is an intrinsic property of a specific material. For dense silica, solid conductivity is relatively high (a single-pane window transmits a large amount of thermal energy). However, a substance such as, for example, silica aerogels possess a very small (~1-10%) fraction of solid silica. Additionally, the solids that are present consist of very small particles linked in a three-dimensional network (with many "dead-ends"). Therefore, thermal transport through the solid portion of silica aerogel occurs through a very tortuous path and is not particularly effective. The space not occupied by solids in an aerogel is normally filled with air (or another gas) unless the material is sealed under vacuum. These gases can also transport thermal energy through the aerogel. The pores of silica aerogel are open and allow the passage of gas (albeit with difficulty) through the material. The final mode of thermal transport through silica aerogels involves infrared radiation. Silica aerogels are also reasonably transparent in the infrared (especially for wavelengths between 3 and 5 microns), whereas carbon aerogels are not. At low temperatures, the radiative component of thermal transport is low, and not a significant problem. At higher temperatures, radiative transport becomes the dominant mode of thermal conduction, and must be dealt with by, for example, incorporation of IR absorbing materials (opacification) in the aerogel matrix, such as carbon black or $TiO_2$. The heat transport may then become by conductive means. Other materials, for example, nanostructured oxides and metals, utilized phonon scattering and reflection mechanisms to provide a thermal barrier.

Aerogels are low-density solid-state materials derived from gel in which the liquid component of the gel has been replaced with gas. Aerogels consist of a complicated cross-linked internal structure of chains of the aerogel constituent molecules with a large number of air/gas/vacuum filled pores that take up most of the volume. Aerogels are commonly synthesized by the Sol-gel process, yet there are many variations of the process. Details are in the referenced documents and in the general industry knowledge base. In general, the Sol-gel process could be described as formation of an oxide network through polycondensation reactions of a molecular precursor in a liquid. The formation of aerogels usually involves two major steps, the formation of a wet gel, and the drying of the wet gel to form an aerogel. Silica aerogels may be prepared from silicon alkoxide precursors. The most common of these are tetramethyl orthosilicate (TMOS, $Si(OCH_3)_4$), and tetraethyl orthosilicate (TEOS, $Si(OCH_2CH_3)_4$). However, many other alkoxides, containing various organic functional groups, can be used to impart different properties to the gel. The initial step in the formation of aerogels is hydrolysis and condensation of alkoxide. As condensation reactions progress the sol will set into a rigid gel. The kinetics of the reaction can be impracticably slow at room temperature, often requiring several days to reach completion. For this reason, acid or base catalysts are added to the formulation. These catalysts speed up the hydrolysis of silicon alkoxide. In acidic environments the oxygen atom in Si—OH or Si—OR is protonated and H—OH or HOR are good leaving groups. The electron density is shifted from the Si atom, making it more accessible for reaction with water. In basic environments nucleophilic attack by OH— occurs on the central Si atom. The amount and type of catalyst used play key roles in the microstructural, physical and optical properties of the final aerogel product. For example aerogels prepared with acid catalysts often show more shrinkage during supercritical drying and are less transparent than base catalyzed aerogels. As reaction progresses, the sol reaches the gel point, that is, the point in time at which the network of linked oxide particles spans the container holding the Sol. At the gel point the Sol becomes an Alcogel. Typical acid or base catalyzed TEOS gels are often classified as "single-step" gels, referring to the "one-pot" nature of this reaction. A more recently developed approach uses pre-polymerized TEOS as the silica source. Pre-polymerized TEOS is prepared by heating an ethanol solution of TEOS with a sub-stoichiometric amount of water and an acid catalyst. This material is redissolved in ethanol and reacted with additional water under basic conditions until gelation occurs. Gels prepared in this way are known as "two-step" acid-base catalyzed gels. These slightly different processing conditions impart subtle, but important changes to the final aerogel product. Single-step base catalyzed aerogels are typically mechanically stronger, but more brittle, than two-step aerogels. While two-step aerogels have a smaller and narrower pore size distribution and are often optically clearer than single-step aerogels. A most important step in the process in making silica aerogels is supercritical drying. This is where the liquid within the gel is removed, leaving only the linked silica network. The process can be performed by venting the ethanol above its critical point (high temperature-very dangerous) or by prior solvent exchange with $CO_2$ followed by supercritical venting (lower temperatures-less dangerous). The alcogels are placed in the autoclave (which has been filled with ethanol). The system is pressurized to at least 750-850 psi with $CO_2$ and cooled to 5-10 degrees C. Liquid $CO_2$ is then flushed through the vessel until all the ethanol has been removed from the vessel and from within the gels. When the gels are ethanol-free the vessel is heated to a temperature above the critical temperature of $CO_2$ (31 degrees C.). As the vessel is heated the pressure of the system rises. $CO_2$ is carefully released to maintain a pressure slightly above the critical pressure of $CO_2$ (1050 psi). The system is held at these conditions for a short time, followed by the slow, controlled release of $CO_2$ to ambient pressure. Under these conditions, the network structure is retained and a gel with large pores is formed. The density of the resulting aerogel will be very low generally somewhere around 0.1 g/cm$^3$. If the gel is dried by evaporation, then the capillary forces will result in shrinkage, the gel network will collapse, and a xerogel is formed.

The methods of preparing silica aerogels are not very successful in the case of carbon aerogels mainly due to the effects of steric hindrance in tetra alkyl ethers. Instead a variant of the Sol-gel process is used. The precursor that is generally used in the synthesis of carbon aerogels is a resorcinol-formaldehyde solution. Polycondensation of resorcinol with formaldehyde in aqueous solutions leads to gels that can be super critically dried with $CO_2$ to form organic aerogels which are called resorcinolformaldehyde (RF) aerogels. Carbon aerogels can be obtained by pyrolysis of resorcinol formaldehyde aerogels in an inert atmosphere. Additives can be included to the base aerogel formulation to reduce the IR radiative properties; these additives can be carbon black, $TiO_2$ and others. (NASA Tech Briefs, November 2009, Nesmith et al.) Many aero & xerogel matrices are damaged during processing such as plasma etching and depositing layers over the matrix. Often it is found that using a post processing treatment will help to heal the damage or at least mitigate the changes that occurred during processing. These post treatments can also be used to make the films hydrophobic. Many papers discuss these treatments for porous Methylsilsesquioxane (MSQ) and aerogel films. (Fruehauf, S., et al., "Hydrophobisation process for porous Low K Dielectric Silica Layers," Advanced Metallization Conference, Materials Research Society, 287-294 (2010); Gurav, J. L., et al., "Silica Aerogel: Synthesis and Applications," Journal of Nanomaterials, vol. 2010, id. 409310)

Techniques to remove heat from 3D Integrated Circuits and Chips and protect sensitive metallization and circuit elements from either the heat of processing of the 3D layers or the operationally generated heat from an active circuit, will be beneficial.

Additionally the 3D technology according to some embodiments of the invention may enable some very innovative IC alternatives with reduced development costs, increased yield, and other illustrative benefits.

SUMMARY

The invention may be directed to multilayer or Three Dimensional Integrated Circuit (3D IC) devices, fabrication methods, and processing equipment.

In one aspect, a method for processing a semiconductor device, the method comprising; providing a first semiconductor layer comprising first transistors; forming interconnection layers overlying said transistors, wherein said interconnection layers comprise copper or aluminum; forming a shielding heat conducting layer overlaying said interconnection layers; forming an isolation layer overlaying said shielding heat conducting layer; forming a second semiconductor layer overlying said isolation layer, and processing said second semiconductor layer at a temperature greater than about 400° C., wherein said interconnection layers are kept at a temperature below about 400° C.

In another aspect, a method for processing a semiconductor device, the method comprising; providing a first semiconductor layer comprising first transistors; forming interconnection layers overlying said transistors, wherein said interconnection layers comprise copper or aluminum; forming a shielding heat conducting layer overlaying said interconnection layers; forming an isolation layer overlaying said shielding heat conducting layer; forming a second semiconductor layer overlying said isolation layer, and processing said second semiconductor layer at a temperature greater than about 400° C., wherein said interconnection layers are kept at a temperature below about 400° C., wherein said processing said second semiconductor layer comprises heating said second semiconductor layer to greater than about 800° C. for more than a minute to form an oxide.

In another aspect, a method for processing a semiconductor device, the method comprising; providing a first semiconductor layer comprising first transistors; forming interconnection layers overlying said transistors, wherein said interconnection layers comprise copper or aluminum; forming a shielding heat conducting layer overlaying said interconnection layers; forming an isolation layer overlaying said shielding heat conducting layer; forming a second semiconductor layer overlying said isolation layer, and processing said second semiconductor layer at a temperature greater than about 400° C., wherein said interconnection layers are kept at a temperature below about 400° C., wherein said processing said second semiconductor layer comprises heating said second semiconductor layer to greater than about 800° C. to repair etch damage of said second semiconductor layer.

In another aspect, a method for processing a semiconductor device, the method comprising; providing a first semiconductor layer comprising first transistors; forming interconnection layers overlying said transistors, wherein said interconnection layers comprise copper or aluminum; forming a shielding heat conducting layer overlaying said interconnection layers; forming an isolation layer overlaying said shielding heat conducting layer; forming a second semiconductor layer overlying said isolation layer, and processing said second semiconductor layer at a temperature greater than about 400° C., wherein said interconnection layers are kept at a temperature below about 400° C., wherein said processing said second semiconductor layer comprises heating said second semiconductor layer to greater than about 825° C. to form a Bottom Interface Layer.

In another aspect, a method for processing a semiconductor device, the method comprising; providing a first semiconductor layer comprising first transistors; forming interconnection layers overlying said transistors, wherein said interconnection layers comprise copper or aluminum; forming a shielding heat conducting layer overlaying said interconnection layers; forming an isolation layer overlaying said shielding heat conducting layer; forming a second semiconductor layer overlying said isolation layer, and processing said second semiconductor layer at a temperature greater than about 400° C., wherein said interconnection layers are kept at a temperature below about 400° C., wherein said processing said second semiconductor layer comprises a rapid thermal anneal for greater than about 20 seconds at greater than about 700° C.

In another aspect, a method for processing a semiconductor device, the method comprising; providing a first semiconductor layer comprising first transistors; forming interconnection layers overlying said transistors, wherein said interconnection layers comprise copper or aluminum; forming a shielding heat conducting layer overlaying said interconnection layers; forming an isolation layer overlaying said shielding heat conducting layer; forming a second semiconductor layer overlying said isolation layer, and processing said second semiconductor layer at a temperature greater than about 400° C., wherein said interconnection layers are kept at a temperature below about 400° C., wherein said processing said second semiconductor layer comprises a chemical vapor deposition of amorphous silicon at greater than about 600° C.

In another aspect, a method for processing a semiconductor device, the method comprising; providing a first semiconductor layer comprising first transistors; forming interconnection layers overlying said transistors, wherein said interconnection layers comprise copper or aluminum; forming a shielding heat conducting layer overlaying said interconnection layers; forming an isolation layer overlaying said shielding heat conducting layer; forming a second semiconductor layer overlying said isolation layer, and processing said second semiconductor layer at a temperature greater than about 400° C., wherein said interconnection layers are kept at a temperature below about 400° C., wherein said processing said second semiconductor layer comprises heating said second semiconductor layer to greater than about 800° C. to form a dummy gate oxide.

In another aspect, a method for processing a semiconductor device, the method comprising; providing a first semiconductor layer comprising first transistors; forming interconnection layers overlying said transistors, wherein said interconnection layers comprise copper or aluminum; forming a shielding heat conducting layer overlaying said interconnection layers; forming an isolation layer overlaying said shielding heat conducting layer; forming a second semiconductor layer overlying said isolation layer, and processing said second semiconductor layer at a temperature greater than about 400° C., wherein said interconnection layers are kept at a temperature below about 400° C., wherein said processing said second semiconductor layer comprises a rapid thermal anneal for greater than about 5 seconds in the presence of nitrogen at greater than about 700° C.

In another aspect, a method for processing a semiconductor device, the method comprising; providing a first semiconductor layer comprising first transistors; forming interconnection layers overlying said transistors, wherein said interconnection layers comprise copper or aluminum; forming a shielding heat conducting layer overlaying said interconnection layers; forming an isolation layer overlaying said shielding heat conducting layer; forming a second semiconductor layer overlying said isolation layer, and processing said second semiconductor layer at a temperature greater than about 400° C., wherein said interconnection layers are kept at a temperature below about 400° C., wherein said processing said second semiconductor layer comprises performing selective epitaxy of SiGe or SiC at greater than about 600° C.

In another aspect, a method for processing a semiconductor device, the method comprising; providing a first semiconductor layer comprising first transistors; forming interconnection layers overlying said transistors, wherein said interconnection layers comprise copper or aluminum; forming a shielding heat conducting layer overlaying said interconnection layers; forming an isolation layer overlaying said shielding heat conducting layer; forming a second semiconductor layer overlying said isolation layer, and processing said second semiconductor layer at a temperature greater than about 400° C., wherein said interconnection layers are kept at a temperature below about 400° C., wherein said processing said second semiconductor layer comprises a rapid thermal anneal at greater than 440° C.

In another aspect, a method for processing a semiconductor device, the method comprising; providing a first semiconductor layer comprising first transistors; forming interconnection layers overlying said transistors, wherein said interconnection layers comprise copper or aluminum; forming a shielding heat conducting layer overlaying said interconnection layers; forming an isolation layer overlaying said shielding heat conducting layer; forming a second semiconductor layer overlying said isolation layer, and processing said second semiconductor layer at a temperature greater than about 400° C., wherein said interconnection layers are kept at a temperature below about 400° C., wherein said processing said second semiconductor layer comprises a thermal anneal at greater than about 500° C. to perform an ion-cut cleave.

In another aspect, a method for processing a semiconductor device, the method comprising; providing a first semiconductor layer comprising first transistors; forming interconnection layers overlying said transistors, wherein said interconnection layers comprise copper or aluminum; forming a shielding heat conducting layer overlaying said interconnection layers; forming an isolation layer overlaying said shielding heat conducting layer; forming a second semiconductor layer overlying said isolation layer, and processing said second semiconductor layer at a temperature greater than about 400° C., wherein said interconnection layers are kept at a temperature below about 400° C., wherein said processing said second semiconductor layer comprises a thermal anneal greater than about 500° C. to anneal H+ implant damage.

In another aspect, a method for processing a semiconductor device, the method comprising; providing a first semiconductor layer comprising first transistors; forming interconnection layers overlying said transistors, wherein said interconnection layers comprise copper or aluminum; forming a shielding heat conducting layer overlaying said interconnection layers; forming an isolation layer overlaying said shielding heat conducting layer; forming a second semiconductor layer overlying said isolation layer, and processing said second semiconductor layer at a temperature greater than about 400° C., wherein said shielding layer is kept at a temperature below about 400° C., wherein said keeping said interconnection layers are at a temperature below about 400° C. comprises cooling a vacuum chuck holding said device and having a plurality of thermal vias connecting said first semiconductor layer to said shielding heat conducting layer.

In another aspect, a method for processing a semiconductor device, the method comprising; providing a first semiconductor layer comprising first transistors; forming interconnection layers overlying said transistors, wherein said interconnection layers comprise copper or aluminum; forming a shielding heat conducting layer overlaying said interconnection layers; forming an isolation layer overlaying said shielding heat conducting layer; forming a second semiconductor layer overlying said isolation layer, and processing said second semiconductor layer at a temperature greater than about 400° C., wherein said interconnection layers are kept at a temperature below about 400° C., wherein said device comprises dicing streets and wherein said keeping said shielding layer at a temperature below 400° C. comprises having a plurality of thermal vias disposed within said dicing streets to remove heat from said shielding heat conducting layer.

In another aspect, a method for processing a semiconductor device, the method comprising; providing a first semiconductor layer comprising first transistors; forming interconnection layers overlying said transistors, wherein said interconnection layers comprise copper or aluminum; forming a shielding heat conducting layer overlaying said interconnection layers; forming an isolation layer overlaying said shielding heat conducting layer; forming a second semiconductor layer overlying said isolation layer, and processing said second semiconductor layer at a temperature greater than about 400° C., wherein said interconnection layers are kept at a temperature below about 400° C., wherein said processing said second semiconductor layer comprises use of processing equipment comprising a chuck to hold said device, wherein said chuck is actively cooled.

In another aspect, a method for processing a semiconductor device, the method comprising; providing a first semiconductor layer comprising first transistors; forming interconnection layers overlying said transistors, wherein said interconnection layers comprise copper or aluminum; forming a shielding heat conducting layer overlaying said interconnection layers; forming an isolation layer overlaying said shielding heat conducting layer; forming a second semiconductor layer overlying said isolation layer, and processing said second semiconductor layer at a temperature greater than about 400° C., wherein said interconnection layers are kept at a temperature below about 400° C., wherein said processing said second semiconductor layer comprises use of processing equipment comprising a chuck to hold said device and a processing chamber, said processing chamber comprises a thermal isolation structure to isolate said chuck from said processing chamber.

In another aspect, a method for processing a semiconductor device, the method comprising; providing a first semiconductor layer comprising first transistors; forming interconnection layers overlying said transistors, wherein said interconnection layers comprise copper or aluminum; forming a shielding heat conducting layer overlaying said interconnection layers; forming an isolation layer overlaying said shielding heat conducting layer; forming a second semiconductor layer overlying said isolation layer, and processing said second semiconductor layer at a temperature greater than about 400° C., wherein said interconnection layers are kept at a temperature below about 400° C., wherein said interconnection layers are kept at a temperature below about 400° C.

In another aspect, a method for processing a semiconductor device, the method comprising; providing a first semiconductor layer comprising first transistors; forming interconnection layers overlying said transistors, wherein said interconnection layers comprise copper or aluminum; forming a shielding heat conducting layer overlaying said interconnection layers; forming an isolation layer overlaying said shielding heat conducting layer; forming a second semiconductor layer overlying said isolation layer, and processing said second semiconductor layer at a temperature greater than about 400° C., wherein said interconnection layers are kept at a temperature below about 400° C., wherein said transistors are kept at a temperature below about 400° C.

In another aspect, a method for processing a semiconductor device, the method comprising; providing a first semiconductor layer comprising first transistors; forming interconnection layers overlying said transistors, wherein said interconnection layers comprise copper or aluminum; forming a shielding heat conducting layer overlaying said interconnection layers; forming an isolation layer overlaying said shielding heat conducting layer; forming a second semiconductor layer overlying said isolation layer, and processing said second semiconductor layer at a temperature greater than about 400° C., wherein said interconnection layers are kept at a temperature below about 400° C., wherein said shielding heat conducting layer is constructed to provide at least 2 times higher heat conduction in the horizontal direction than in the vertical direction.

In another aspect, a method for processing a semiconductor device, the method comprising; providing a first semiconductor layer comprising first transistors; forming interconnection layers overlying said transistors, wherein said interconnection layers comprise copper or aluminum; forming a shielding heat conducting layer overlaying said interconnection layers; forming an isolation layer overlaying said shielding heat conducting layer; forming a second semiconductor layer overlying said isolation layer, and processing said second semiconductor layer at a temperature greater than about 400° C., wherein said interconnection layers are kept at a temperature below about 400° C., wherein said shielding heat conducting layer comprises tungsten.

BRIEF DESCRIPTION OF THE DRAWINGS

Various embodiments of the invention will be understood and appreciated more fully from the following detailed description, taken in conjunction with the drawings in which:

FIGS. 3A-3G are exemplary drawing illustrations of a process to form an exemplary re-channel FD-MOSFET with integrated Thermal Protection Structures and Thermal Isolation layer;

FIGS. 4A-4E are exemplary drawing illustrations of another process to form an exemplary n-channel FD-MOSFET with integrated Thermal Protection Structures and Thermal Isolation layer;

DETAILED DESCRIPTION

Figure 1A:
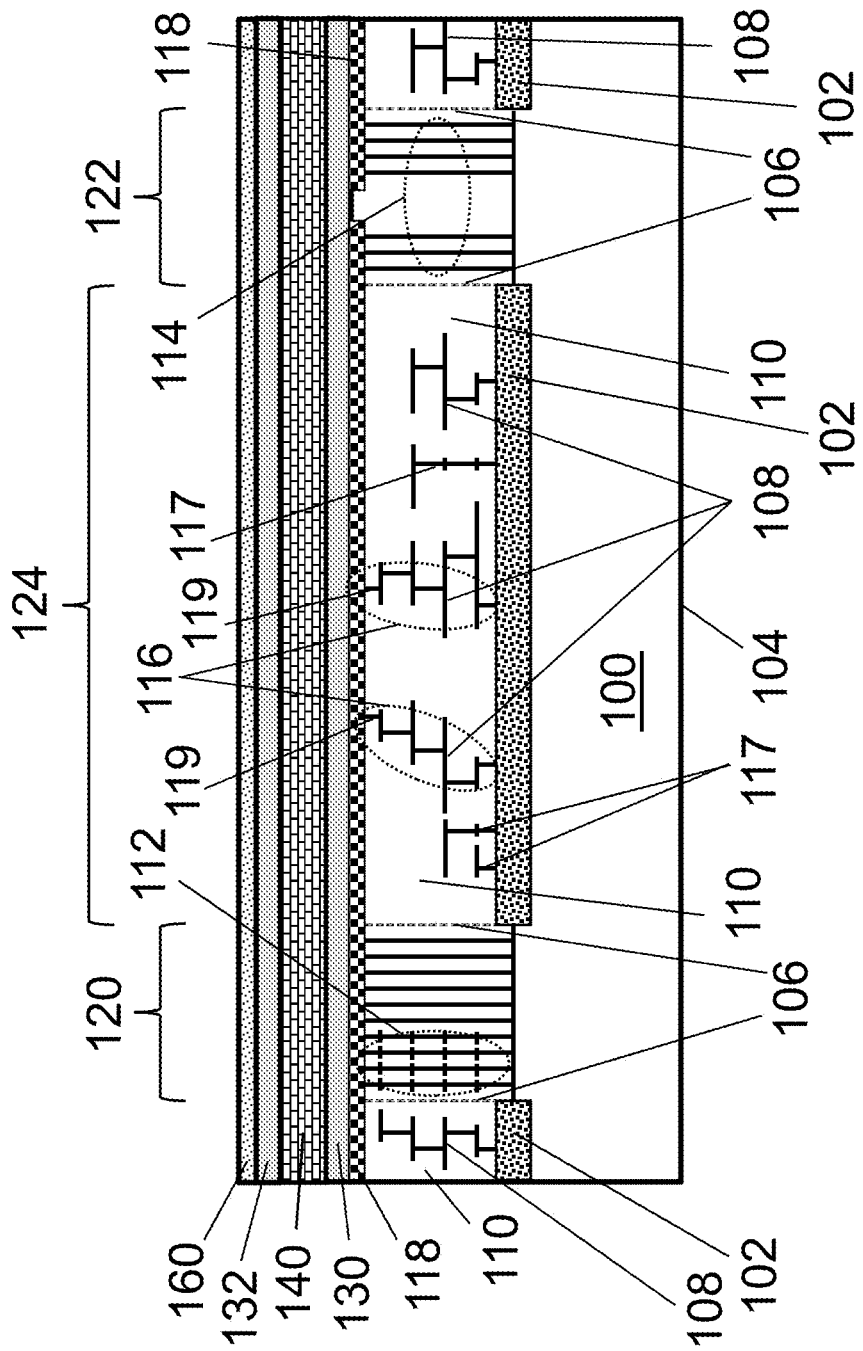
FIGS. 1A-1E are exemplary drawing illustrations of protective structures to protect the desired regions of substrate devices from high processing and operating temperatures.

An embodiment of the invention is now described with reference to the drawing figures. Persons of ordinary skill in the art will appreciate that the description and figures illustrate rather than limit the invention and that in general the figures are not drawn to scale for clarity of presentation. Such skilled persons will also realize that many more embodiments are possible by applying the inventive principles contained herein and that such embodiments fall within the scope of the invention which is not to be limited except by the appended claims.

Some drawing figures may describe process flows for building devices. The process flows, which may be a sequence of steps for building a device, may have many structures, numerals and labels that may be common between two or more adjacent steps. In such cases, some labels, numerals and structures used for a certain step's figure may have been described in the previous steps' figures.

A portion of the steps in a semiconductor process flow, for example, a high speed CMOS FinFet or UTBB-FDSOI (Ultra Thin Body and BOX—Fully Depleted Silicon On Insulator) transistor flow, may have processing temperatures which would damage the metallization (for example, copper or aluminum) and isolation layers (for example, low-k dielectrics, thermally conductive aerogels) in the substrate interconnect layers or regions, or change the device electrical characteristics and reliability of devices (for example, transistors, capacitors, inductors, resistors) that reside in or on the substrate. For example, processes such as $Si_3N_4$ LPCVD depositions for STI and well formations (typically about 30 minutes at 700° C.), STI liner oxidation (typically about 10 minutes at 800-1000° C.), STI TEOS/Flowable CVD densification (typically about 20 minutes at 1000° C.), well implant activation (typically about 10 seconds at 1000° C.), dummy gate oxide (typically minutes at 800° C.), dummy gate amorphous silicon (a-Si) deposition (typically about 20 minutes at 600° C.), SiGe and SiC selective epi (typically 10s of minutes at 600-700° C.), silicide formation (typically minutes of RTA at 400-500° C.), S/D, halo, Vt implant anneals (typically spike of seconds at 950° C. plus a flash or laser 3 ms exposure at 1350° C.); BIL bottom interface layer (ox+Nstuffing) (typically minutes at 825° C.), $HfO_2$ post-ALD N anneal (typically about 30 seconds at 700° C.).

An embodiment of the invention is a structure that will thermally protect the metallization, isolation layers, device electrical characteristics and reliability of devices that may reside in or on the substrate, or which may reside in or on a previously constructed layer/stratum in the 3D stack, from damaging processes and processing temperatures, for example, such damaging processes and processing temperatures as described above. This thermal protective structure (TPS) may be effectively increasing the average thermal conductivity of the device layer it is protecting as well as itself. This protective structure may be utilized in combination or sub-combination with a thermal isolation layer (TIL), thermally enhanced substrate (TES) and modified processing equipment that is described elsewhere in this document and in other related applications.

As illustrated in FIG. 1A, TPS protective structures to protect the desired regions of substrate devices may be constructed. These protective structures may be constructed using conventional and known processing techniques. A substrate 100, for example, a monocrystalline silicon wafer which may be thermally enhanced (a Thermally Enhanced Substrate—TES—as described elsewhere herein), of which a portion is shown in FIG. 1, may have substrate device regions 102 including devices, such as, for example, transistors, capacitors, and resistors. These substrate device regions 102 could be formed as eventual product dice with surrounding scribelanes and die edge seals. The devices within the regions of substrate devices could be wholly or partially within the substrate 100 material. The scribelanes may also be called dicing streets or scribelines.

The substrate 100 may also have a backside surface 104 that may be utilized to conduct processing heat (the heat source may be the layer being processed 160 during device formation steps or portions of the equipment performing the processing such as IR lamps and chamber walls) from the substrate 100 to a processing equipment cooling chuck or other thermal conduction/heat removal device, generally within the processing equipment.

The substrate device regions 102 may have corresponding regions of substrate metallization 108 and BEOL isolation 110 interconnect layers, which may include copper or aluminum metallization materials and low-k dielectric inter-metal dielectrics (IMD) respectively.

As part of the construction of or separately from the formation of regions of substrate metallization 108 and BEOL isolation 110 interconnect layers, one or more shield layer or regions 118 of metallization and isolation may be constructed. Details are in referenced applications. For example, the shield layer or regions 118 metallization may include materials such as tungsten, copper, aluminum, graphene, and DLC, materials with a high thermal conductivity and an appropriate melting/softening point. The shield layer or regions 118 may be constructed as a continuous slab across substantially the entire extant of the substrate area, or may be formed as regions.

The shield layer or regions 118 may have terminations within the device die scribelanes. The shield layer or regions 118 may include TLV (Thru Layer Via) landing pads wherein signals from the second layer of devices may connect either to a lower shield layer (for example shield layer or regions 118) or to the interconnect layers or regions of substrate metallization 108 and BEOL isolation 110 interconnect or lower layer devices, transistors and circuits. The shield layer or regions 118 may be thermally but not electrically connected or may be thermally and electrically connected to the substrate 100 in a variety of ways as described herein and in referenced incorporated documents.

The scribelanes, for example, scribelane with thermal via stacks and continuous shield 120 and/or scribelane with thermal via stacks and cut shield layer 122, may be substantially populated with thermal via stacks, which may be formed as thermal via stacks with via landing pads 112 as each metallization and via layer of the regions of substrate metallization 108 and BEOL isolation 110 interconnect layers are formed, or the thermal vias in the scribelane 114 may be formed as an etched and filled deep-via prior to the formation of the shield layer or regions 118. Forming the thermal via stack after the regions of substrate metallization 108 and BEOL isolation 110 interconnect layers are formed may provide the use of a different BEOL isolation material, material that may be more thermally isolative and/or thermally stable, for the thermal via stacks than for the devices. The thermal vias in the scribelane 114 may also be formed as one or a few to substantially fill (with appropriate stress relief structures) the scribelane with metal (thermally conductive) material (as much as practical given CMP dishing design rules) that may be part of the shield layer formation, or may be formed in a separate metal deposition and planarization step and may provide use of a more thermally conductive material than copper or aluminum to form the thermal vias in the scribelane 114, for example, carbon nanotubes, Plasma Enhanced Chemical Vapor Deposited Diamond Like Carbon-PECVD DLC (about 1000 W/m-K), and Chemical Vapor Deposited (CVD) graphene (about 5000 W/m-K). Refractory metals may be employed as a shield material as well, for example, Tungsten.

As dictated by design choices, the thermal vias (such as, for example, substantially all or a portion of thermal via stacks with via landing pads 112 and/or thermal vias in the scribelane 114, and/or in-die thermal via stacks 116 and/or fill-in thermal paths 117) may truncate in a dielectrically isolated or reverse biased junction electrically isolated connection to the substrate, or the thermal vias may truncate as a conventional forward biased junction or no junction substrate contact that may be thermally and electrical connected to the substrate. Processing, structure, and operational details are in referenced applications.

In-die thermal via stacks 116 (may also be called in-die thermal via paths) may also be constructed over the regions of substrate devices 102 (within die extant 124) by forming a via stack that utilizes the interconnect structures of the regions of substrate metallization 108 and BEOL isolation 110 interconnect layers, with a via connection 119 from the shield layer to a metallization layer/segment within the regions of substrate metallization 108 and BEOL isolation 110 interconnect layers. Via connection 119 may be connected at a later step to electrically couple to the second layer devices (such as a TLV), or may primarily enable (as part of a thermal path) a thermal connection from substrate 100 to shield layer or regions 118. Details of this formation have been described in referenced applications.

Additionally, as a matter of design choice and may be controlled by an EDA design and placement algorithm, fill-in thermal paths 117 may be added to a chip die design/layout to maximize local and die average thermal conductivity. The fill-in thermal paths 117 may be formed anywhere on the die and from any level of the regions of substrate metallization 108 and BEOL isolation 110 interconnect layers to the substrate 100, for example, metal 1 to substrate, metal 3 to substrate, and so on). Fill-in thermal paths 117 may be added to a power or ground line as extra thermal connections to the substrate 100, which may be electrically conductive or non-conductive due to design constraints. Fill-in thermal paths 117 may be additional connections beyond what a conventional design or EDA tool may provide/construct. Fill-in thermal paths 117 may be added to/formed in so called 'white space' within the device die, where there may be a path vertically and horizontally thru the regions of substrate metallization 108 and BEOL isolation 110 interconnect layers to the substrate 100. Moreover, fill-in thermal paths 117 may be formed from the CMP fill structures of one or more of the regions of substrate metallization 108 and BEOL isolation 110 interconnect layers.

As a matter of design choice, die seal 106 (or die seal-ring) may be utilized as a thermal connection from either interconnect metal layers of the ring itself or the shield layer or regions 118 to the substrate 100.

Lower isolation layer 130 may be deposited on top of shield layer or regions 118 to protect and electrically and partially thermally isolate above and below and may include the bonding oxides for an ion-cut layer transfer process (for example, the case wherein TIL 140 is formed on a donor wafer or substrate). Lower isolation layer 130 may include designed-in voids (not shown), for example, by etch removal of portions of lower isolation layer 130, thus forming regions of vacuum and/or gas and regions of the remaining material (for example, silicon oxide) of lower isolation layer 130. The voids may be formed such that they extend fully or partially thru the entire thickness lower isolation layer 130. The presence of the voids may reduce the average thermal conductivity of lower isolation layer 130. The voids may include greater than about 5%, greater than about 10%, greater than about 20%, or greater than about 50% of the area and/or volume of lower isolation layer 130, thus affecting the total average lower isolation layer 130 thermal conductivity by greater than about 5%, or greater than about 50%.

TIL 140 may be formed of materials and structures to thermally isolate the layers below it (for example, substrate metallization 108 and BEOL isolation 110 interconnect layers, substrate device regions 102, shield layer or regions 118) from a portion of the processing heat of the layers above (such as layer being processed 160). TIL 140 may include materials and construction that provide at least about a 10 times, or 20 times, or 50 times, or 100 times lower thermal conductivity than layer being processed 160, and/or upper isolation layer 132, and/or lower isolation layer 130, and/or regions of substrate metallization 108 and BEOL isolation 110, and/or substrate 100. TIL 140 may have an effective thermal conductivity of less than about 20 mW/m-K, less than about 50 mW/m-K, less than about 100 mW/m-K, less than about 200 mW/m-K, less than about 500 mW/m-K. TIL 140 may have a thickness of less than about 10 nm, less than about 20 nm, less than about 50 nm, less than about 100 nm, less than about 200 nm, less than about 500 nm, less than about 1 um, less than about 2 um, less than about 10 um, less than about 20 um. The design choices of TIL 140 material thermal conductivity and thickness may be guided by desired effective size and/or density of TLVs achievable, maximum temperature of layer being processed 160 during device construction and processing, time at temperature and/or temperature profile of layer being processed 160 during device construction and processing, number of stack layers, mechanical strength, the cooling capacity of the cooled chuck and/or TES (microchannel for example), and so on. For example, a very low thermal conductivity material of about 100 mW/m-K (at the processing temperature of interest) may enable a minimum TIL 140 thickness of less than about 800 nm for a maximum temperature of layer being processed 160 of about 1000° C. or a minimum TIL 140 thickness of less than about 550 nm for a maximum temperature of layer being processed 160 of about 800° C., given no equipment cooling capacity constraints.

TIL 140 may include aerogels, well-known for providing low thermal conductivities. For example, thin film silica aerogels, such as the Aerogel B-Pyrolyzed material measured in M. L. Bauer, et al., "Thin-film aerogel thermal conductivity measurements via 3ω", Journal of Non-Crystalline Solids, 357 (2011) 2960-2965 [Bauer] incorporated herein by reference, provide a thermal conductivity of 24 mW/m-K at a thickness of 370 nm, deposited on and capped by $SiO_2$. IR (Infra-Red) transmittance may be suppressed by adding IR absorbing or scattering materials (opacification) in the aerogel matrix, such as, for example, carbon black or $TiO_2$. For example, in J. Wang, et al., "Monolithic silica aerogel insulation doped with $TiO_2$ powder and ceramic fibers", Journal of Non-Crystalline Solids, 186 (1995) 296-300 [JWang] incorporated herein by reference, a thermal conductivity of 38 mW/m-K at 800° K in air was obtained. Chemical vapor infiltration may be utilized to opacify the aerogel. The opacification agent may be added during the sol-gel process or after the supercritical drying step. The opacification agent may also increase thermal stability and allow use of the aerogel at higher temperatures. The top portion of the aerogel may be opacified to absorb the IR component of the upper layer heating and the lower portion of the aerogel that is not opacified can thermally isolate the vibrational component of the heat. The aerogel may be strengthened when placed under compressive stress, which may be accomplished by tuning the stress of the deposited capping layer. The gaseous component of the thermal conduction may be minimized by placing the aerogel under a vacuum before sealing it with a capping layer. The compressive modulus can be increased six-fold by CVD treatments of the silica aerogel, such as with hexachlorodisilane as described in K. A. D. Obrey, et al., "Enhancing mechanical properties of silica aerogels," Journal of Non-Crystalline Solids, 357 (2011) 3435-3441 [Obrey] incorporated herein by reference, without significantly affecting the aerogel porosity and surface area; hence, the thermal conductivity. Additionally, CVD treatment may provide a silica aerogel that has no water absorption and a good dielectric constant (about 2.0). Silica aerogels may attain even lower thermal conductivities, such as 5-10 mW/m-K, by being pyrolyzed at 500° C. for 1 hour to create porosity above 90%, but may then become structurally weaker.

TIL 140 may include alumina aerogels, such as, for example, as described by J. F. Poco, et al., "Synthesis of high porosity, monolithic alumina aerogels", Journal of Non-Crystalline Solids, 285 (2001) 57-63 [Poco] incorporated herein by reference. Poco sol-gel synthesized strong (elastic modulus of 550 kPa) and low density (37 kg/m$^3$) alumina aerogels that showed thermal conductivities of 29, 98, and 298 mW/m-K at 30° C., 400° C. and 800° C. respectively. The alumina aerogels formed did not sinter or appreciably shrink until exposed to temperatures above 950° C. Opacification and CVD hardening may also be utilized for alumina aerogels.

Additionally, phosphate aerogels, such as, for example, $AlPO_4$ as described in D. A. Lindquist, et al., "Boron Phosphate and Aluminum Phosphate Aerogels", Proceedings Arkansas Academy of Sciences, vol. 48, pp. 100-103 (1994) [Lindquist] incorporated herein by reference, and showed stability of surface area and pore radius to 800° C., may be utilized.

TIL 140 may include carbon aerogels, such as, for example, as described by M. Wiener, et al., "Carbon Aerogel-Based High Temperature Thermal Insulation" International Journal of Thermophysics (2009) 30:1372-1385 [Weiner] incorporated herein by reference. Wiener generated monolithic carbon aerogels via pyrolysis of porous organic precursors synthesized with the sol-gel method. These carbon aerogels were stable up to the two pyrolysis temperatures (800 & 1800° C.) and had thermal conductivities of 90 mW/m-K in vacuum and 120 mW/m-K in 0.1 MPa Ar atmosphere at 1500° C. A carbon aerogel pyrolized at 800° C. had a thermal conductivity of 20 mW/m-K at 300° C. in vacuum, and would be expected about double at 800° C. carbon aerogels, however, need to be protected from exposure to oxygen and oxidizing environments and can have electrically conductive forms. A carbon aerogel containing TIL 140 layer may have sub-layers to minimize the diffusion to or exposure of the carbon aerogel to oxygen and oxidizing environments, for example, surrounding the carbon aerogel above and below with thin sub-layers of an oxygen diffusion resistant material, for example, silicon nitride. The carbon aerogel protective sub-layers, for example, silicon nitride, could have a thickness of greater than about 5 nm, greater than about 10 nm, greater than about 50 nm, or greater than about 100 nm. A conductive carbon aerogel layer may be utilized as an emf shield between the two layers of transistors and devices or other electrical function, such as a back-bias for the transistors and devices formed in layer being processed 160.

TIL 140 may include nanoscale layered oxides, such as, for example, as described by J. Alvarez-Quintana, et al., "Ultra-Low Thermal Conductivity in Nanoscale Layered Oxides", Journal of Heat Transfer, vol. 132, pp. 032402-1 to 032402-6 (March 2010) [Alvarez-Quintana] incorporated herein by reference. Alvarez-Quintana showed various nanostructured layered materials of high thermal stability such as $SiO_2/Y_2O_3$, $SiO_2/Cr_2O_3$, and $SiO_2/Al_2O_3$, and obtained a thermal conductivity of 160 mW/m-K at 27° C. for a single 10 nm/10 nm bilayer of the Yittria ($SiO_2$ alone about 1,400 mW/m-K). The nanoscale layered oxides showed good thermal stability up to 1100° C. and were prepared by e-beam PVD, yet may also be prepared with plasma spray to obtain lower thermal conductivities.

TIL 140 may include disordered nanostructured materials, such as, for example, as described by C. Chiritescu, "Ultra Low Thermal Conductivity in Layered Disordered Crystalline Materials," Ph.D. dissertation, U. of Illinois at Urbana-Champaign, 2010 [Chiritescu] incorporated herein by reference. Chiritescu formed thin films of disordered layered crystalline materials, for example, $WSe_2$ of 30 nm-480 nm thickness, which exhibited 50 mW/m-K thermal conductivity at room temperature. The elemental components are thermally evaporated in a high vacuum chamber to form an amorphous alloy and then heat treated at about 625° C. for about an hour to form the crystallized structure.

TIL 140 may include low k porous dielectric materials such as porous silsesquioxanes, such as, phenyl, vinyl, and Methylsilsesquioxane (MSQ), and silsesquioxane blends of them, and other porous Xerogel films, for example, as described by N. Ahner, et al., "Thermal stability and gap-fill properties of spin-on MSQ low k dielectrics," Microelectronic Engineering, 84 (32007) 2606-2609 [Ahner] and C. Hu., et al., "Thermal conductivity study of porous low-k dielectric materials," Applied Physics Letters, vol. 77, issue 1, July 2000 [Hu], both incorporated herein by reference. Hu found that at Xerogel porosities of greater than 70% the thermal conductivity is about 100 mW/m-K Ahner found good porosities with the commercial Rohm and Haas Zirkon LK2000, and Honeywell ACCUGLASSTM T-512B spin on products, but their physical and electrical properties were only stable to about 650° C.

TIL 140 may include a top sub-layer of a material whose thermal conductivity decreases with temperature, for example, germanium, and a lower sub-layer with a material whose thermal conductivity increases with temperature, for example, silica aerogels. For example, at about 800° C., the thermal conductivity of germanium is about 150 mW/m-K, whereas at about room temperature the germanium thermal conductivity is about 580 mW/m-K.

TIL 140 may include thick silicon oxides, for example greater than about 5 um or greater than about 10 um in thickness or greater than about 30 um in thickness. TIL 140 may include silicon oxide sub-layer or layers combined with IR absorbing sub-layers, for example, $TiO_2$ or carbon, for example about 50 nm, about 100 nm, about 200 nm thick, about 500 nm thick each. The IR absorbing sub-layer or layers may be placed closer to the layer being processed 160 than most of the oxide sub-layers.

Figure 1B:
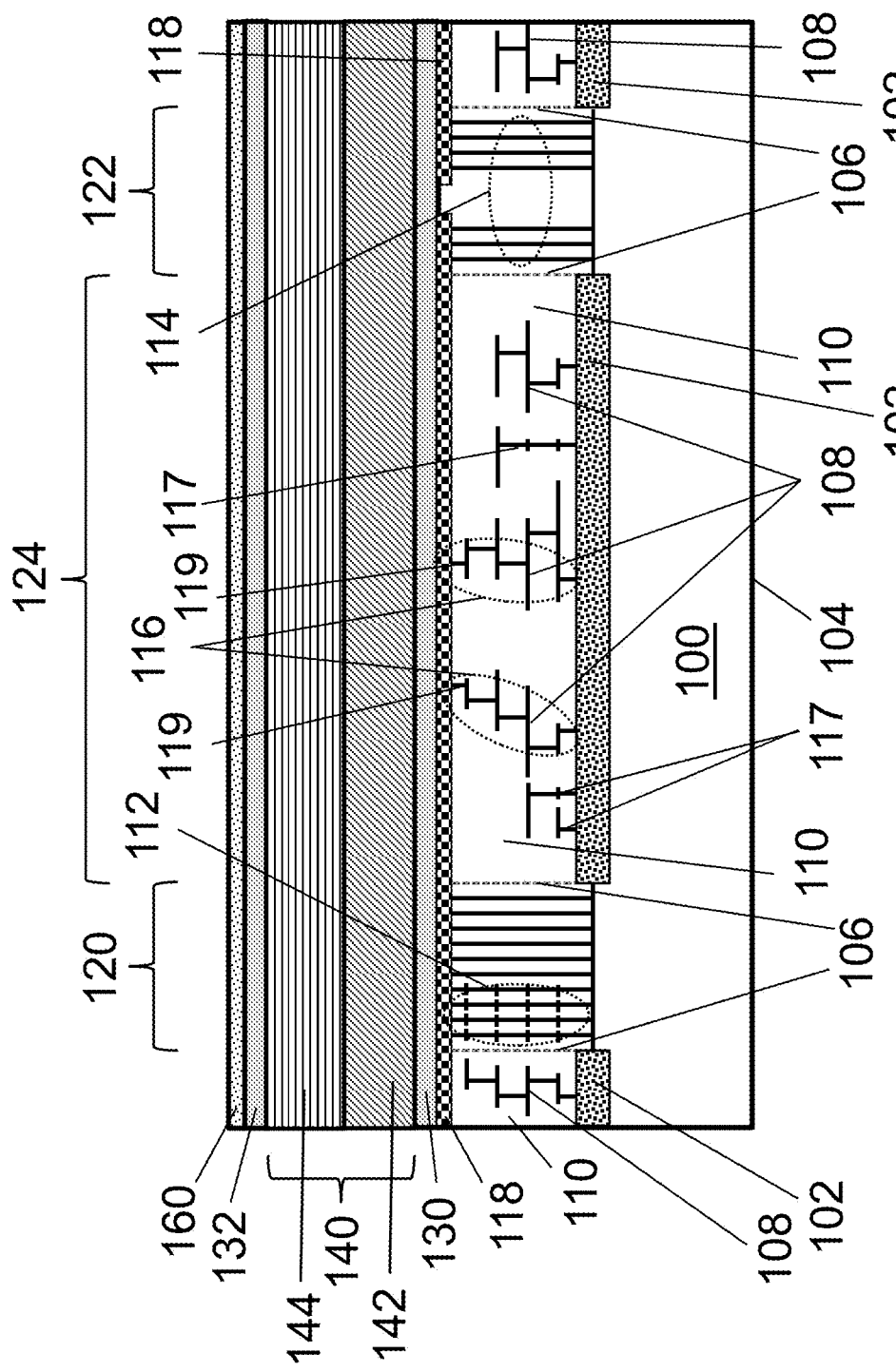

TIL 140 may include more than one aerogel layer, and the sub-layer on top may have different thermal and optical characteristics than the one below. For example, as illustrated in FIG. 1B, a higher temperature stable TIL material 144 may be placed on top of a lower temperature stable TIL material 142. For example, higher temperature stable TIL material 144 may also have a greater thermal conductivity and/or IR absorbing properties than lower temperature stable TIL material 142. For example, higher temperature stable TIL material 144 may include a carbon or alumina aerogel and lower temperature stable TIL material 142 may include, for example, a silica aerogel or a disordered nanostructured material such as $WSe_2$, when the two TIL sub-layers are utilized in combination. Moreover, two thin layers of a crack sensitive material, for example, some aerogels, may be formed (with or without an oxide layer disposed in-between) in sequence or separately, and combined as a portion of or substantially all of TIL 140. Choice of material and structure may include the maximum temperature during processing of layer being processed 160.

TIL 140 may include at least one layer or region of highly thermally conductive material, for example, such as graphene, to improve the horizontal heat conductivity and thermal uniformity of the TIL 140 and/or the TPS.

Figure 1C:
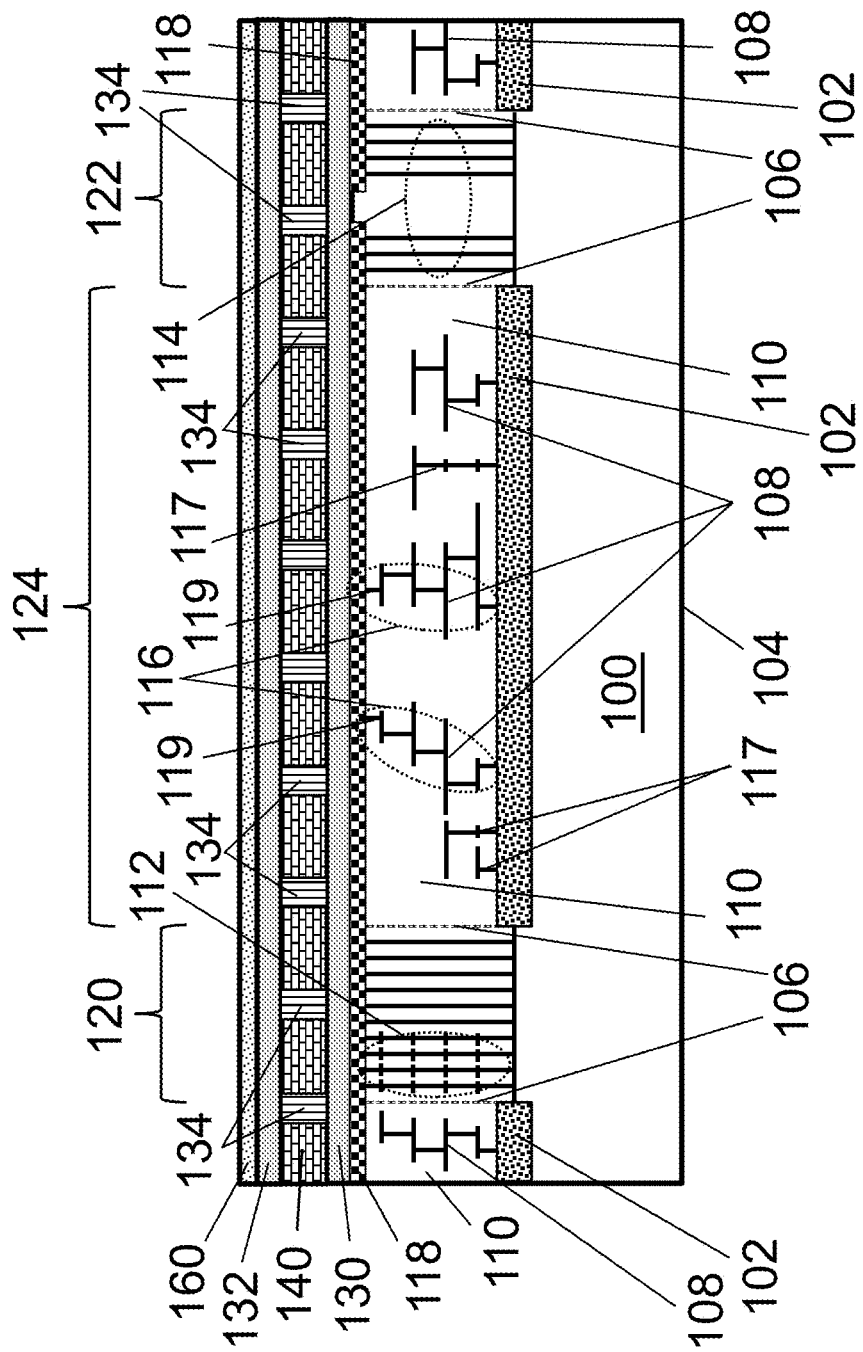
Figure 1D:
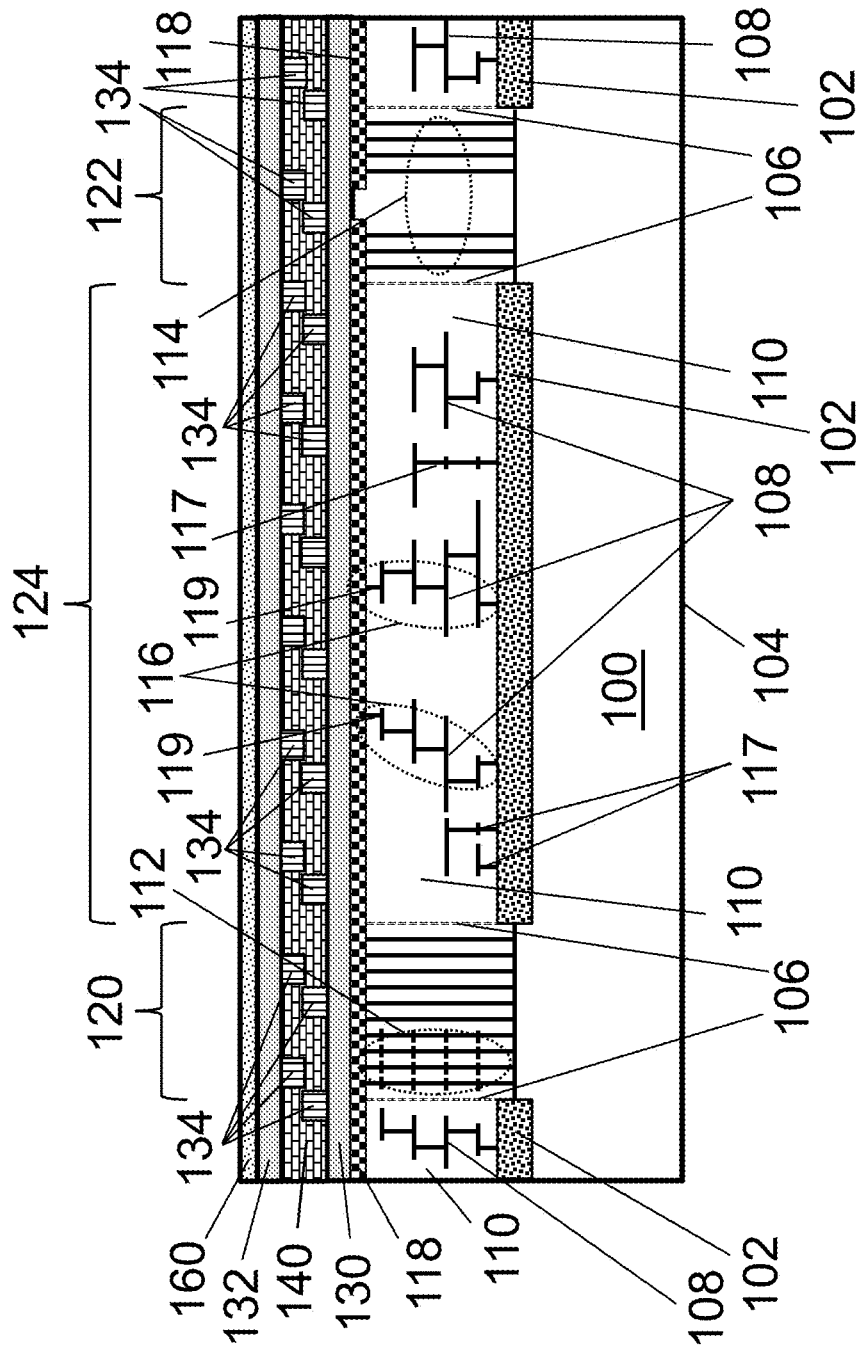
Figure 1E:
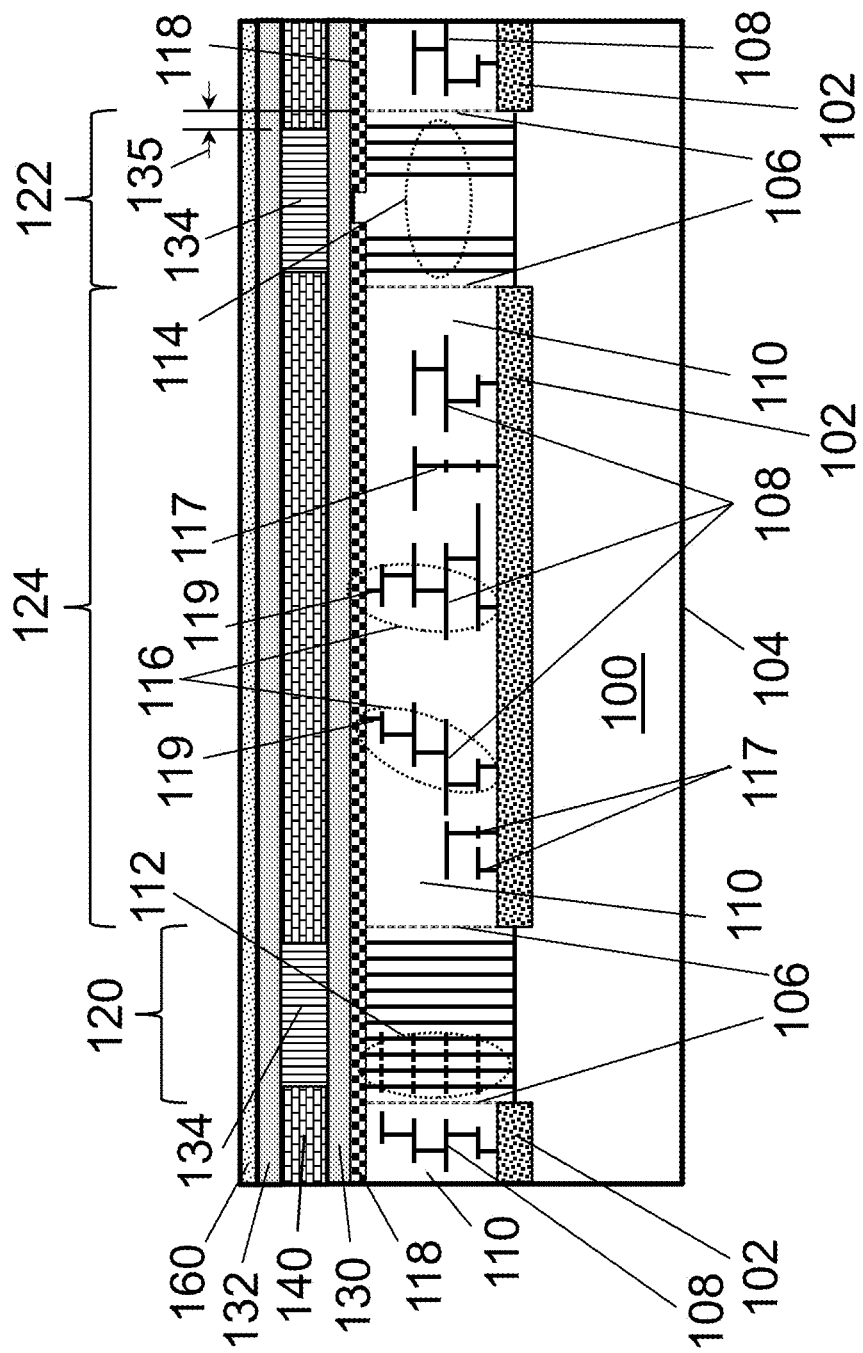

TIL 140 may include structures which include the purpose of enhancing the physical strength and/or cracking resistance of the TIL. For example, as illustrated in FIG. 1C, strengthening regions 134 may be placed within TIL 140 to stiffen and/or mechanically strengthen the 3DIC structure. Strengthening regions 134 may provide smaller regions of material, such as aerogel, to cure and may mitigate cracking and fracture initiation and/or propagation. Strengthening regions 134 may include materials that have a higher Young's modulus than the majority of the material within TIL 140. Strengthening regions 134 may include, for example, silicon oxide, which has a higher mechanical strength than, for example, most aerogels and silsesquioxanes. Strengthening regions 134 may include less than about 0.5%, less than about 1%, less than about 2%, or less than about 3% of the area and/or volume of TIL 140, thus affecting the total average TIL 140 thermal conductivity by less than about 1%, or less than about 3%. Strengthening regions 134 may be constructed to substantially match the thickness of TIL 140, or may be about 80%, or about 60% or about 50% or about 30% of the thickness of TIL 140. To help mitigate the increased local thermal conductivity due to the presence of strengthening regions 134, the strengthening regions 134 may be designed to not overlap (or may partially overlap, not shown) another strengthening regions 134 above or below, as illustrated in FIG. 1D. Moreover, as illustrated in FIG. 1E, strengthening regions 134 may be designed to be aligned to the scribelanes, for example scribelane with thermal via stacks and continuous shield 120 and/or scribelane with thermal via stacks and cut shield layer 122, and may underlap the full extent of the scribelanes by underlap 135, which may be the layout distance between the die seal 106 and the edge of the closest strengthening regions 134. The value of underlap 135 may be determined at least by the materials and structure of upper isolation layer 132, strengthening regions 134, or lower isolation layer 130, and shield layer or regions 118 (thermal conductivities and thicknesses), the maximum desired temperature of 160, damage/melting point of temperature sensitive substrate metallization 108 and/or BEOL isolation 110 and/or die seal 106. For example, underlap 135 may have the dimension of at least about 1 um, at least about 5 um, at least about 10 um, at least about 20 um, or at least about 50 um.

Continuing as illustrated in FIG. 1A (and in a similar fashion for FIGS. 1B-1E), upper isolation layer 132 may be deposited on top of TIL 140 to seal, protect, and electrically (and a small bit thermally) isolate, and may include the bonding oxides for an ion-cut layer transfer process (for example, the case wherein TIL 140 is formed on the acceptor wafer). A shield layer (not shown) may be placed above the TIL 140 as needed to thermally protect the TIL from pulsed short time-scale laser exposures, which may be utilized in combination with conventional (with cooled chuck) thermal processing steps. The heat capacity of the shield layer is more than sufficient to absorb the energy dissipated by the layer being processed 160 as it cools; the heat capacity in the shield may be designed to absorb and dissipate the energy, such as described in referenced documents herein and by Rajendran, B., et al., "Pulsed Laser Annealing: A scalable and practical technology for monolithic 3D IC," IEEE 3DIC Symposium, October 2013, [Rajendran2013] incorporated herein by reference. Upper isolation layer 132 may include designed-in voids (not shown), for example, by etch removal of portions of upper isolation layer 132, thus forming regions of vacuum and/or gas and regions of the remaining material (for example, silicon oxide) of upper isolation layer 132. The voids may be formed such that they extend fully or partially thru the entire thickness upper isolation layer 132. The presence of the voids may reduce the average thermal conductivity of upper isolation layer 132. The voids may include greater than about 5%, greater than about 10%, greater than about 20%, or greater than about 40% of the area and/or volume of upper isolation layer 132, thus affecting the total average upper isolation layer 132 thermal conductivity by greater than about 5%, or greater than about 40%.

The layer being processed 160 may include a layer transferred thin (less than 200 nm) layer that may be oxide to oxide bonded to the top surface of the built-up substrate (for example, a portion of upper isolation layer 132), thereby including a bonding oxide that partially thermally and fully electrically isolates the layer being processed from the (top) shield layer. The layer being processed 160 may include materials such as, for example, monocrystalline silicon, or InP, or GaAs, or Ge, or SiGe, or SiC, or combinations thereof. The layer being processed 160 may also include a heat spreader and/or optical reflective layer or layers, for example tungsten or aluminum, and/or may include optically absorptive layers or regions, for example carbon, phase change materials. The layer being processed 160 may also be formed by methods other than layer transfer, for example, by deposition, and may include poly-crystalline silicon, amorphous silicon, carbon nano-tubes, grapheme, $MoS_2$. During the formation of devices, for example transistors, diodes, optical devices, resistors, inductors, as well as other devices described herein and in referenced documents, on the layer being processed 160, the structures and methods described herein, for example, the TPS, TIL, TES, and modified processing equipment, may protect the underlying sensitive structures from the processing and processing temperature exposures of that device formation. The layer being processed 160 may include the second or higher transferred or constructed device layers in the 3DIC devices and methods disclosed in the referenced documents, for example, transfer layer 809 of FIG. 8C of U.S. Pat. No. 8,273,610.

The goal is to engineer heat transfer in this stack, such that the temperature in substrate metallization 108 and BEOL isolation 110 interconnect layers and substrate device regions 102 are kept cool, below preferably about 200° C., or below about 350° C., or below about 400° C., depending on the precise thermal sensitivities of the BEOL materials and construction. There are two regimes of interest, which must be considered from the standpoint of heat transfer.

For short-duration, high-temperature process steps, the goal is to engineer the heat capacity in the shield layer(s), for example, shield layer or regions 118, to be large enough to serve as a 'sink' for the thermal energy involved in such process steps. The thermal energy which must be dissipated is, for instance, the energy to melt/sub-melt the thin Si layer (in order to anneal damage from ion implantation and electrically activate the dopants). This thermal energy, per unit area, is given in the first equation, below. The second equation represents the storage of this energy in the shield layer.

$$E_{dissipated}/A = \rho_{Si} t_{Si} C_{Si} \Delta T_{Si}$$

$$E_{stored}/A = \rho_{shield} t_{shield} C_{shield} \Delta T_{shield}$$

In order that underlying structures are affected minimally, the temperature change in the shield layer or regions 118 should be less than about 200° C. or less than about 400° C., compared to a temperature rise in the surface Si layer of about 1400° C. Such a condition is arranged by ensuring the product of the Si layer thickness and heat capacity per unit volume are roughly ¼ of the similar parameters for the shield layer. The shield layer then dissipates this energy slowly enough into the underlying structures, such that the underlying structures temperature should not rise above about 200° C. or less than about 400° C. The TPS, which may include shield layer or regions 118 may allow for rapid and uniform lateral heat spreading of heat coming from above, avoidance of hot-spots, and to provide good thermal connectivity (thru, for example, thermal via stacks with via landing pads 112 and/or thermal vias in the scribelane 114, and/or in-die thermal via stacks 116 and/or fill-in thermal paths 117, and/or die seal 106) to the cooled substrate 100 for further protection of the underlying circuits substrate device regions 102 and substrate metallization 108 and BEOL isolation 110 interconnect layers.

For long-duration, low-to-mid-temperature process steps, for example, above about 405° C. to about 1000° C., the goal changes. Underlying structures must not be damaged or changed. But, there is too much thermal energy to simply store it in a shield layer: the layer would have to be far too massive. Instead, the layer-to-layer thermal conductivities must be engineered, so that the heat flux through the surface and thin Si layer (layer being processed 160) is sufficient to achieve the process goals, but the same heat flux in underlying layers causes only a temperature rise of perhaps about 200° C. This different goal may be achieved through two means: having a thermal insulation layer (for example TIL 140) above the shield layer (for example shield layer or regions 118) which has a very low thermal conductivity; and/or, placing the entire stack of materials, wafer and all, on a chuck or substrate whose temperature is held actively at a low value, for example, at roughly room temperature.

Persons of ordinary skill in the art will appreciate that the illustrations in FIGS. 1A through 1E are exemplary only and are not drawn to scale. Such skilled persons will further appreciate that many variations are possible such as, for example, substrate 100 may be p-type, n-type or un-doped silicon, or may be a structured material wafer such as GeOI, a mix of Si and Ge, SiGe. Moreover, MOSFETs may be constructed with n-MOSFETs in a first mono-crystalline silicon layer such as substrate 100 and p-MOSFETs in a second mono-crystalline layer, such as layer to be processed 160, which may include different crystalline orientations of the mono-crystalline silicon layers, such as for example, <100>, <111> or <551>. Many other modifications within the scope of the invention will suggest themselves to such skilled persons after reading this specification. Thus the invention is to be limited only by the appended claims.

Figure 2:
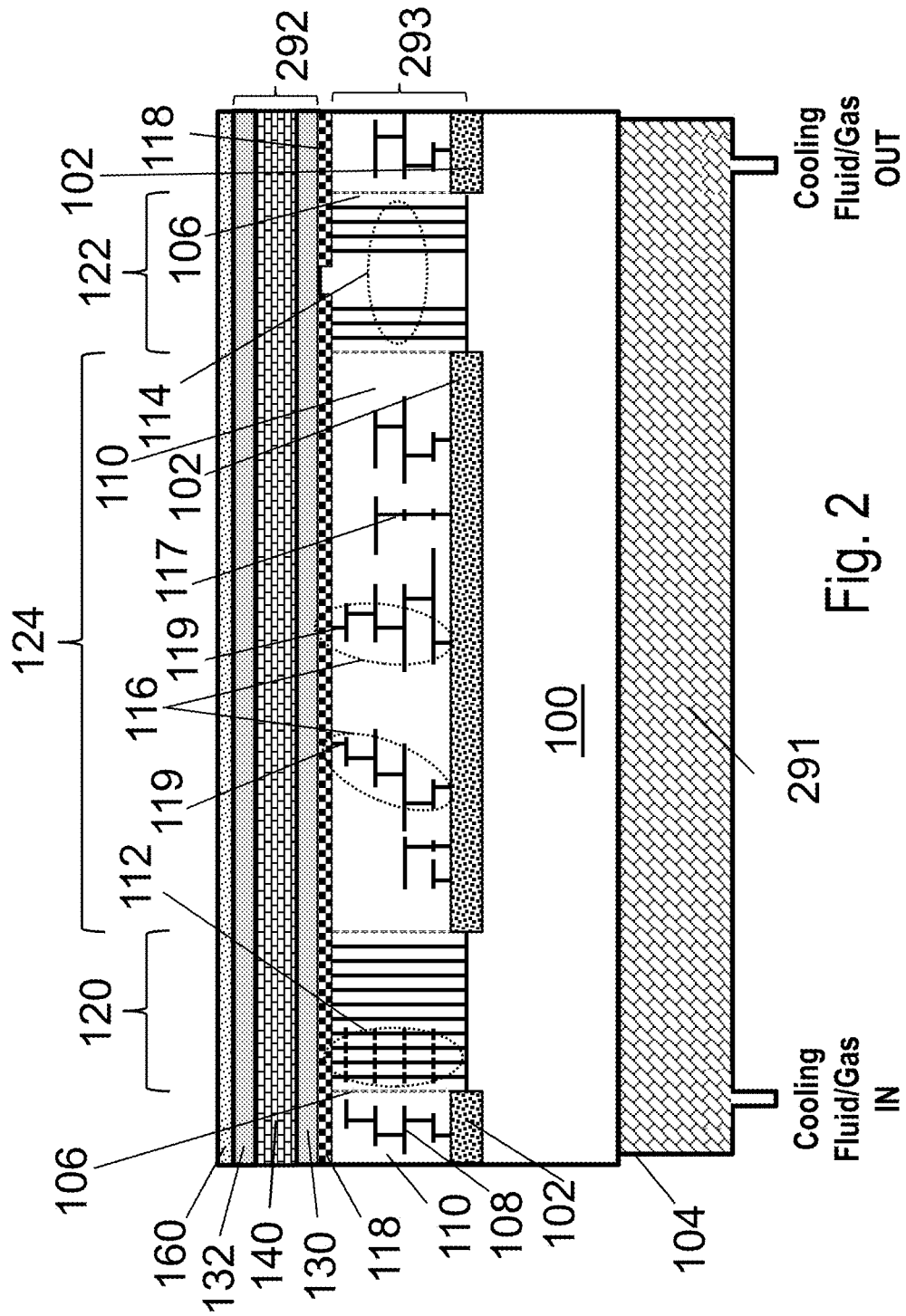
FIG. 2 is an exemplary drawing illustration of protective structures and a cooling device to model thermal conduction of the structures.

As illustrated in FIG. 2, the structure and device of FIG. 1 may be modeled as a series of thermal resistors (with units of K/W, degrees Kelvin per Watt) between layer being processed 160 being heated by a heat source and a cooled chuck 291. TIL stack 292, which may include upper isolation layer 132, TIL 140, and lower isolation layer 130, may be disposed between the layer being processed 160 and heat shield layer or region 118. Base circuits 293, which may include substrate device regions 102 (or a portion), die seal 106, regions of substrate metallization 108 and BEOL isolation 110, thermal via stacks with via landing pads 112, thermal vias in the scribelane 114, in-die thermal via stacks 116, fill-in thermal paths 117, and via connection 119, may be disposed between heat shield layer or region 118 and substrate 100. Substrate 100 may be in contact with cooled chuck 291 at backside surface 104.

For example, suppose a heat source heats the layer being processed 160 to 1000° C. and the cooled chuck 291 is being held at 20° C. by means of, for example, cooling fluids or gases. For simplicity the horizontal patterning in the base circuit will be ignored. The following equations and calculations follow.

$R_x \propto T_x*/\kappa$; where $R_x$ is the average thermal resistance of the layer x, $T_x$ is the thickness of the layer x, and $\kappa$ is the average thermal conductivity of the layer x.

$R_{UT} \propto T_{UT}/0.1 = 10 T_{UT}$; where $R_{UT}$ is the average thermal resistance of TIL stack 292, $T_{UT}$ is the thickness of TIL stack 292, and the thermal conductivity of TIL stack 292 is about 0.1 W/m-K, ignoring the small effect of upper isolation layer 132 and lower isolation layer 130.

$R_{BC} \propto 2/(400*0.5+1.4*0.5)+2/(400*0.05+1.4*0.95)=0.104$; where $R_{BC}$ is the average thermal resistance of base circuits 293, the base circuits 293 layer is 4 um thick, the metal layer volume mix is 50% $SiO_2$ @ $\kappa \cong 1.4$ W/m-K and 50% Cu @ $\kappa \cong 400$ W/m-K, and the IMD intra-layer volume mix is 95% $SiO_2$ with 5% Cu vias.

$R_{SS} \propto 775/150=5.2$; where $R_{SS}$ is the average thermal resistance of substrate 100, and substrate 100 is a 300 mm bulk silicon substrate of 775 um thickness and $\kappa \cong 150$ W/m-K.

Assuming the chuck to be close to 0° C. and a 1000° C. processing temperature of layer being processed 160, gives, for the elements and structure and devices within base circuits 293 not to exceed 400° C.: $400/1000 \geq 5.3/(10T_{UT}+5.3)$. Solving for $T_{UT}$ gives $T_{UT} \geq 0.8$ um.

Accordingly, base circuits 293 of temperatures below 400° C. may be achieved with a TIL stack 292 layer thickness of about 1 um. Further, the result is insensitive to the actual thickness of the base circuits 293 because the substrate 100 thickness term dominates. Finally, the few phonon reflections of the base circuits 293 BEOL structures do not appreciably affect the $R_{BC}$, which is a non-dominant term as well.

However, a 1 um TIL stack of 0.1 W/m-K thermal conductivity for a 400° C. temperature drop across it computes to about a 5.4 MW cooler capacity requirement for a 300 mm silicon wafer. This may be not be readily achievable as Tuckermann demonstrated that a water based substrate cooling capacity may be about 1 kW/cm$^2$, which on a 300 mm silicon wafer/substrate may be about 700 kW/wafer (Tuckerman, D. B., et al., "High Performance Heat Sinking for VLSI," IEEE Electron Device Letters, vol. ed1-2, no. 5, May 1981. The DARPA based ICECool program has achieved higher thermal cooling results. In addition, the cooling capacity of equipment chuck coolers may limit the amount of heat that can be removed from the chuck to about 100 kW/300 mm wafer, and practical/economical equipment heater and cooler designs may further limit the amount of heat that can be removed from the chuck to about 10 kW/300 mm wafer. A thicker TIL may be desirable to create a high enough thermal resistance so that the layer being processed 160 may be at the desired processing temperature of 600/800/1000° C., and the cooling capacity limitations may be kept. A TIL stack thickness of about 10 um may be enough whilst the thermal processing on layer being processed 160 is being performed. This TIL thickness may be adjusted by considerations of TIL thermal conductivity, desired temperature of the layer being processed, and equipment capacity/capability constraints.

TPS protective device structure shown in at least FIGS. 1 and 2 herein may assist guiding the heat from the layer being processing 160 safely to the cooling chuck or cooling device. Heat from a processing step of forming devices and structure in and on the layer being processed 160 may flow through the TIL stack 292 to the one or more shield layers such as shield layer or regions 118, where the heat may preferentially flow in the very thermally conductive shield layer horizontally until finding a vertical path of high thermal conductivity, for example, the scribelane or in-die thermal via stacks. The heat may then be conducted thru the substrate 100 to the back surface 104 of the substrate 100 which is coupled to a cooling chuck or other cooling device that draws the processing heat away. Shield layers, such as shield layer or regions 118, and thermal vias and via stacks, including thermal via stacks with via landing pads 112, thermal vias in the scribelane 114, in-die thermal via stacks 116, may include materials with a high thermal conductivity greater than 10 W/m-K, for example, copper (about 400 W/m-K), aluminum (about 237 W/m-K), Tungsten (about 173 W/m-K), Plasma Enhanced Chemical Vapor Deposited Diamond Like Carbon-PECVD DLC (about 1000 W/m-K), and Chemical Vapor Deposited (CVD) graphene (about 5000 W/m-K). Shield layers, such as shield layer or regions 118, and thermal vias and via stacks, including thermal via stacks with via landing pads 112, thermal vias in the scribelane 114, in-die thermal via stacks 116, may be sandwiched and/or substantially enclosed by materials with a low thermal conductivity (less than 10 W/m-K), for example, silicon dioxide (about 1.4 W/m-K). The thermal conductivity of the material of the substrate 100 may be lower than the shield layers and thermal vias and via stacks, for example silicon at about 149 W/m-K. Heat from processing the layer being processed 160 may flow thru the poorly thermal conducting oxide to the shielding layer or layers, which have an excellent thermal conducting path to the cooled chuck of the processing equipment.

The thermal vias residing in the scribelanes, for example, thermal via stacks with via landing pads 112 and/or thermal vias in the scribelane 114, may be removed by a lithography and etch step or steps so that dicing of the 3DIC may be easier for the dicing saw or laser. A hard mask and RIE etching may be utilized, and may be combined with wet etches of the isolation materials and/or metals in the thermal vias and scribelanes. Overlap of the etch opening to the die edge seal 106 would be adjusted so that the scribelane clearing etch would not harm the die edge seal 106. The substrate 100 thermal conductivity may be increased in a variety of ways, for example, as described herein with reference to the thermally enhanced substrate (TES).

The TPS and/or TIL may also provide stack layer to stack layer thermal protection during operation of a 3DIC stack. For example, the TPS and/or TIL may help shield a DRAM layer that is on top of a high speed Graphics Processing Unit (GPU) or microprocessor (uP). The heat produced by the GPU/uP on the lower layer, perhaps substrate, may be captured with the TPS assisted by the insulation capability of the TIL, and may then be shunted to the heat removal device laterally and vertically.

FIGS. 3A-H illustrates an exemplary n-channel FD-MOSFET (Fully Depleted Metal Oxide Semiconductor Field Effect Transistor) with integrated TPS and TIL (TES may be utilized as necessary for substrate heat removal efficiency) which may be constructed in a 3D stacked layer using procedures outlined herein and in U.S. Pat. Nos. 8,273,610, 8,557, 632, 8,581,349, 8,642,416, and 8,450,804, and US patent publication 2012/0091587. The contents of the foregoing applications are incorporated herein by reference. Forming the TIL on a donor wafer as part of the transferred layer may provide a greater process window, especially for temperature exposures, than forming the TIL on the acceptor wafer, which may be limited to temperatures less than about 400° C. due to the presence of copper or aluminum metallization and low k IMDs on the layer or layers below the layer being processed.

As illustrated in FIG. 3A, SOI donor wafer substrate 301 may include back channel layer 305 above Buried Oxide BOX layer 303. Back channel layer 305 may be doped by ion implantation and thermal anneal, may include a crystalline material, for example, mono-crystalline (single crystal) silicon and may be heavily doped (greater than $1e16$ atoms/cm$^3$), lightly doped (less than $1e16$ atoms/cm$^3$) or nominally un-doped (less than $1e14$ atoms/cm$^3$). SOI donor wafer substrate 301 may include a crystalline material, for example, mono-crystalline (single crystal) silicon and at least the upper layer near BOX layer 303 may be very lightly doped (less than $1e15$ atoms/cm$^3$) or nominally un-doped (less than $1e14$ atoms/cm$^3$). Back channel layer 305 may have additional ion implantation and anneal processing to provide a different dopant level than SOI donor wafer substrate 301 and may have graded or various layers of doping concentration. SOI donor wafer substrate 301 may have additional ion implantation and anneal processing to provide a different dopant level than back channel layer 305 and may have graded or various layers of doping concentration. The donor wafer layer stack may alternatively be formed by epitaxially deposited doped or undoped silicon layers, or by a combination of epitaxy and implantation, or by layer transfer. Annealing of implants and doping may include, for example, conductive/inductive thermal, optical annealing techniques or types of Rapid Thermal Anneal (RTA or spike). The preferred at least top of SOI donor wafer substrate 301 doping will be undoped to eventually create an FD-MOSFET transistor with an updoped conduction channel. SOI donor wafer may be constructed by layer transfer techniques described herein or elsewhere as known in the art, or by laser annealed SIMOX at a post donor layer transfer to acceptor wafer step. BOX layer 303 may be thin enough to provide for effective DC or RF back and/or device/transistor body bias, for example, about 25 nm, or about 20 nm, or about 10 nm, or about 35 nm thick. Upper isolation layer 332 may be formed by deposition of a dielectric such as, for example, silicon oxide, and/or by thermal/ RTO oxidation of back channel layer 305. Upper isolation layer 332 may include, or may have below it, a layer (not shown) that may serve as a heat shield and/or conductive back plane, for example, a layer of tungsten (similar to the description in FIGS. 39, 40, 41, 42, 43 of U.S. Pat. Nos. 8,574,929 and 8,674,470 and U.S. patent application Ser. No. 13/803, 437). The thin layer of refractory metal with a high melting point may be formed on top of the isolation layer and then patterned after layer transfer, thus forming metalized backbias regions for the second layer of transistors, the back-bias region will not be harmed by the thermal cycles of the processing on the layer being processed.

Figure 3C:
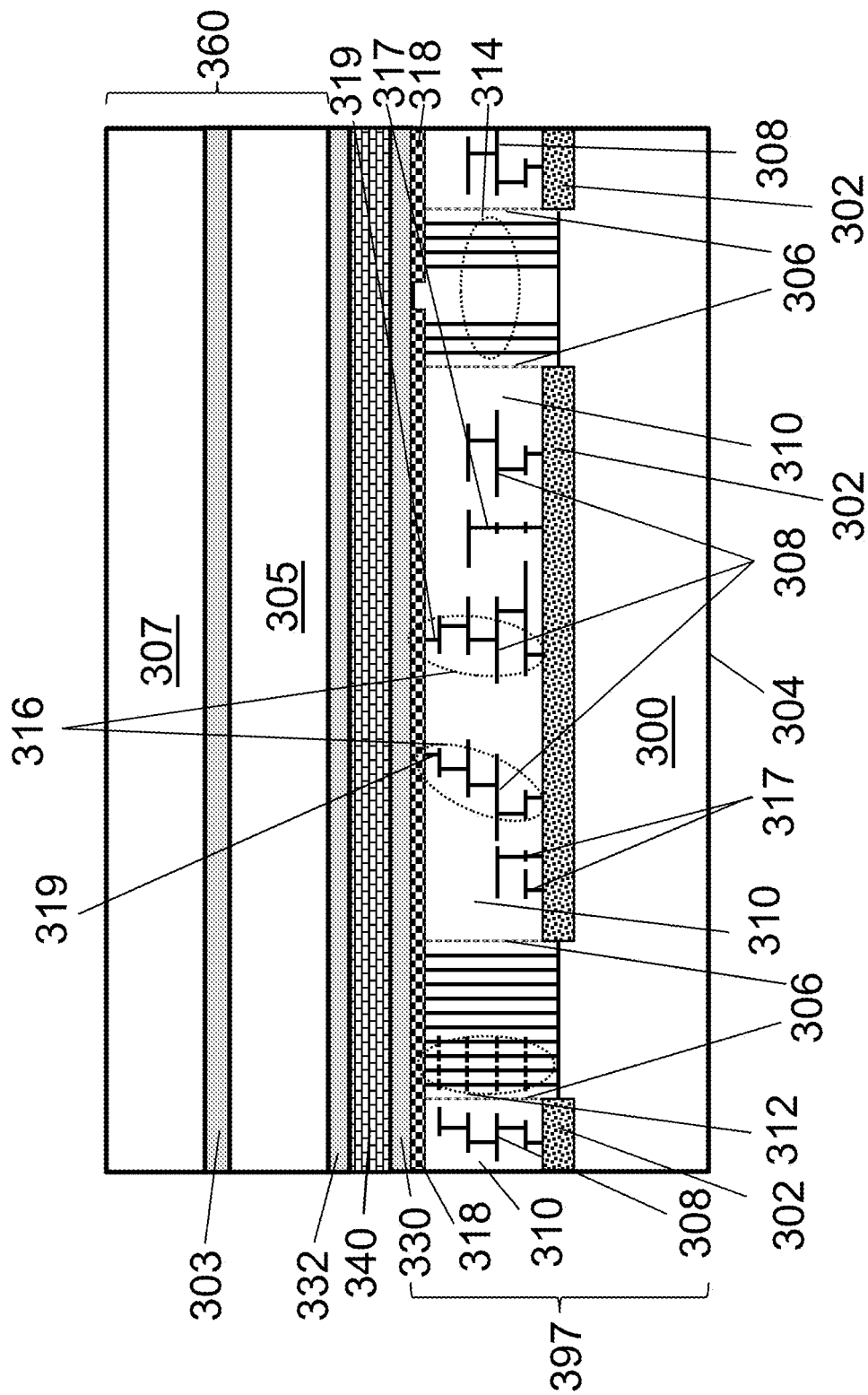

Continuing with the FIG. 3A illustration, TIL 340 may be formed on top of upper isolation layer 332. Upper isolation layer 332 may be etched (partially or fully) to form a portion of strengthening regions 134 structures (not shown). Alternatively, an additional isolation layer (not shown) may be deposited on top of upper isolation layer 332 and etch partially or substantially fully to form the strengthening regions 134 as illustrated in FIG. 1C or a portion of the strengthening regions 134 as illustrated in FIG. 1D, and/or the strengthening regions 134 as illustrated in FIG. 1E. For the sake of clarity, FIGS. 3A-H will not show the presence of any strengthening regions within or for TIL 340.

TIL 340 formation may include forming a thin film silica aerogel, for example, such as described by Bauer, and may be opacified to absorb IR, for example, such as described by JWang. The aerogel may be strengthened as by, for example, a CVD process as described by Obrey. TIL 340 may include multiple aerogel layers processed. For example, in anticipation of a non-carrier wafer layer transfer, wherein the transferred layers formed on the donor substrate are flipped over, an IR absorbing aerogel on the donor wafer/substrate may be formed first and then a lower thermal stable aerogel may be formed above it, thereby forming a TIL 340.

TIL 340 formation may include forming a thin film alumina aerogel, for example, such as described by Poco. Opacification and CVD hardening may also be utilized for alumina aerogels. TIL 340 formation may include forming a thin film phosphate aerogel, for example, such as described by Lindquist.

TIL 340 formation may include forming a thin film carbon aerogel, for example, such as described by Weiner above. The carbon aerogel, after vacuum/inert gas pyrolysis to the desired maximum thermal exposure temperature and time described below, may be sealed to oxygen by first depositing an oxygen impermeable layer, such as, for example, silicon nitride, performing the carbon aerogel formation via pyrolysis, and the sealing in vacuum or inert gas environment with a topping seal layer of silicon nitride. For electrically conductive forms of carbon aerogel, electrical insulative liners (such as silicon oxides) may be utilized during the formation of TLV (strata to strata) connections.

Many of the aerogels may be formed thicker than the desired end thickness, and then thinned by, for example, CMP processing or etching, to the desired end thickness. For example, a 5 um or 10 um aerogel layer may be formed, but may be CMP'd back to 1 um. Aerogel formation may include a step of applying and adhesion promoter, for example, HMDS, to the wafer before applying the sol-gel aerogel, for example, by spin-on techniques. Then the extraction step, for example, $CO_2$ SCE, and/or a pyrolysis step may be performed.

The physical and/or electrical characteristics of many of the aerogels may be improved by various processes before and/or after additional process steps to make/increase its hydrophobic character, strengthen its structure, chemical inertness, fracture resistance and heal any damage done during processing; such as, for example, thermal silane treatments, plasma cure and plasma treatments, CVD Silane and other substances treatment. These treatments may be performed after sol-gel and/or after extraction steps (such as an SCE—Super Critical Extraction), or after etching, deposition and other steps used to form the 3 D structures.

TIL 340 formation may include forming nanoscale layered oxides, such as, for example, as described by Alvarez-Quintana.

TIL 340 formation may include forming a layer or layers of disordered nanostructured materials, such as, for example, as described by Chiritescu.

TIL 340 formation may include forming a layer or layers of low k porous dielectric materials as described by Ahner and Hu.

TIL 340 formation may include forming a top sub-layer of a material whose thermal conductivity decreases with temperature, for example, germanium, and a lower sub-layer with a material whose thermal conductivity increases with temperature, for example, silica aerogels. The silica aerogel may be formed as described herein and annealed with the pre-layer-transfer anneal as described herein. A seal layer, such as, for example, silicon oxide, may be deposited by CVD or other processes, and then a layer of negative operating thermal conductivity may be formed on top of the seal layer, for example, layer transferred crystalline germanium.

A pre-layer-transfer anneal may be performed as part of the TIL 340 formation process or after the formation of TIL 340, and may include a thermal anneal equal to or greater than the maximum temperature that the TIL 340 would see during subsequent processing, for example, during the 3D IC stack processing, including layer transfer/bonding, transistor/device formation, activation anneals, and so on. The pre-layer-transfer anneal temperature may be about 10° C. greater than the process exposure maximum, or about 20° C. greater than the process exposure maximum, or about 30° C. greater than the process exposure maximum, or about 40° C. greater than the process exposure maximum. The pre-layer-transfer anneal temperature may be limited by the effect/damage it may have on the doping gradients elsewhere in the donor stack, or the stress/outgassing effects on TIL 340, as examples. The ramp up and cool down rates may be carefully controlled depending on the type and condition of material in TIL 340 to minimize cracking, outgassing effects, and other stress effects on the stack. The time of the pre-layer-transfer anneal at maximum temperature (the process exposure maximum) may be less than about 30 minutes, or less than about 1 hour, or less than about 2 hours. The formation of TIL 340 and/or the anneal of TIL 340 and the donor stack may be at a temperature and time greater than allowed by a metallized acceptor structure, for example, above about 400° C., above about 600° C., above about 800° C., above about 1000° C.

As illustrated in FIG. 3B, the top surface of the donor wafer stack that may include SOI donor wafer substrate 301, may be prepared for oxide wafer bonding with a deposition of an oxide or by thermal oxidation of back channel layer 305 to form oxide layer 380. The gaseous component of the TIL 340 thermal conductivity may be minimized by placing the aerogel or other pore or void-based structures under a vacuum before sealing it with a capping layer 329, which may be capping layer 329 or another sealing layer, such as oxide, as part of the TIL 340 formation and structure.

A layer transfer demarcation plane (shown as dashed line) 399 may be formed by hydrogen implantation or other methods as described in the incorporated references, and may reside within the SOI donor wafer substrate 301. The SOI donor wafer substrate 301 stack, such as surface 382, and acceptor wafer 397 (first shown in FIG. 3C) may be prepared for wafer bonding as previously described in the incorporated references and low temperature (less than approximately 400° C.) bonded.

As illustrated in FIG. 3C, capping layer 329, back channel layer 305, BOX layer 303 and remaining channel layer 307 may be layer transferred to acceptor wafer 397. Capping layer 329 and acceptor wafer 397 top bonding oxide (not shown) may be oxide to oxide bonded, thus forming lower isolation layer 330. Acceptor wafer 397, as described in the incorporated references and herein, may include, for example, transistors, circuitry, and metal, such as, for example, aluminum or copper, interconnect wiring, a metal shield/heat sink layer or layers, and thru layer via metal interconnect strips or pads. Acceptor wafer 397 may be substantially comprised of a crystalline material, for example mono-crystalline silicon or germanium, or may be an engineered substrate/wafer such as, for example, an SOI (Silicon on Insulator) wafer or GeOI (Germanium on Insulator) substrate. Acceptor wafer 397 may include transistors such as, for example, MOSFETS, FD-MOSFETS, FinFets, FD-RCATs, BJTs, HEMTs, and/or HBTs. The portion of the SOI donor wafer substrate 301 that may be above (when the layer stack is flipped over and bonded to the acceptor wafer 397) the layer transfer demarcation plane 399 may be removed by cleaving or other low temperature processes as described in the incorporated references, such as, for example, ion-cut with mechanical or thermal cleave or other layer transfer methods, thus forming remaining channel layer 307. An RTA (Rapid Thermal Anneal) may be utilized to induce cleaving as the TIL 340 is in place and the cold chuck may utilized to carry away the heat (as described further herein). An optical anneal, for example, a short wavelength pulsed laser, may be utilized to induce cleaving.

Many conventional semiconductor processing steps may now be utilized to form transistors and devices on the layer being processed 360 without harming the underlying structures of acceptor wafer 397, for example, a deposition or anneal may be performed at 800° C. on layer being processed 360. Heat removal from the substrate, for example, such as via a cooled chuck, is described elsewhere herein.

Damage/defects to crystalline structure of back channel layer 305 and remaining channel layer 307 may be annealed by conventional thermal anneals with appropriate cold chuck equipment and/or some of the annealing methods as described in the incorporated references, for example the short wavelength pulsed laser techniques, wherein the layer being processed 360 (which may include back channel layer 305, BOX layer 303 and remaining channel layer 307) may be heated to defect annealing temperatures, but the underlying structures of acceptor wafer 397 may be kept below the damage temperature of acceptor wafer 397, for example, less than about 400° C.

The top surface of remaining channel layer 307 may be chemically mechanically polished, and/or heat treated, to bring the surface quality to conventional defect levels and/or may be thinned by low temperature oxidation and strip processes, such as the TEL SPA tool radical oxidation and HF:H$_2$O solutions as described herein and in referenced patents and patent applications. Through the processing, the wafer sized layer channel layer 307 could be thinned from its original total thickness, and its final total thickness could be in the range of about 5 nm to about 20 nm, for example, 5 nm, 7 nm, 10 nm, 12 nm, 15 nm, or 20 nm. Channel layer 307 may have a thickness and/or doping that may allow fully-depleted channel operation when the FD-MOSFET transistor is substantially completely formed. Acceptor wafer 397 may include one or more shield/heat sink layers 318, which may include materials such as, for example, Aluminum, Tungsten (a refractory metal), copper, silicon or cobalt based silicides, or forms of carbon such as carbon nanotubes or graphene, and may be layered itself as described herein FIG. 6. Each shield/heat sink layer 318 may have a thickness range of about 50 nm to about 1 mm, for example, 50 nm, 100 nm, 200 nm, 300 nm, 500 nm, 0.1 um, 1 um, 2 um, and 10 um. Shield/heat sink layer 318 may TLV include isolation openings alignment mark openings (not shown), which may be utilized for short wavelength alignment of top layer (donor) processing to the acceptor wafer alignment marks (not shown). Shield/heat sink layer 318 may act as a heat spreader. Electrically conductive materials may be used for the two layers of shield/heat sink layer 318 and thus may provide, for example, a Vss and a Vdd plane and/or grid that may be connected to the donor layer transistors above, as well may be connected to the acceptor wafer transistors below, and/or may provide below transferred layer device interconnection. Noise on the power grids, such as the Vss and Vdd plane power conducting lines/wires, may be mitigated by attaching/connecting decoupling capacitors onto the power conducting lines of the grids. The decoupling caps, which may be within the second layer (donor, for example, donor wafer device structures) or first layer (acceptor, for example acceptor wafer transistors and devices 302), may include, for example, trench capacitors such as described by Pei, C., et al., "A novel, low-cost deep trench decoupling capacitor for high-performance, low-power bulk CMOS applications," ICSICT (9$^{th}$ International Conference on Solid-State and Integrated-Circuit Technology) 2008, October 2008, pp. 1146-1149, of IBM. The decoupling capacitors may include, for example, planar capacitors, such as poly to substrate or poly to poly, or MiM capacitors (Metal-Insulator-Metal). Shield/heat sink layer 318 may include materials with a high thermal conductivity greater than 10 W/m-K, for example, copper (about 400 W/m-K), aluminum (about 237 W/m-K), Tungsten (about 173 W/m-K), Plasma Enhanced Chemical Vapor Deposited Diamond Like Carbon-PECVD DLC (about 1000 W/m-K), and Chemical Vapor Deposited (CVD) graphene (about 5000 W/m-K). Shield/heat sink layer 318 may be sandwiched and/or substantially enclosed by materials with a low thermal conductivity (less than 10 W/m-K), for example, silicon dioxide (about 1.4 W/m-K). When there may be more than one shield/heat sink layer 318 in the device, the heat conducting layer closest to the TIL 340 may be constructed with a different material, for example a high melting point material, for example a refractory metal such as tungsten, than the other heat conducting layer or layers, which may be constructed with, for example, a lower melting point material, for example such as aluminum or copper. The remaining SOI donor wafer substrate 301 may now also be processed, such as smoothing and annealing, and reused for additional layer transfers. Upper isolation layer 332 and/or lower isolation layer 330 may include thicknesses of less than 1 um, less than 500 nm, less than 400 nm, less than 300 nm, less than 200 nm, or less than 100 nm.

Figure 3D:
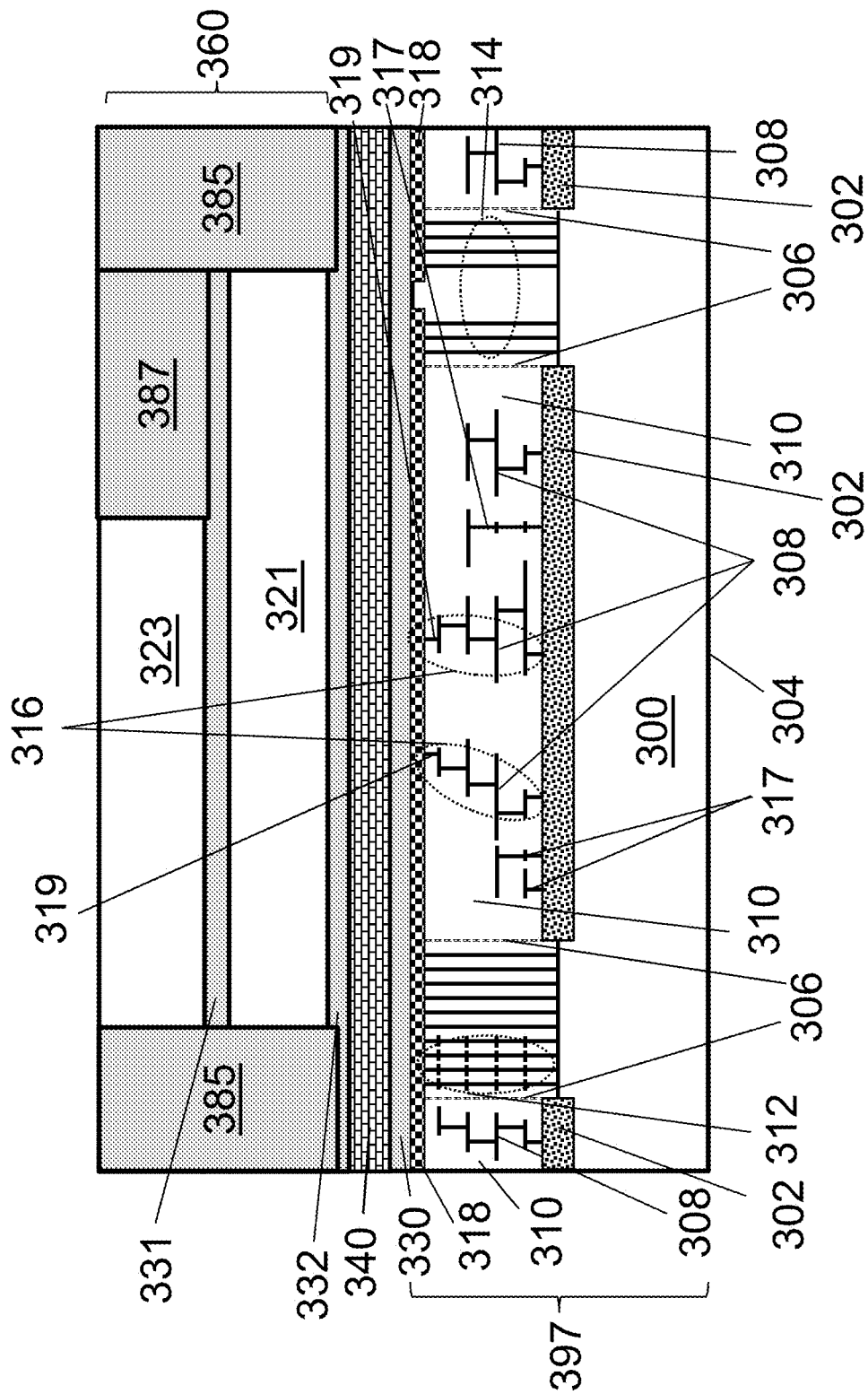

As illustrated in FIG. 3D, transistor and back channel isolation regions 385 and/or transistor isolation regions 387 may be formed. Transistor isolation region 387 may be formed by mask defining and plasma/RIE etching channel layer 307, substantially to the top of BOX layer 303 (not shown), substantially into BOX layer 303, or back channel layer 305 (not shown). Transistor and back channel isolation regions 385 may be formed by mask defining and plasma/RIE etching channel layer 307, BOX layer 303 and back channel layer 305, substantially to the top of upper isolation layer 332 (not shown) or substantially into upper isolation layer 332. Thus channel region 323 may be formed, which may substantially form the transistor body, back-channel region 321 may be formed, which may provide a back bias and/or Vt control by doping or bias to one or more channel regions 323, and BOX region 331. Back-channel region 321 may be ion implanted for Vt control and/or body bias efficiency. A conventional or low-temperature gap fill dielectric, such as SACVD oxide, may be deposited and chemically mechanically polished, the oxide remaining in transistor and back channel isolation regions 385 and transistor isolation regions 387. A conventional thermal and/or oxidizing anneal may be performed to anneal etch damage in back-channel region 321 and channel region 323, and densify the STI oxide in transistor and back channel isolation regions 385 and transistor isolation regions 387. The doping concentration of channel region 323 may include vertical or horizontal gradients of concentration or layers of differing doping concentrations. The doping concentration of back-channel region 321 may include vertical or horizontal gradients of concentration or layers of differing doping concentrations. Any additional doping, such as ion-implanted channel implants, may be activated and annealed with optical annealing, or conventionally. BOX region 331 may be a relatively thin dielectric, including the thickness range of 5 nm to 100 nm, at least a portion of which being between the back-channel region 321 and channel region 323. Back-channel region 321 could be constructed from a material other than crystalline silicon, for example, a refractory metal or doped silicon in crystallized form, poly or amorphous, or other conductive materials that are acceptable for semiconductor processing and can withstand high temperatures.

As illustrated in FIG. 3E, a transistor forming process, such as a conventional HKMG with raised source and drains (S/D), may be performed. For example, a dummy gate stack (not shown), utilizing oxide and polysilicon, may be formed, gate spacers 351 may be formed, raised S/D regions 353 and channel stressors may be formed by etch and epitaxial deposition, for example, of SiGe and/or SiC/P depending on P or N channel (and may be doped in-situ or ion-implantation and anneal activation), LDD and S/D ion-implantations may be performed, and first ILD 355 may be deposited and CMP'd to expose the tops of the dummy gates. Thus transistor channel region 325 and S/D & LDD regions 357 may be formed. The dummy gate stack may be removed and a gate dielectric 359 may be formed and a gate metal material gate electrode 361, including a layer of proper work function metal (Ti$_x$Al$_y$N$_z$ for example) and a conductive fill, such as aluminum, and may be deposited and CMP'd. The gate dielectric 359 may be an atomic layer deposited (ALD) gate dielectric that may be paired with a work function specific gate metal in the industry standard high k metal gate process schemes, for example, as described in the incorporated references. An anneal may be performed to densify and/or remove defects from gate dielectric 359, anneal defects and activate dopants such as LDD and S/D implants, densify the first ILD 355, form DSS junctions (Dopant Segregated Schottky such as $NiSi_2$), and/or form contact and S/D silicides (not shown). Optionally, portions of transistor isolation region 387 and BOX region 331 may be lithographically defined and etched away, thus forming second transistor isolation regions 389 and PD transistor area 363. Partially depleted transistors (not shown) may be constructed in a similar manner as the FD-MOSFETs constructed on transistor channel region 325 herein, but now with the thicker back-channel region 321 silicon as its channel body. PD transistor area 363 may also be utilized to later form a direct connection thru a contact to the back-channel region 321 for back bias and Vt control of the transistor with transistor channel region 325. This may also be utilized for RF transistors. If no PD devices are desired, then it may be more efficient to later form a direct connection thru a contact to the back-channel region 321 for back bias and Vt control of the transistor with transistor channel region 325 by etching a contact thru transistor isolation region 387.

Figure 3F:
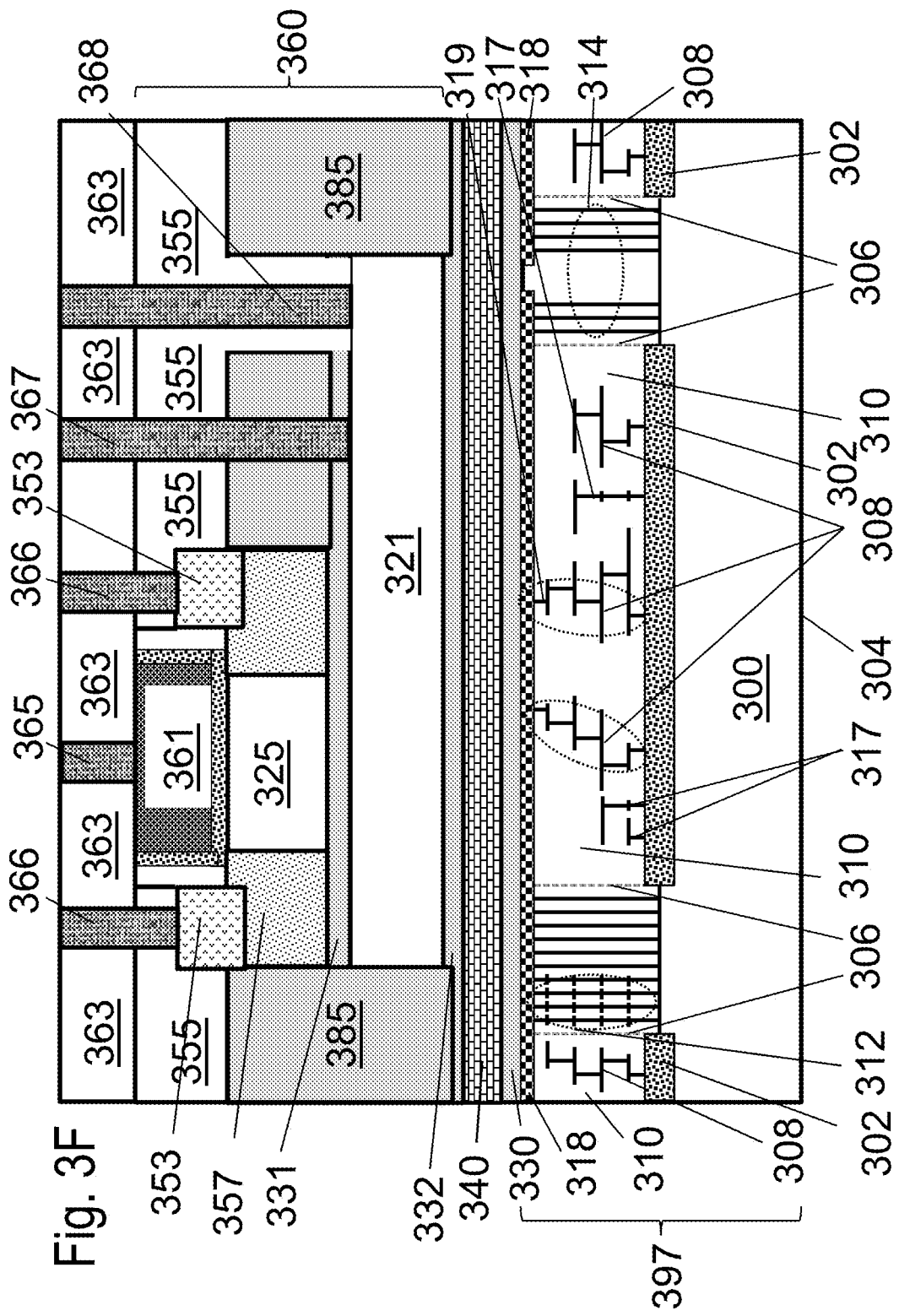

As illustrated in FIG. 3F, a thick oxide 363 may be deposited and planarized. Source, gate, drain, two types of back contact openings may be masked, etched, and filled with electrically conductive materials preparing the transistors to be connected via metallization. Thus gate contact 365 connects to gate electrode 361, source & drain contacts 366 connect to raised S/D regions 353, back channel contact 368 may connect to back-channel region 321, and direct back contact 367 may connect to back-channel region 321. Back channel contact 368 and direct back contact 367 may be formed to connect to shield/heat sink layer 318 by further etching, and may be useful for hard wiring a back bias that may be controlled by, for example, the second layer or first layer transistors and circuitry into the FD MOSFET.

Figure 3G:
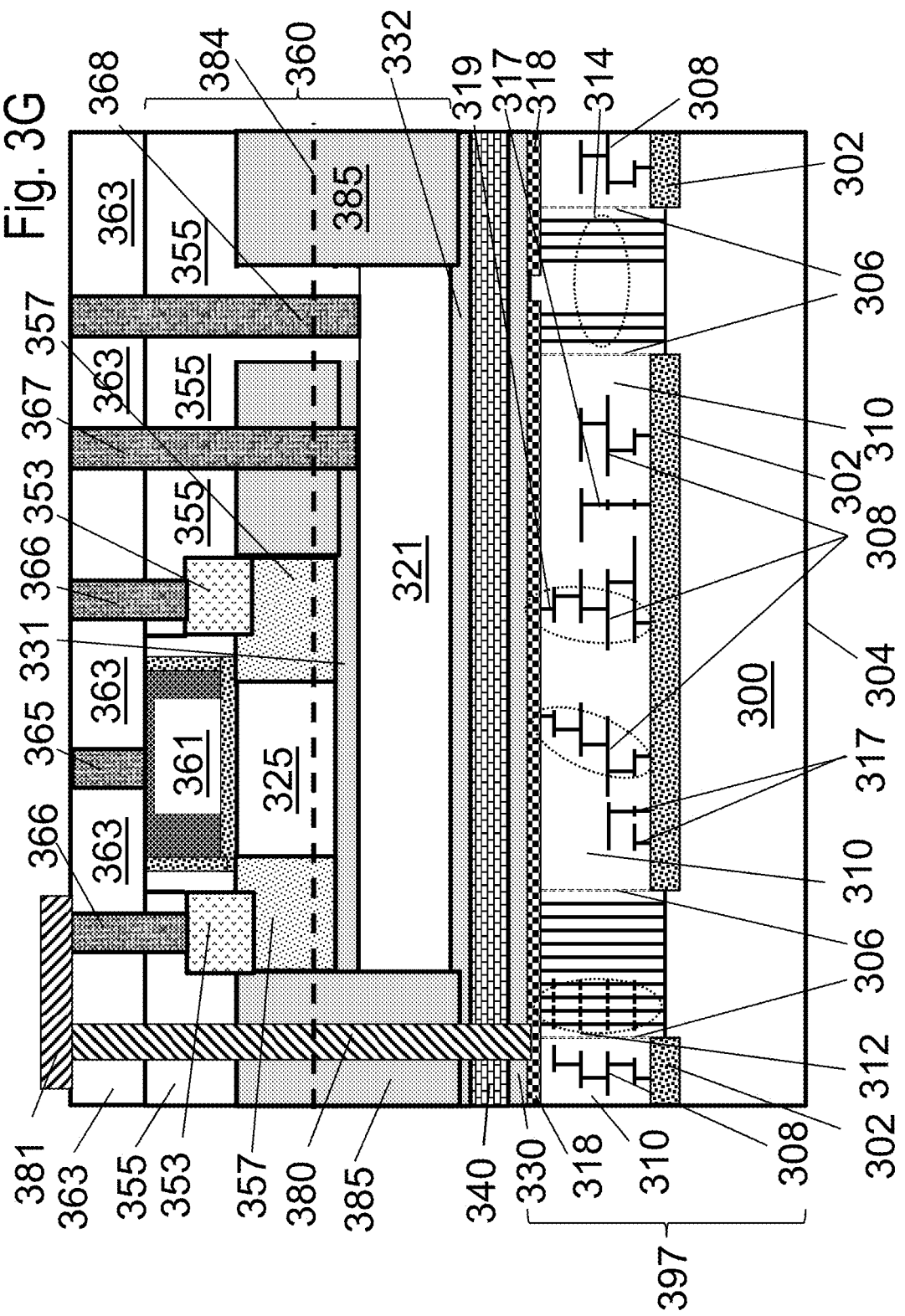

As illustrated in FIG. 3G, thru layer vias (TLVs) 380 may be formed by etching thick oxide 363, first ILD 355, transistor and back channel isolation regions 385, upper isolation layer 332, TIL 340, lower isolation layer 330, and filling with an electrically and thermally conducting material (such as tungsten or cooper) or an electrically non-conducting but thermally conducting material (such as described elsewhere within). Second device layer metal interconnect 381 may be formed by conventional processing. TLVs 380 may be constructed of thermally conductive but not electrically conductive materials, for example, DLC (Diamond Like Carbon), and may connect the FD-MOSFET transistor device and other devices on the top (second) crystalline layer thermally to shield/heat sink layer 318. TLVs 380 may be constructed out of electrically and thermally conductive materials, such as Tungsten, Copper, or aluminum, and may provide a thermal and electrical connection path from the FD-MOSFET transistor device and other devices on the top (second) crystalline layer to shield/heat sink layer 318, which may be a ground or Vdd plane in the design/layout. TLVs 380 may be also constructed in the device scribelanes (pre-designed in base layers or potential dicelines) to provide thermal conduction to the heat sink, and may be sawed/diced off when the wafer is diced for packaging, not shown). Shield/heat sink layer 18 may be configured to act (or adapted to act) as an emf (electro-motive force) shield to prevent direct layer to layer cross-talk between transistors in the donor wafer layer and transistors in the acceptor wafer. In addition to static ground or Vdd biasing, shield/heat sink layer 318 may be actively biased with an anti-interference signal from circuitry residing on, for example, a layer of the 3D-IC or off chip. The formed FD-MOSFET transistor device may include semiconductor regions wherein the dopant concentration of neighboring regions of the transistor in the horizontal plane, such as traversed by exemplary dopant plane 384, may have regions, for example, transistor channel region 325 and S/D & LDD regions 357, that differ substantially in dopant concentration, for example, a 10 times greater doping concentration in S/D & LDD regions 357 than in transistor channel region 325, and/or may have a different dopant type, such as, for example p-type or n-type dopant, and/or may be doped and substantially undoped in the neighboring regions. For example, transistor channel region 325 may be very lightly doped (less than 1e15 atoms/$cm^3$) or nominally un-doped (less than 1e14 atoms/$cm^3$) and S/D & LDD regions 357 may be doped at greater than 1e15 atoms/$cm^3$ or greater than 1e16 atoms/$cm^3$. For example, transistor channel region 325 may be doped with p-type dopant and S/D & LDD regions 357 may be doped with n-type dopant.

An operationally generated heat thermal conduction path may be constructed from the devices in the upper layer, the transferred donor layer and formed transistors, to the acceptor wafer substrate and an associated heat sink. The thermal conduction path from the FD-MOSFET transistor device and other devices on the top (second) crystalline layer, for example, raised S/D regions 353, to the acceptor wafer heat sink (not shown, but may be placed on the backside of substrate 300, may include source & drain contacts 366, second device layer metal interconnect 381, TLV 380, a portion of heat sink/shield 318, 308, 312, 314, and acceptor substrate 300. The elements of the thermal conduction path may include materials that have a thermal conductivity greater than 10 W/m-K, for example, copper (about 400 W/m-K), aluminum (about 237 W/m-K), and Tungsten (about 173 W/m-K), and may include material with thermal conductivity lower than 10 W/m-K but have a high heat transfer capacity due to the wide area available for heat transfer and thickness of the structure (Fourier's Law), such as, for example, acceptor substrate 300. The elements of the thermal conduction path may include materials that are thermally conductive but may not be substantially electrically conductive, for example, Plasma Enhanced Chemical Vapor Deposited Diamond Like Carbon-PECVD DLC (about 1000 W/m-K), and Chemical Vapor Deposited (CVD) graphene (about 5000 W/m-K). The acceptor wafer interconnects may be substantially surrounded by BEOL isolation 310, which may be a dielectric such as, for example, carbon doped silicon oxides. The heat removal apparatus, which may include acceptor wafer heat sink (not shown), may include an external surface from which heat transfer may take place by methods such as air cooling, liquid cooling, or attachment to another heat sink or heat spreader structure.

Furthermore, some or all of the layers utilized as shield/heat sink layer 318, which may include shapes of material such as the strips or fingers as illustrated in at least FIG. 33B and related specification of U.S. Pat. No. 8,450,804, may be driven by a portion of the second layer transistors and circuits (within the transferred donor wafer layer or layers) or the acceptor wafer transistors and circuits, to provide a programmable back-bias to at least a portion of the second layer transistors. The programmable back bias may utilize a circuit to do so, for example, such as shown in FIG. 17B of U.S. Pat. No. 8,273,610, the contents incorporated herein by reference; wherein the 'Primary' layer may be the second layer of transistors for which the back-bias is being provided, the 'Foundation' layer could be either the second layer transistors (donor) or first layer transistors (acceptor), and the routing metal lines connections 1723 and 1724 may include portions of the shield/heat sink layer 318 layer or layers. Moreover, some or all of the layers utilized as shield/heat sink layer 318, which may include strips or fingers as illustrated in FIG. 33B and related specification of U.S. Pat. No. 8,450,804, may be driven by a portion of the second layer transistors and circuits (within the transferred donor wafer layer or layers) or the acceptor wafer transistors and circuits to provide a programmable power supply to at least a portion of the second layer transistors. The programmable power supply may utilize a circuit to do so, for example, such as shown in FIG. 17C of U.S. Pat. No. 8,273,610, the contents incorporated herein by reference; wherein the 'Primary' layer may be the second layer of transistors for which the programmable power supplies are being provided to, the 'Foundation' layer could be either the second layer transistors (donor) or first layer transistors (acceptor), and the routing metal line connections from Vout to the various second layer transistors may include portions of the shield/heat sink layer 318 layer or layers. The Vsupply on line 17C12 and the control signals on control line 17C16 may be controlled by and/or generated in the second layer transistors (for example donor wafer device structures such as the FD-MOSFETs formed as described in relation to FIG. 3) or first layer transistors (acceptor, for example acceptor wafer transistors and devices 302), or off chip circuits. Furthermore, some or all of the layers utilized as shield/heat sink layer 318, which may include strips or fingers as illustrated in FIG. 33B and related specification of U.S. Pat. No. 8,450,804 or other shapes such as those in FIG. 33B, may be utilized to distribute independent power supplies to various portions of the second layer transistors (for example donor wafer device structures such as the FD-MOSFETs formed as described in relation to FIG. 3) or first layer transistors (acceptor, for example acceptor wafer transistors and devices 302) and circuits; for example, one power supply and/or voltage may be routed to the sequential logic circuits of the second layer and a different power supply and/or voltage routed to the combinatorial logic circuits of the second layer. Moreover, the power distribution circuits/grid may be designed so that Vdd may have a different value for each stack layer. Patterning of shield/heat sink layer 318 or layers can impact their heat-shielding capacity. This impact may be mitigated, for example, by enhancing the top shield/heat sink layer 318 areal density, creating more of the secondary shield/heat sink layers 318, or attending to special CAD rules regarding their metal density, similar to CAD rules that are required to accommodate Chemical-Mechanical Planarization (CMP). These constraints would be integrated into a design and layout EDA tool. Moreover, the second layer of circuits and transistors, for example, donor wafer device structures such as the FD-MOSFETs formed as described in relation to FIG. 3, may include I/O logic devices, such as SerDes (Serialiser/Deserialiser), and conductive bond pads (not shown). The output or input conductive pads of the I/O circuits may be coupled, for example by bonded wires, to external devices. The output or input conductive pads may also act as a contact port for the 3D device output to connect to external devices. The emf generated by the I/O circuits could be shielded from the other layers in the stack by use of, for example, the shield/heat sink layer 318. Placement of the I/O circuits on the same stack layer as the conductive bond pad may enable close coupling of the desired I/O energy and lower signal loss. Furthermore, the second layer of circuits and transistors, for example donor wafer device structures such as the FD-MOSFETs formed as described in relation to FIG. 3, may include RF (Radio Frequency) circuits and/or at least one antenna. For example, the second layer of circuits and transistors may include RF circuits to enable an off-chip communication capability to external devices, for example, a wireless communication circuit or circuits such as a Bluetooth protocol or capacitive coupling. The emf generated by the RF circuits could be shielded from the other layers in the stack by use of, for example, the shield/heat sink layer 318.

TLVs 380 may be formed through the transferred layers. As the transferred layers may be thin, on the order of about 1 um or less in thickness, the TLVs may be easily manufactured as a typical metal to metal via may be, and said TLV may have state of the art diameters such as nanometers or tens to a few hundreds of nanometers, such as, for example about 250 nm or about 100 nm or about 50 nm. The thinner the transferred layers, the smaller the TLV diameter obtainable, which may result from maintaining manufacturable via aspect ratios. The thickness of the layer or layers transferred according to some embodiments of the invention may be designed as such to match and enable the most suitable obtainable lithographic resolution (and enable the use of conventional state of the art lithographic tools), such as, for example, less than about 10 nm, 14 nm, 22 nm or 28 nm linewidth resolution and alignment capability, such as, for example, less than about 5 nm, 10 nm, 20 nm, or 40 nm alignment accuracy/precision/error, of the manufacturing process employed to create the thru layer vias or any other structures on the transferred layer or layers.

Formation of CMOS in one transferred layer and the orthogonal connect strip methodology may be found as illustrated in at least FIGS. 30-33, 73-80, and 94 and related specification sections of U.S. Pat. No. 8,273,610, and may be applied to at least the FIG. 3 formation techniques herein. Transferred layer or layers may have regions of STI or other transistor elements within it or on it when transferred, but would then use alignment and connection schemes for layer transfer of patterned layers as described in incorporated patent references.

Persons of ordinary skill in the art will appreciate that the illustrations in FIGS. 3A through 3H are exemplary only and are not drawn to scale. Such skilled persons will further appreciate that many variations are possible such as, for example, a p-channel FD-MOSFET may be formed with changing the types of dopings appropriately. Moreover, the SOI donor wafer substrate 301 may be n type or un-doped. Furthermore, transistor and back channel isolation regions 385 and transistor isolation region 387 may be formed by a hard mask defined process flow, wherein a hard mask stack, such as, for example, silicon oxide and silicon nitride layers, or silicon oxide and amorphous carbon layers, may be utilized. Moreover, CMOS FD MOSFETs may be constructed with n-MOSFETs in a first mono-crystalline silicon layer and p-MOSFETs in a second mono-crystalline layer, which may include different crystalline orientations of the mono-crystalline silicon layers, such as for example, <100>, <111> or <551>, and may include different contact silicides for optimum contact resistance to p or n type source, drains, and gates. Further, dopant segregation techniques (DST) may be utilized to efficiently modulate the source and drain Schottky barrier height for both p and n type junctions formed. Furthermore, raised source and drain contact structures, such as etch and epi SiGe and SiC, may be utilized for strain and contact resistance improvements and the damage from the processes may be optically annealed. Moreover, a process could be done on bulk donor wafer rather than an SOI wafer as well to form other types of transistors without integrated body/back-channel layer/regions. Additionally, the layer transfer process may utilize a method other than ion-cut, for example, a porous layer or selectively etchable layer, detach layer method. Furthermore, a process could be done to form other types of transistors on the layer to be processed 360, for example, FinFets. Many other modifications within the scope of the invention will suggest themselves to such skilled persons after reading this specification. Thus the invention is to be limited only by the appended claims.

A donor wafer that may include a pre-made TIL and other layers, for example, the structure as illustrated in FIG. 3B, may be manufactured for/by and supplied by a wafer vendor such as MEMC, SEH, Soitec, etc.

A donor wafer that may include a pre-made TIL and other layers, for example, the structure as illustrated in FIG. 3B, may be layer transferred utilized the perforated carrier wafer methods as described in at least FIGS. 184, 185, 186, and 187 and related specification sections of U.S. Pat. No. 8,273,610. A debond/release etchant protect layer may be include in the transfer layer stack to protect the TIL 340 and other layers from the debond/release etchant utilized in the perforated carrier wafer methodology.

A TIL may also be formed directly on the acceptor wafer prior to a layer transfer of the material to form the next layer of devices and circuits. Structures and devices similar to those described and illustrated with respect to FIGS. 1 and 3 may be formed, but the TIL formation may be limited to temperatures less than about 400° C. due to the presence of copper or aluminum metallization and low k IMDs on the layer or layers below the layer being processed. An exemplary process flow is described with respect to FIGS. 4A-4E. FIGS. 4A-E illustrates an exemplary n-channel FD-MOSFET with integrated TPS and TIL (TES may be utilized as necessary for substrate heat removal efficiency) which may be constructed in a 3D stacked layer using procedures outlined herein and in U.S. Pat. Nos. 8,273,610, 8,557,632, 8,687,399, 8,642,416, 8,581, 349 and 8,450,804, and US patent publication 2012/0091587. The contents of the foregoing applications are incorporated herein by reference.

As illustrated in FIG. 4A, SOI donor wafer substrate 401 may include back channel layer 405 above Buried Oxide BOX layer 403. Back channel layer 405 may be doped by ion implantation and thermal anneal, may include a crystalline material, for example, mono-crystalline (single crystal) silicon and may be heavily doped (greater than 1e16 atoms/cm$^3$), lightly doped (less than 1e16 atoms/cm$^3$) or nominally un-doped (less than 1e14 atoms/cm$^3$). SOI donor wafer substrate 401 may include a crystalline material, for example, mono-crystalline (single crystal) silicon and at least the upper layer near BOX layer 403 may be very lightly doped (less than 1e15 atoms/cm$^3$) or nominally un-doped (less than 1e14 atoms/cm$^3$). Back channel layer 405 may have additional ion implantation and anneal processing to provide a different dopant level than SOI donor wafer substrate 401 and may have graded or various layers of doping concentration. SOI donor wafer substrate 401 may have additional ion implantation and anneal processing to provide a different dopant level than back channel layer 405 and may have graded or various layers of doping concentration. The donor wafer layer stack may alternatively be formed by epitaxially deposited doped or undoped silicon layers, or by a combination of epitaxy and implantation, or by layer transfer Annealing of implants and doping may include, for example, conductive/inductive thermal, optical annealing techniques or types of Rapid Thermal Anneal (RTA or spike). The preferred at least top of SOI donor wafer substrate 401 doping will be undoped to eventually create an FD-MOSFET transistor with an updoped conduction channel. SOI donor wafer may be constructed by layer transfer techniques described herein or elsewhere as known in the art, or by laser annealed SIMOX at a post donor layer transfer to acceptor wafer step. BOX layer 403 may be thin enough to provide for effective DC or RF back and/or device/transistor body bias, for example, about 25 nm, or about 20 nm, or about 10 nm, or about 45 nm thick.

As illustrated in FIG. 4B, the top surface of the donor wafer stack that may include SOI donor wafer substrate 401, may be prepared for wafer bonding with a deposition of an oxide on or by thermal/RTO oxidation of back channel layer 405 to form bonding oxide layer 471. Bonding oxide layer 471 may include, or may have below it, a layer (not shown) that may serve as a heat shield and/or conductive back plane, for example, a layer of tungsten (similar to the description in FIGS. 39, 40, 41, 42, 43 of U.S. Pat. No. 8,674,470 and U.S. patent application Ser. No. 13/803,437). The thin layer of refractory metal with a high melting point may be formed on top of the isolation layer and then patterned after layer transfer, thus forming metalized back-bias regions for the second layer of transistors, the back-bias region will not be harmed by the thermal cycles of the processing on the layer being processed.

A layer transfer demarcation plane (shown as dashed line) 499 may be formed by hydrogen implantation or other methods as described in the incorporated references, and may reside within the SOI donor wafer substrate 401.

Figure 4C:
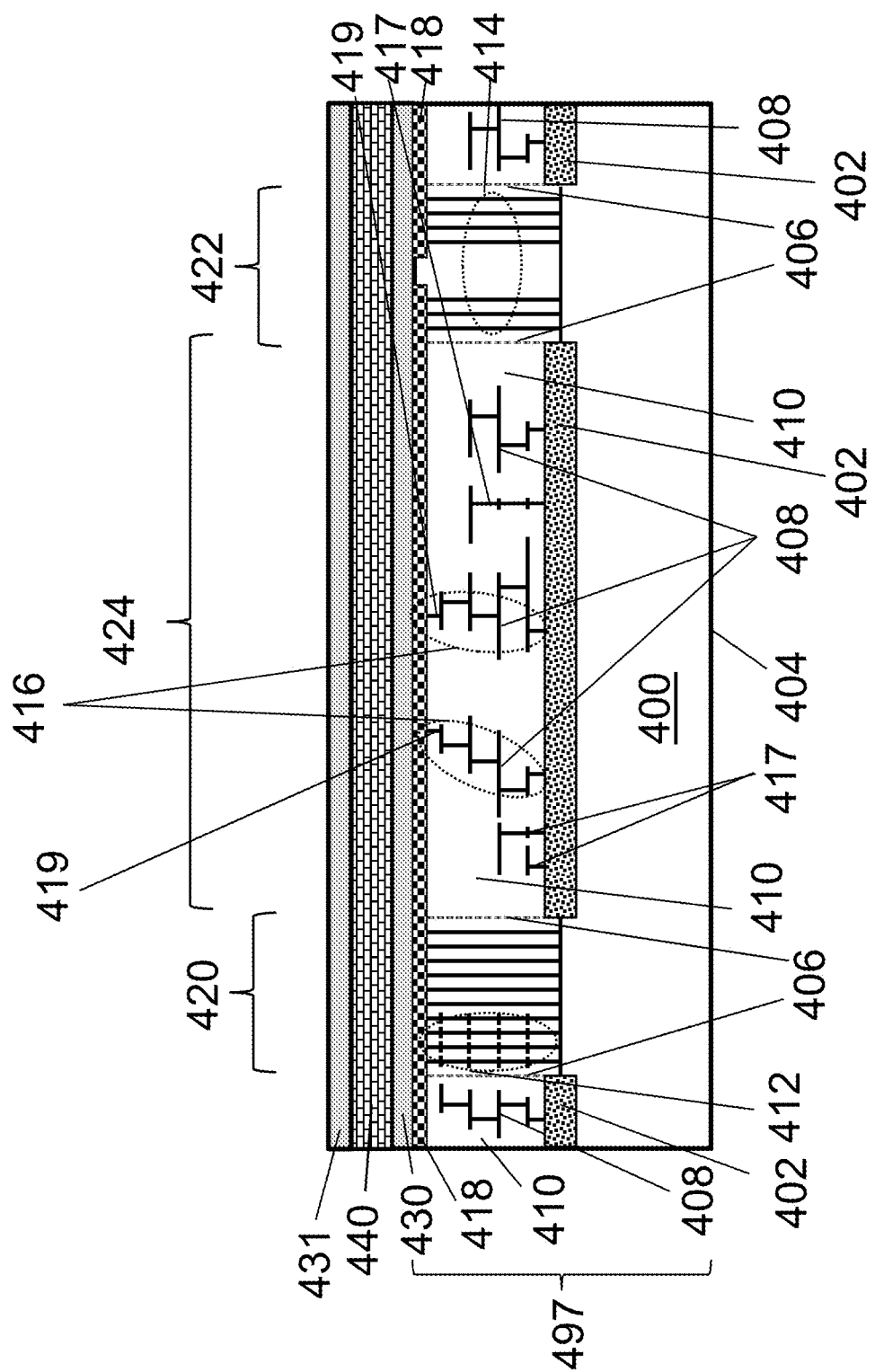

As illustrated in FIG. 4C, acceptor substrate 497 may be prepared and a TIL 440 formed including a capping/bonding layer 431. Acceptor substrate 497 may be prepared in a similar manner as the structures and devices described in FIGS. 1A-1E herein, up to and including lower isolation layer 130 (lower isolation layer 130 in FIG. 4C), and using known in the art techniques. Acceptor wafer 497, as described in the incorporated references and herein, may include, for example, transistors, circuitry, and metal, such as, for example, aluminum or copper, interconnect wiring, a metal shield/heat sink layer or layers, and thru layer via metal interconnect strips or pads. Acceptor wafer 497 may be substantially comprised of a crystalline material, for example mono-crystalline silicon or germanium, or may be an engineered substrate/wafer such as, for example, an SOI (Silicon on Insulator) wafer or GeOI (Germanium on Insulator) substrate. Acceptor wafer 497 may include transistors such as, for example, MOSFETS, FD-MOSFETS, FinFets, FD-RCATs, BJTs, HEMTs, and/or HBTs.

TPS protective structures to protect the desired regions of substrate devices may be constructed. These protective structures may be constructed using conventional and known in the art processing techniques. A substrate 400, for example, a monocrystalline silicon wafer which may be thermally enhanced (a Thermally Enhanced Substrate—TES— as described elsewhere herein), of which a portion is shown in FIG. 4, may have substrate device regions 402 including devices, such as, for example, transistors, capacitors, and resistors. These substrate device regions 402 could be formed as eventual product dice with surrounding scribelanes and die edge seals. The devices within the regions of substrate devices could be wholly or partially within the substrate 400 material. The scribelanes may also be called dicing streets or scribelines.

The substrate 400 may also have a backside surface 404 that may be utilized to conduct processing heat (the heat source may be the layer being processed 460 during device formation steps or portions of the equipment performing the processing such as IR lamps) from the substrate 400 to a processing equipment cooling chuck or other thermal conduction/heat removal device, generally within the processing equipment.

The substrate device regions 402 may have corresponding regions of substrate metallization 408 and BEOL isolation 410 interconnect layers, which may include copper or aluminum metallization materials and low-k dielectric inter-metal dielectrics (IMD) respectively. These may be constructed with known in the art BEOL processing.

As part of the construction of or separately from the formation of regions of substrate metallization 408 and BEOL isolation 410 interconnect layers, one or more shield layer or regions 418 of metallization and isolation may be constructed. Details are in referenced applications. For example, the shield layer or regions 418 metallization may include materials such as tungsten, copper, aluminum, grapheme, diamond, carbon, materials with a high thermal conductivity (>10 W/m-K) and an appropriate melting/softening point. The shield layer or regions 418 may be constructed as a continuous slab across substantially the entire extant of the substrate area, or may be formed as regions.

The shield layer or regions 418 may have terminations within the device die scribelanes. The shield layer or regions 418 may include TLV landing pads wherein signals from the second layer of devices may connect either to a lower shield layer (for example shield layer or regions 418) or to the interconnect layers or regions of substrate metallization 408 and BEOL isolation 410 interconnect or lower layer devices and circuits. The shield layer or regions 418 may be thermally but not electrically connected or may be thermally and electrically connected to the substrate 400 in a variety of ways.

The scribelanes, for example, scribelane with thermal via stacks and continuous shield 420 and/or scribelane with thermal via stacks and cut shield layer 422, may be substantially populated with thermal via stacks, which may be formed as thermal via stacks with via landing pads 412 as each metallization and via layer of the regions of substrate metallization 408 and BEOL isolation 410 interconnect layers are formed, or the thermal vias in the scribelane 414 may be formed as an etched and filled deep-via prior to the formation of the shield layer or regions 418. Forming the thermal via stack after the regions of substrate metallization 408 and BEOL isolation 410 interconnect layers are formed may provide the use of a different BEOL isolation material, material that may be more thermally isolative and/or thermally stable, for the thermal via stacks than for the devices. The thermal vias in the scribelane 414 may also be formed as one or a few to substantially fill (with appropriate stress relief structures) the scribelane with metal (thermally conductive) material (as much as practical given CMP dishing design rules) that may be part of the shield layer formation, or may be formed in a separate metal deposition and planarization step and may provide use of a more thermally conductive material than copper or aluminum to form the thermal vias in the scribelane 414, for example, carbon nanotubes, Plasma Enhanced Chemical Vapor Deposited Diamond Like Carbon-PECVD DLC (about 1000 W/m-K), and Chemical Vapor Deposited (CVD) graphene (about 5000 W/m-K).

As dictated by design choices, the thermal vias (such as, for example, substantially all or a portion of thermal via stacks with via landing pads 412 and/or thermal vias in the scribelane 414, and/or in-die thermal via stacks 416 and/or fill-in thermal paths 417) may truncate in a dielectrically isolated or reverse biased junction electrically isolated connection to the substrate, or the thermal vias may truncate as a conventional forward biased junction or no junction substrate contact that may be thermally and electrical connected to the substrate. Processing, structure, and operational details are in referenced applications.

In-die thermal via stacks 416 (may also be called in-die thermal via paths) may also be constructed over the regions of substrate devices 402 (within die extant 424) by forming a via stack that utilizes the interconnect structures of the regions of substrate metallization 408 and BEOL isolation 410 interconnect layers, with a via connection 419 from the shield layer to a metallization layer/segment within the regions of substrate metallization 408 and BEOL isolation 410 interconnect layers. Via connection 419 may be connected at a later step to electrically couple to the second layer devices (such as a TLV), or may primarily enable (as part of a thermal path) a thermal connection from substrate 400 to shield layer or regions 418. Details of this formation have been described in referenced applications.

Additionally, as a matter of design choice, fill-in thermal paths 417 may be added to a chip die design/layout to maximize local and die average thermal conductivity. Addition of fill-in thermal paths 417 may be controlled by an EDA design and placement algorithm. The fill-in thermal paths 417 may be formed anywhere on the die and from any level of the regions of substrate metallization 408 and BEOL isolation 410 interconnect layers to the substrate 400, for example, metal 4 to substrate, metal 3 to substrate, and so on). Fill-in thermal paths 417 may be added to a power or ground line as extra thermal connections to the substrate 400, which may be electrically conductive or non-conductive due to design constraints. Fill-in thermal paths 417 may be additional connections beyond what a conventional design or EDA tool may provide/construct. Fill-in thermal paths 417 may be added to/formed in so called 'white space' within the device die, where there may be a path vertically and horizontally thru the regions of substrate metallization 408 and BEOL isolation 410 interconnect layers to the substrate 400. Moreover, fill-in thermal paths 417 may be formed from the CMP fill structures of one or more of the regions of substrate metallization 408 and BEOL isolation 410 interconnect layers.

As a matter of design choice, die seal 406 (or die seal-ring) may be utilized as a thermal connection from either interconnect metal layers of the ring itself or the shield layer or regions 418 to the substrate 400.

Lower isolation layer 430 may be deposited on top of shield layer or regions 418 to protect and electrically and partially thermally isolate above and below and may include the bonding oxides for an ion-cut layer transfer process (for the case wherein TIL 440 is formed on a donor wafer or substrate). Lower isolation layer 430 may include designed-in voids (not shown), for example, by etch removal of portions of lower isolation layer 430, thus forming regions of vacuum and/or gas and regions of the remaining material (for example, silicon oxide) of lower isolation layer 430. The voids may be formed such that they extend fully or partially thru the entire thickness lower isolation layer 430. The presence of the voids may reduce the average thermal conductivity of lower isolation layer 430. The voids may include greater than about 5%, greater than about 10%, greater than about 20%, or greater than about 50% of the area and/or volume of lower isolation layer 430, thus affecting the total average lower isolation layer 430 thermal conductivity by greater than about 5%, or greater than about 50%. Lower isolation layer 430 may be etched (partially or fully) to form a portion of strengthening regions 134 structures (not shown). Alternatively, an additional isolation layer (not shown) may be deposited on top of lower isolation layer 430 and etch partially or substantially fully to form the strengthening regions 134 as illustrated in FIG. 1C or a portion of the strengthening regions 134 as illustrated in FIG. 1D, and/or the strengthening regions 134 as illustrated in FIG. 1E. For the sake of clarity, FIGS. 4A-D will not show the presence of any strengthening regions within or for TIL 440.

Continuing with the FIG. 4C illustration, TIL 440 may be formed on top of lower isolation layer 430. TIL 440 may be formed of materials and structures to thermally isolate the layers below it (for example, substrate metallization 408 and BEOL isolation 410 interconnect layers, substrate device regions 402, shield layer or regions 418) from a portion of the processing heat of the layers above (such as layer being processed 460). TIL 440 may include materials and construction that provide about a 10 times, or 20 times, or 50 times, or 100 times lower thermal conductivity than layer being processed 460, and/or upper isolation layer 432, and/or lower isolation layer 430, and/or regions of substrate metallization 408 and BEOL isolation 410, and/or substrate 400. TIL 440 may have an effective thermal conductivity of less than about 20 mW/m-K, less than about 50 mW/m-K, less than about 100 mW/m-K, less than about 200 mW/m-K, less than about 500 mW/m-K. TIL 440 may have a thickness of less than about 10 nm, less than about 20 nm, less than about 50 nm, less than about 100 nm, less than about 200 nm, less than about 500 nm, less than about 1 um, less than about 2 um, less than about 10 um, or less than about 20 um. The design choices of TIL 440 material thermal conductivity and thickness may be guided by desired effective size and/or density of TLVs achievable, maximum temperature of layer being processed 460 during device construction and processing, time at temperature and/or temperature profile of layer being processed 460 during device construction and processing, number of stack layers, mechanical strength, the cooling capacity of the cooled chuck and/or TES (microchannel for example), and so on. For example, a very low thermal conductivity material of about 100 mW/m-K (at the processing temperature of interest) may enable a minimum TIL 440 thickness of less than about 800 nm for a maximum temperature of layer being processed 460 of about 1000° C. or a minimum TIL 440 thickness of less than about 550 nm for a maximum temperature of layer being processed 460 of about 800° C. given no equipment cooling capacity constraints. TIL 440 may have a yield strength of less than about 2 GPa, less than about 3 GPa, less than about 4 GPa, less than about 7 GPa.

TIL 440 formation may include forming a thin film silica aerogel, for example, such as described by Bauer, but may only be pyrolized to about 400° C., and may be opacified to absorb IR, for example, such as described by JWang. The aerogel may be strengthened as by, for example, a CVD process as described by Obrey. TIL 440 may include multiple aerogel layers processed. For example, an IR absorbing aerogel on the acceptor substrate 497 may be formed second and a lower thermal stable aerogel may be formed first and below it, thereby forming a TIL 440.

TIL 440 formation may include forming a thin film alumina aerogel, for example, such as described by Poco. Opacification and CVD hardening may also be utilized for alumina aerogels. TIL 440 formation may include forming a thin film phosphate aerogel, for example, such as described by Lindquist.

Many of the aerogels may be formed thicker than the desired end thickness, and then thinned by, for example, CMP processing or etching, to the desired end thickness. For example, a 5 um or 10 um aerogel layer may be formed, but may be CMP'd back to 1 um. Aerogel formation may include a step of applying and adhesion promoter, for example, HMDS, to the wafer before applying the sol-gel aerogel, for example, by spin-on techniques. Then the extraction step, for example, $CO_2$ SCE, and/or a pyrolysis step may be performed.

The physical and/or electrical characteristics of many of the aerogels may be improved by various processes to make/increase its hydrophobic character, strengthen its structure, chemical inertness, fracture resistance; such as, for example, thermal silane treatments, plasma cure and plasma treatments, CVD Silane and other substances treatment. These treatments may be performed after sol-gel and/or after extraction steps (such as an SCE—Super Critical Extraction); and they may be used to restore the aerogel film's integrity after a process step damages the film.

TIL 440 formation may include forming nanoscale layered oxides, such as, for example, as described by Alvarez-Quintana.

TIL 440 formation may include forming a layer or layers of disordered nanostructured materials, such as, for example, as described by Chiritescu.

TIL 440 formation may include forming a layer or layers of low k porous dielectric materials as described by Ahner and Hu.

TIL 440 formation may include forming a top sub-layer of a material whose thermal conductivity decreases with temperature, for example, germanium, and a lower sub-layer with a material whose thermal conductivity increases with temperature, for example, silica aerogels. The silica aerogel may be formed as described herein and annealed with the pre-layer-transfer anneal as described herein. A seal layer, such as, for example, silicon oxide, may be deposited by CVD or other processes, and then a layer of negative operating thermal conductivity may be formed on top of the seal layer, for example, layer transferred crystalline germanium.

A pre-layer-transfer anneal may be performed as part of the TIL 440 formation process or after the formation of TIL 440, and may include a thermal anneal equal to or greater than the maximum temperature that the TIL 440 would see during subsequent processing, for example, during the 3D IC stack processing, including layer transfer/bonding, transistor/device formation, activation anneals, and so on as long as the TIL formation temperature does not exceed the damage temperature of underlying structures, which may be less than about 400° C. or less than about 350° C. for copper and low-k BEOL materials and structures. If higher temperature metals and dielectrics are utilized in the construction of the acceptor substrate 497, for example, tungsten and silicon dioxide, greater temperatures to form the TIL 440 may be available. The ramp up and cool down rates may be carefully controlled depending on the type and condition of material in TIL 440 to minimize cracking, outgassing effects, and other stress effects on the stack. The time of the pre-layer-transfer anneal at maximum temperature (the process exposure maximum) may be less than about 30 minutes, or less than about 1 hour, or less than about 2 hours.

Continuing as illustrated in FIG. 4C, the top surface of the donor wafer stack that may include acceptor substrate 497, may be prepared for oxide wafer bonding with a deposition of a low temperature oxide to form capping/bonding layer 431. The gaseous component of the TIL 440 thermal conductivity may be minimized by placing the aerogel or other pore or void-based structures under a vacuum before sealing it with a capping/bonding layer 431, which may be capping/bonding layer 431 or another sealing layer, such as oxide, as part of the TIL 440 formation and structure.

The SOI donor wafer substrate 401 stack, such as surface 482 (shown in FIG. 4B), and acceptor wafer 497 (first shown in FIG. 4C) may be prepared for wafer bonding as previously described in the incorporated references and low temperature (less than about 400° C.) bonded.

Figure 4D:
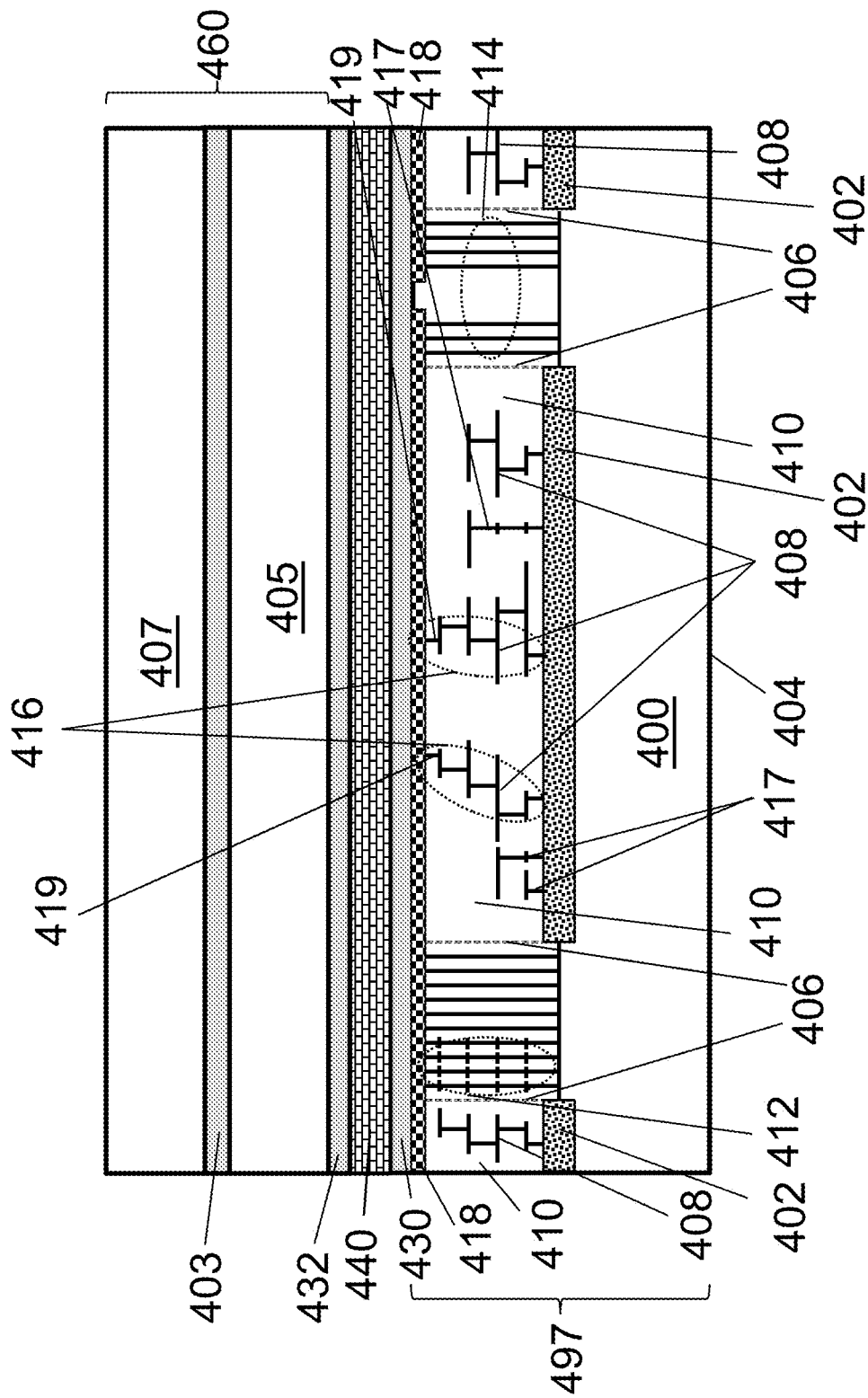

As illustrated in FIG. 4D, bonding oxide layer 471, back channel layer 405, BOX layer 403 and remaining channel layer 407 may be layer transferred to acceptor wafer 497. Donor wafer bonding oxide layer 471 and acceptor wafer 497 capping/bonding layer 431 may be oxide to oxide bonded, thus forming upper isolation layer 432. The portion of the SOI donor wafer substrate 401 that may be above (when the layer stack is flipped over and bonded to the acceptor wafer 497) the layer transfer demarcation plane 499 may be removed by cleaving or other low temperature processes as described in the incorporated references, such as, for example, ion-cut with mechanical or thermal cleave or other layer transfer methods, thus forming remaining channel layer 407. An RTA (Rapid Thermal Anneal) may be utilized to induce cleaving as the TIL 440 is in place and the cold chuck may utilized to carry away the heat (as described further herein).

Many conventional semiconductor processing steps may now be utilized to form transistors and devices on the layer being processed 460 without harming the underlying structures of acceptor wafer 497, for example, a deposition or anneal may be performed at 800° C. on layer being processed 460. Heat removal from the substrate, for example, such as via a cooled chuck, is described elsewhere herein.

Figure 4E:
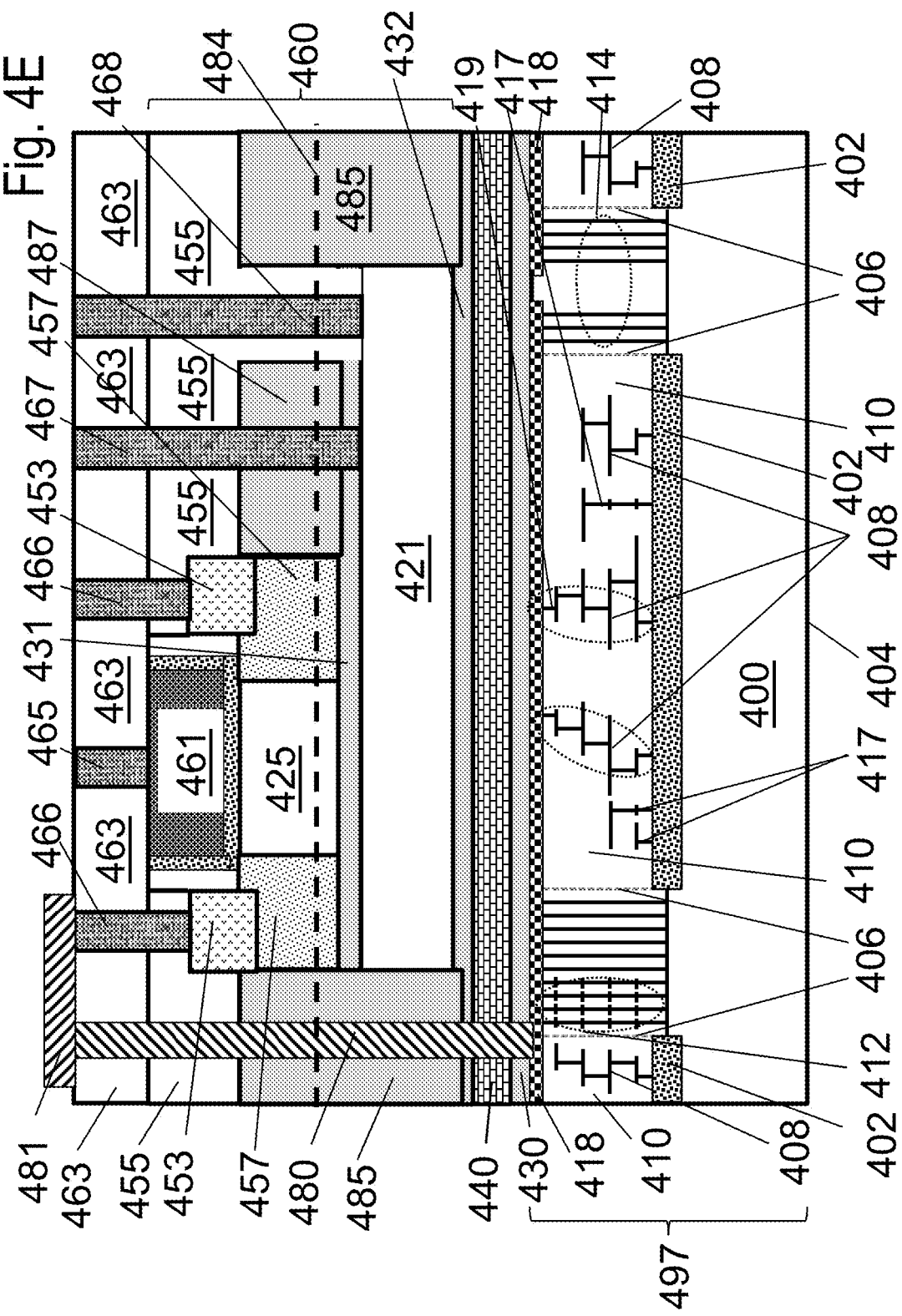

Processing similar to the processing and transistor/device formation such as, for example, illustrated in FIGS. 3D to 3G and described in related specification sections herein, or many other semiconductor processes and steps, may be performed. For example, as illustrated in FIG. 4E, an exemplary FD-MOSFET structure may be formed. The structures, numerals and labels may be common between FIGS. 3A-3G and FIGS. 4A-4E with just the first number adjusted to match the present figure.

Formation of CMOS in one transferred layer and the orthogonal connect strip methodology may be found as illustrated in at least FIGS. 30-33, 73-80, and 94 and related specification sections of U.S. Pat. No. 8,273,610, and may be applied to at least the FIG. 4 formation techniques herein. Transferred layer or layers may have regions of STI or other transistor elements within it or on it when transferred, but would then use alignment and connection schemes for layer transfer of patterned layers as described in incorporated patent references.

Persons of ordinary skill in the art will appreciate that the illustrations in FIGS. 4A through 4E are exemplary only and are not drawn to scale. Such skilled persons will further appreciate that many variations are possible such as, for example, a p-channel FD-MOSFET may be formed with changing the types of dopings appropriately. Moreover, the SOI donor wafer substrate 401 may be n type or un-doped. Furthermore, transistor and back channel isolation regions 485 and transistor isolation region 487 may be formed by a hard mask defined process flow, wherein a hard mask stack, such as, for example, silicon oxide and silicon nitride layers, or silicon oxide and amorphous carbon layers, may be utilized. Moreover, CMOS FD MOSFETs may be constructed with n-MOSFETs in a first mono-crystalline silicon layer and p-MOSFETs in a second mono-crystalline layer, which may include different crystalline orientations of the mono-crystalline silicon layers, such as for example, <100>, <111> or <551>, and may include different contact silicides for optimum contact resistance to p or n type source, drains, and gates. Further, dopant segregation techniques (DST) may be utilized to efficiently modulate the source and drain Schottky barrier height for both p and n type junctions formed. Furthermore, raised source and drain contact structures, such as etch and epi SiGe and SiC, may be utilized for strain and contact resistance improvements and the damage from the processes may be optically annealed. Moreover, a process could be done on bulk donor wafer rather than an SOI wafer as well to form other types of transistors without integrated body/back-channel layer/regions. Additionally, the layer transfer process may utilize a method other than ion-cut, for example, a porous layer or selectively etchable layer, detach layer method. Furthermore, a process could be done to form other types of transistors on the layer to be processed 460, for example, FinFets. Many other modifications within the scope of the invention will suggest themselves to such skilled persons after reading this specification. Thus the invention is to be limited only by the appended claims.

Figure 5:
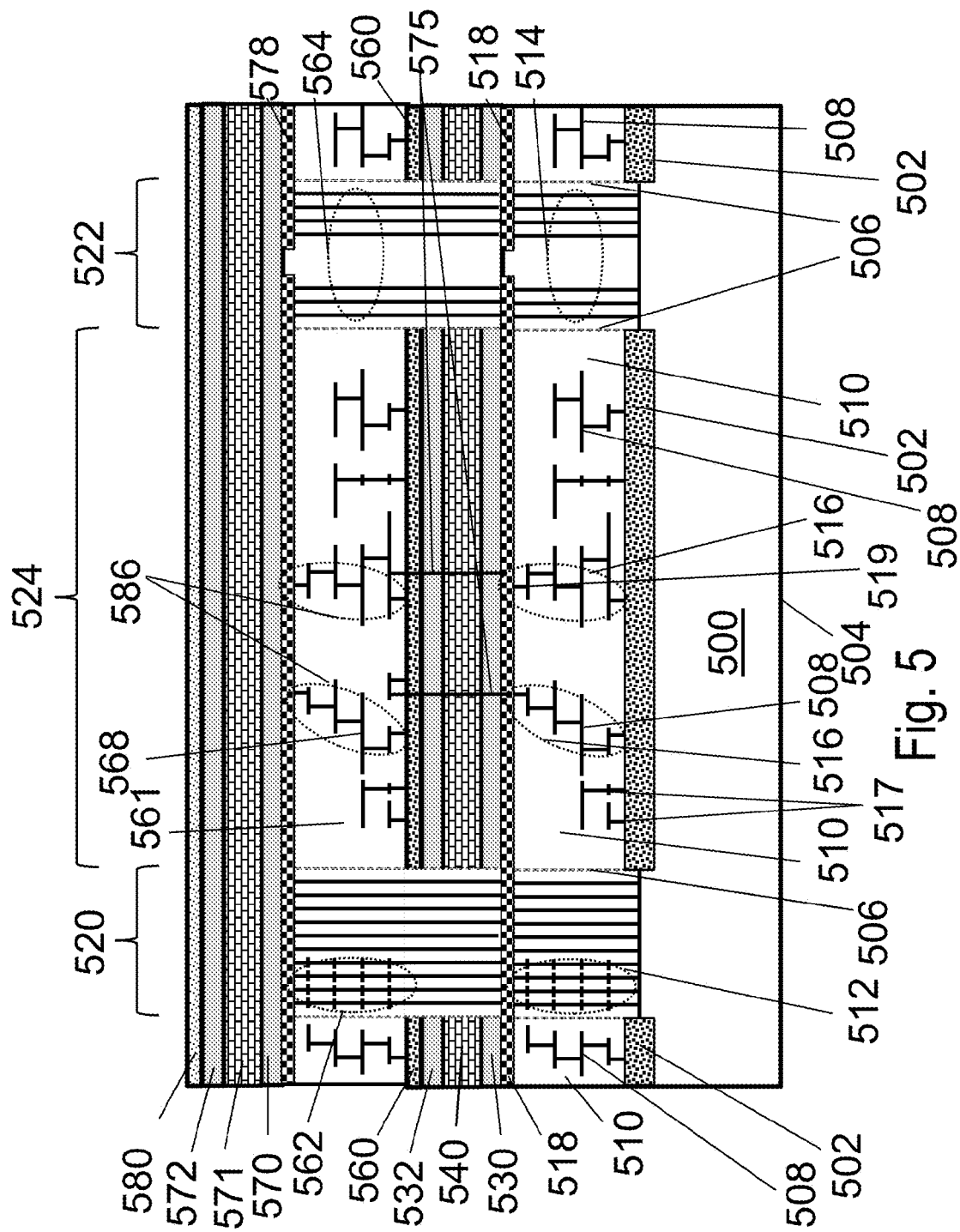
FIG. 5 is an exemplary drawing illustration of a multi-strata device with protective structures to protect the desired regions of strata and substrate devices from high processing and operating temperatures.

As illustrated in FIG. 5, TPS structures to protect the desired regions of substrate devices and protect a second layer of devices from the thermal effects of processing a third layer in a 3D device structure may be constructed. With reference to the discussions herein, the structures of FIG. 1, 2, 3, and/or 4 may be constructed as described above, and the processing of the second layer of devices has been completed, with the substrate devices being thermally protected with a TIL and TPS, such as described above. As illustrated in FIG. 5, the built up device at this point may include substrate 500, substrate device regions 502, backside surface 504, die seal 506, substrate metallization 508, BEOL isolation 510, one or more shield layer or regions 518, scribelane with thermal via stacks and continuous shield 520 and/or scribelane with thermal via stacks and cut shield layer 522, thermal via stacks with via landing pads 512, thermal vias in the scribelane 514, in-die thermal via stacks 516, fill-in thermal paths 517, via connection 519, die extant 524, lower isolation layer 530, TIL 540, upper isolation layer 532. Strengthening regions may be included (not shown). The previous layer being processed (for example 160) may now be the $2^{nd}$ layer of device regions 560. The $2^{nd}$ layer of devices may have regions of substrate devices, such as, for example, transistors, capacitors, and resistors. These 2nd layer of device regions 560 (over the substrate devices such as 502) could be formed as eventual product dice with surrounding scribelanes (for example, scribelane with thermal via stacks and continuous shield 520 and/or scribelane with thermal via stacks and cut shield layer 522 and die edge seals) and the devices of the 2nd layer of device regions 560 could be wholly or partially within the 2nd layer of device regions material. TIL 540 may have utilized the embodiment described herein of being formed thick, processing at high temperatures to form the 2nd layer of device regions devices 560, and then crushing/chemically treating the TIL 540 to substantially thin it, thus providing a thin TIL 540 so that the ensuing TLVs may have small diameters and there may be improved heat flow to the substrate when processing the $3^{rd}$ layer being processed 580. TLVs (thru-layer vias) 575 may be formed as described in referenced patents and may electrically and/or thermally connect the devices of $2^{nd}$ layer of device regions 560 to shield layer or regions 518 and/or substrate metallization 508. The regions of $2^{nd}$ layer devices 560 may have corresponding regions of $2^{nd}$ layer metallization and isolation interconnect layers 568, which may include copper or aluminum metallization materials and low-k dielectric inter-metal dielectrics (IMD2 561). As part of the construction of, or separately from, the formation of regions of $2^{nd}$ layer metallization and isolation interconnect layers 568, one or more shielding layers of metallization and isolation may be constructed. Details are in referenced applications and previously in this application. For example, the $2^{nd}$ layer shield layer L2 578 metallization may include materials such as tungsten, copper or aluminum, materials with a high thermal conductivity and an appropriate melting/softening point or a significant diffusion coefficient at the relevant temperature. The $2^{nd}$ layer L2 shield layer or layers 578 may be constructed as a continuous slab across substantially the entire extent of the substrate area, or may be formed as regions. The shield regions may have terminations within the device die scribelanes. The shield regions may include TLV landing pads so that signals from the 2nd layer devices may connect either to a lower shield layer and/or to the interconnect layers of the substrate and/or to lower layer devices and circuits such as the substrate devices. The $2^{nd}$ layer L2 shield layer or region 578 may be thermally but not electrically connected or may be thermally and electrically connected to the substrate shield layer or shield regions in a variety of ways. The scribelanes may be substantially populated with L2 thermal via stacks, which may be formed as L2 thermal via stacks with via landing pads 562 as each metallization and via layer of the regions of $2^{nd}$ layer L2 metallization and isolation interconnect layers 568 are formed, or the L2 thermal via stack in the scribelane 564 may be formed as an etched and filled deep-via prior to the formation of the L2 shield layer 578. As dictated by design choices, the thermal vias may truncate in either a dielectrically isolated electrically isolated connection to the substrate shield layer 518. As dictated by design choice, the L2 thermal via stacks may be designed to be aligned to the substrate thermal via stacks (such as in the leftmost scribelane in FIG. 5) or not aligned (as shown in the rightmost scribelane in FIG. 5). In-die thermal via stacks 586 or thermal via paths may also be constructed within the regions of $2^{nd}$ layer L2 devices by forming a via stack that utilizes the interconnect structures within the regions of $2^{nd}$ layer L2 metallization and isolation interconnect layers 568, with a via connection from the L2 shield layer 578 to a metallization layer/segment within the regions of $2^{nd}$ layer L2 metallization and isolation interconnect layers 568. L2 lower isolation layer 570 may be deposited on top of L2 shield layer or regions 578 to protect and electrically and partially thermally isolate above and below and may include the bonding oxides for an ion-cut layer transfer process (for the case wherein $2^{nd}$ TIL 571 is formed on a donor wafer or substrate). TIL 571 may be formed of materials and structures to thermally isolate the layers below it (for example, L2 metallization and isolation interconnect layers 568, 2nd layer of device regions devices 560, substrate metallization 508 and BEOL isolation 510 interconnect layers, substrate device regions 502, shield layer or regions 518) from a portion of the processing heat of the layers above (such as $3^{rd}$ layer being processed 580). $2^{nd}$ upper isolation layer 572 may be deposited on top of $2^{nd}$ TIL 571 to seal, protect, and electrically (and a small bit thermally) isolate, and may include the bonding oxides for an ion-cut layer transfer process (for the case wherein $2^{nd}$ TIL 571 is formed on the acceptor wafer). The 3rd layer being processed 580 may include a layer transferred thin (less than 200 nm) layer of monocrystalline silicon that may be oxide to oxide bonded to the top surface of the built-up substrate/L2 stack. The $3^{rd}$ layer being processed 580 may include materials such as, for example, monocrystalline silicon, InP, GaAs, and SiC. The $3^{rd}$ layer 580 being processed may also include a heat spreader and/or optical reflective layer or layers, for example tungsten or aluminum. The structure of FIG. 5 may protect both the substrate devices and metallization and isolation interconnection layers/regions and the devices and metallization and isolation interconnect layers and regions of the $2^{nd}$ layer L2 from the damaging heat processing of the $3^{rd}$ layer being processed 580, for example, by keeping them below about 400° C. or below about 370° C. Electrically conductive materials may be used for the shield layer or layers or regions and thus may provide, for example, a Vss and a Vdd plane and/or grid that may be connected to the 2nd layer of devices & transistors above, as well may be connected to the substrate devices and transistors below. Noise on the power grids, such as the Vss and Vdd plane power conducting lines/wires, may be mitigated by attaching/connecting decoupling capacitors onto the power conducting lines of the grids. As the number of layers of transistors/circuits/devices in the 3DIC increases, the thermal resistance from the layer being processed to the cooling device and/or substrate may increase. To minimize this effect, an increase in number/density/diameter/thermal conductivity of thermal vias (scribeline and/or in die) and more/thicker shield conductive/isolative layers and/or TIL thickness/composition may be constructed. For example, the number/density/diameter/thermal conductivity of thermal via stacks with via landing pads 512, thermal vias in the scribelane 514, in-die thermal via stacks 516, fill-in thermal paths 517, L2 thermal via stacks with via landing pads 562, $2^{nd}$ layer L2 metallization and isolation interconnect layers 568, L2 thermal via stack in the scribelane 564 may be increased in the design and formation in order to support the longer thermal path of layer being processed $3^{rd}$ layer being processed 580 to backside surface 504, than from regions of $2^{nd}$ layer devices 560 (as it was a layer being processed) to backside surface 504. The thermal conductivity of TIL 571 may also be adjusted to a lower value or thicker layer at the same value to help drop more thermal energy across it.

In a case where the thermal processing and equipment constraints require a TIL during the device thermal processing steps thicker than desired, a reason to do so may be to enable small diameter TLVs for strata to strata interconnect density, an embodiment of the invention is to provide a thick TIL during the top devices thermal processing and then thin the thick TLV to the desired thickness before the TLVs are formed. For example, a 10 um TIL thickness may be desired during the thermal processing of the top strata devices, but then a 1 um TIL would be desirable during TLV formation so that tens of nanometer scale TLV diameters can be obtained while keeping within the conventional etch and fill aspect ratios constraints.

Figure 3H:
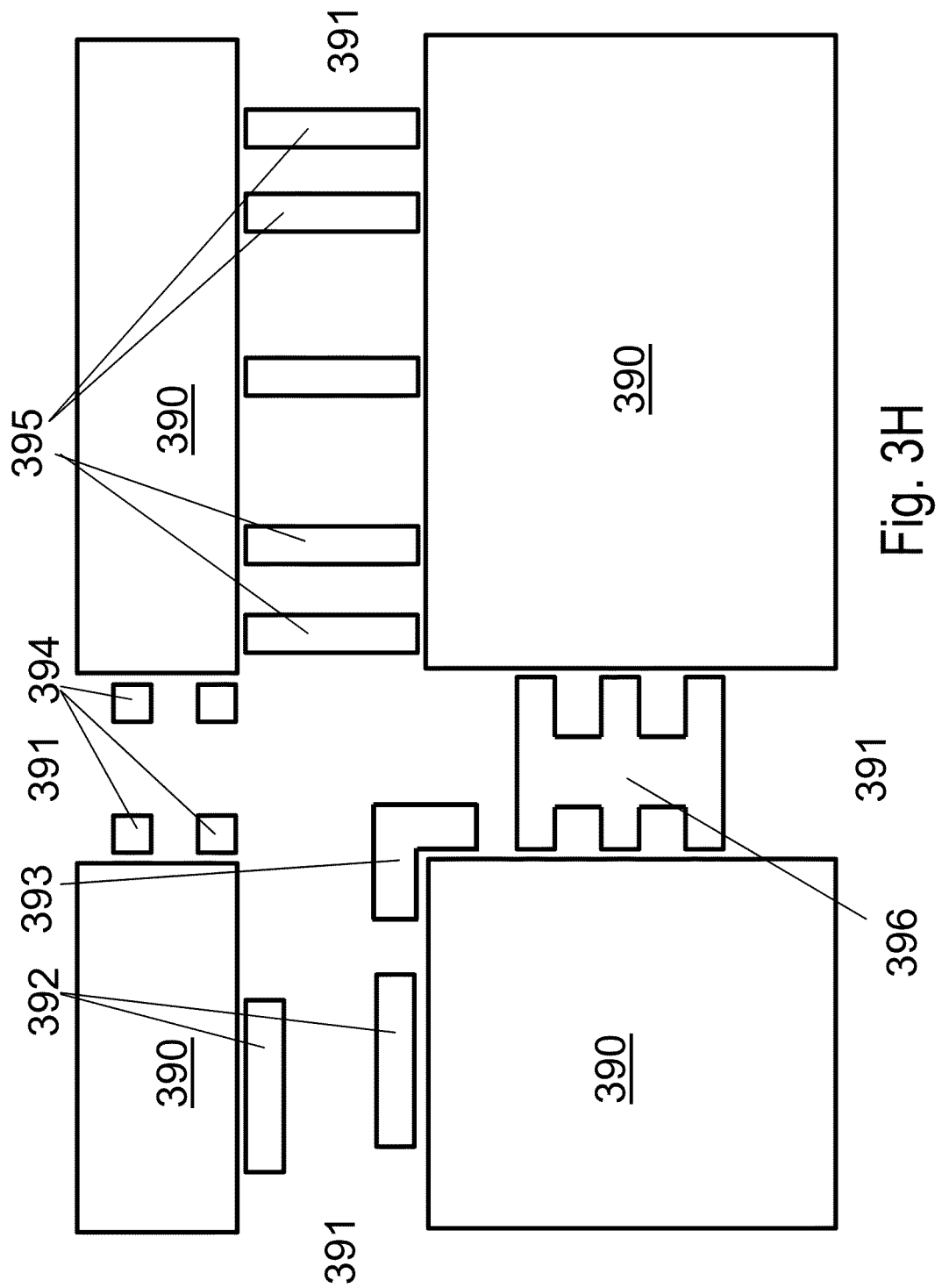
FIG. 3H is an exemplary drawing illustration of guidepost structures.

Thinning of the TIL after the desired thermal processing is completed may include a physical crushing of the TIL, for example, when the TIL is comprised of an aerogel. An aerogel of 100 mW/m-K or less thermal conductivity may have at least 95% 'air' or vacuum and the remainder as the material forming the structure, thus potentially allowing a crush ratio of at least 10 to 1. Posts may be made in the scribelanes to help guide the crushing so that lateral movement of the top layer is minimized. For example, the strengthening regions described in FIG. 1E (strengthening regions 134) may be employed as guideposts, and may include only a portion of the scribelane width and may have an underlap 135 of less than 100 nm, or less than 50 nm, or less than 10 nm, or zero as the thick TIL would remove the need for a substantial underlap. The guideposts could have a variety of shapes, for example, square or rectangular or circular columns or regions. As illustrated in FIG. 3H, device die portions 390 may have scribelanes 391 disposed between them. Guideposts may be constructed in the scribelanes 391, for example, shapes such as guideposts 392, 393, 394, 395 and 396. Depending on design and thermal choices, guideposts (not shown) may be disposed within the device die portions 390. The guideposts may comprise materials that could not be substantially chemically etched and/or physically crushed by the thinning processing, for example, silicon dioxide in the case of a carbon aerogel TIL. The guideposts may be disposed underneath the layer being processed, and then after the high temperature processing of the top layer is finished, may be revealed to the topside by a masked etch process. Gas and material escape during the crushing may include etching a portion of the scribelanes and/or within the die extant 'white spaces' to open up the sides of the TIL. The crushing may be by physical contact and force, or may be by a gas or liquid pressure application, or a combination of both. Force spreaders may be employed on top of the top layer just processed, for example, spinning and partially curing a thick layer (1-20 um) of photoresist, further patterning the resist, creating an aerogel layer with a similar or greater crush compressibility than the desired TIL to crush. An imprint style surface of the interior of the upper isolation layer may be formed aligned to the upper isolation layer and utilized to assist later crushing of the aerogel. These embodiments may also be utilized in concert with the multi-level structures described in FIG. 5 herein.

Thinning of the TIL after the desired thermal processing is completed may include a chemical process to reduce the volume of the TIL. The chemical process may include liquids (such as $H_2O_2$), gases (such as $O_2$ or $O_3$) and/or plasmas. For example, a carbon aerogel may be utilized in the TIL and may be reduced by reacting the C-aerogel with oxygen, for example, via an oxygen plasma. The plasma reduction process may also entail heating of the substrate and TIL structure, to less than 100° C., or less than 200° C., or less than 300° C., or less than 400° C. Plasma and/or chemical access to the TIL may be provided by etching portions of the scribelanes to expose the edges of the TIL, and may also be provided by within-the-die portals. The chemical reduction process may be utilized in combination with the crushing method, and may provide the ability to lower the crush pressure and allow a thinner TIL by removal of material from the TIL.

For example, a 'thick' TIL 340 may be utilized in the steps of FIGS. 3A to 3F, and then a thinning process such as the described chemical, sonic, and/or crushing methods disclosed herein may be employed to thin TIL 540 before the formation of the TLVs as described in FIG. 3G. This will allow higher temperature processing (for example 1000° C.) on the top layer to be processed without harming the underlying structures such as metallization, IMDs, and devices, and yet ultimately have a thin TIL that enables nanometer sized TLVs for dense and low capacitance & resistance stratum to stratum connections.

Thinning of the TIL after the desired thermal processing is completed may include a sonic process to weaken the TIL and/or reduce the volume of the TIL. For example, application of ultrasonic or megasonic energy may utilized to breakdown the sparse aerogel structure, and then the weakened TIL may be physically crushed in place. The sonic reduction process may be utilized in combination with the chemical and/or crushing methods, and may provide the ability to lower the crush pressure. Ultrasound Treatments (UST) or megasonic treatments (MST) may apply the sonic energy using longitudinal acoustic waves which may be introduced into a plate (transfer mass) from the rear side of the plate and may propagate perpendicular to the working surface upon which the layer or substrate to be annealed may be placed. Thus, the acoustic wave may propagate perpendicular to the to-be-treated wafer or substrate surface. The sonic energy may first impinge on a sonic spreader, which may include a plate constructed of materials of greater or lesser density than the transfer mass, for example, copper or aluminum. The sonic spreader may be physically coupled to or may be integrated into the transfer mass. The UST frequency may be from 10 kHz to 30 MHz. The applied UST power or intensity may be from 0.2 W/cm$^2$ to 3 W/cm$^2$. The temperature of the layer or substrate being subjected to the UST or MST may typically be about 250° C. to 400° C. After or at the end of the UST or MST, the treated wafer, layer, or substrate may be thermally quenched to room temperature, about 25° C. The duration of the UST or MST may be typically 1 minute, but may range from 1 second to 4 hours. The UST/MST ambient may include, for example, vacuum, high pressure (greater than about 760 torr), oxidizing atmospheres (such as oxygen or partial pressure oxygen), and/or reducing atmospheres (such as hydrogen and partial pressure hydrogen, nitrogen or argon), and may include liquid immersion, for example, in water or alcohol. The UST or MST frequency and transfer mass may be adjusted to create and optimize resonance within the to-be-treated layer, wafer, or substrate. The to-be-treated layer, wafer, or substrate may include, for example, TIL described herein and associated other layers, structures, and substrate. For example, the transfer mass may be adjusted to create and optimize resonance within the to-be-annealed layer, wafer or substrate by utilizing a thick and massive transfer mass, such as a plate or wafer slug of monocrystalline silicon or stainless steel about 10 cm thick and/or more than 10 times the mass of the to-be-annealed wafer or substrate. The sonic energy impinging on the massive transfer mass may be from sources including, for example, a sonic transducer, multiple electric or electronic hammers, fast moving solenoids, or water cavitation jets. The sonic energy may first impinge on a sonic spreader, which may include a plate constructed of materials of greater or lesser density than the massive transfer mass, for example, copper or aluminum. The sonic spreader may be physically coupled to or may be integrated into the massive transfer mass.

Alignment strategies for formation of the devices on the layer being processed and/or the TLVs may include the following. The TIL and shield/heat sink layers may include isolation openings alignment mark openings (not shown), which may be utilized for short wavelength alignment of top layer (donor) processing to the acceptor wafer alignment marks (not shown). The alignment mark openings preferably may be two per wafer for base wafer alignment mark zero layer alignment strategies. Other patterns may be utilized. As well, at least two base openings may be utilized to place and construct new alignment marks on the top layer to be processed, prior to processing device structures. These layer-to-be-processed (top, may be second layer) alignment marks may then be utilized to construct the devices and interconnect structure of that stratum to a minimum alignment error, for example, less than 5 nm, less than 10 nm, less than 20 nm, or less than 40 nm. The alignment error of the transistors and structures of the top layer to be processed to either the layer below structures/transistors or to the base alignment and/or device structures may be less than 200 nm, less than 150 nm, or less than 100 nm, or less than 50 nm, or less than 20 nm, or less than 10 nm, depending on the lithographic tool and methodology utilized. A MEMS based machine such as SUSS MicroTec Mask Aligners may provide capability in the middle of the range. Direct ASML style stepper alignment with special algorithms to compensate for a 10+um (assuming the TIL is approximately 10 um thick during the second layer/top thermal processing) focus range may provide alignment error on the lower end of the range. Utilization of indirect alignment, such as utilized by wafer bonders, may provide alignment errors on the high side of the range. In addition, double table wafer bond style alignment, for example, the EVG Gemini FB production fusion bonder and SmartViewNT bond aligner, may provide alignment error on the high to middle portions of the range without needing to create openings in the TIL and shield layers. After completion of the top layer devices, and then the thinning of the TIL, formation of the TLV (stratum to stratum connections) to guarantee connectivity may require the orthogonal connect strip methodology as illustrated in at least FIGS. 30-33, 73-80, and 94 and related specification sections of incorporated by reference U.S. Pat. No. 8,273,610 due to some x and y direction movement of the top layer (could be second layer or stratum) with respect to the bottom layer (could be first layer or stratum) during the thinning and crush processing. Thus, a method step flow may include: Processing a stack with a thick opacified TIL and layer to be processed on top (such as up to FIG. 3C herein, including first/base layer transistors, alignment marks and orthogonal landings strips), form alignment mark openings to the at least two base alignment marks on the base layer (mask & etch oversize holes to compensate for poor alignment capability), utilize the base alignment marks to create new alignment marks on the second (top) layer, optionally fill in the alignment mark openings with thermal insulating material to assist with thermal uniformity of top layer processing, then process the desired devices and initial second (top) layer interconnect structures utilizing conventional thermal processes such as described herein, then form the TLV second layer to base/first layer connections by utilizing alignment information from both the second layer and first layer alignment marks and then forming the second layer orthogonal landing strips to complete the TLV connection.

Figure 6:
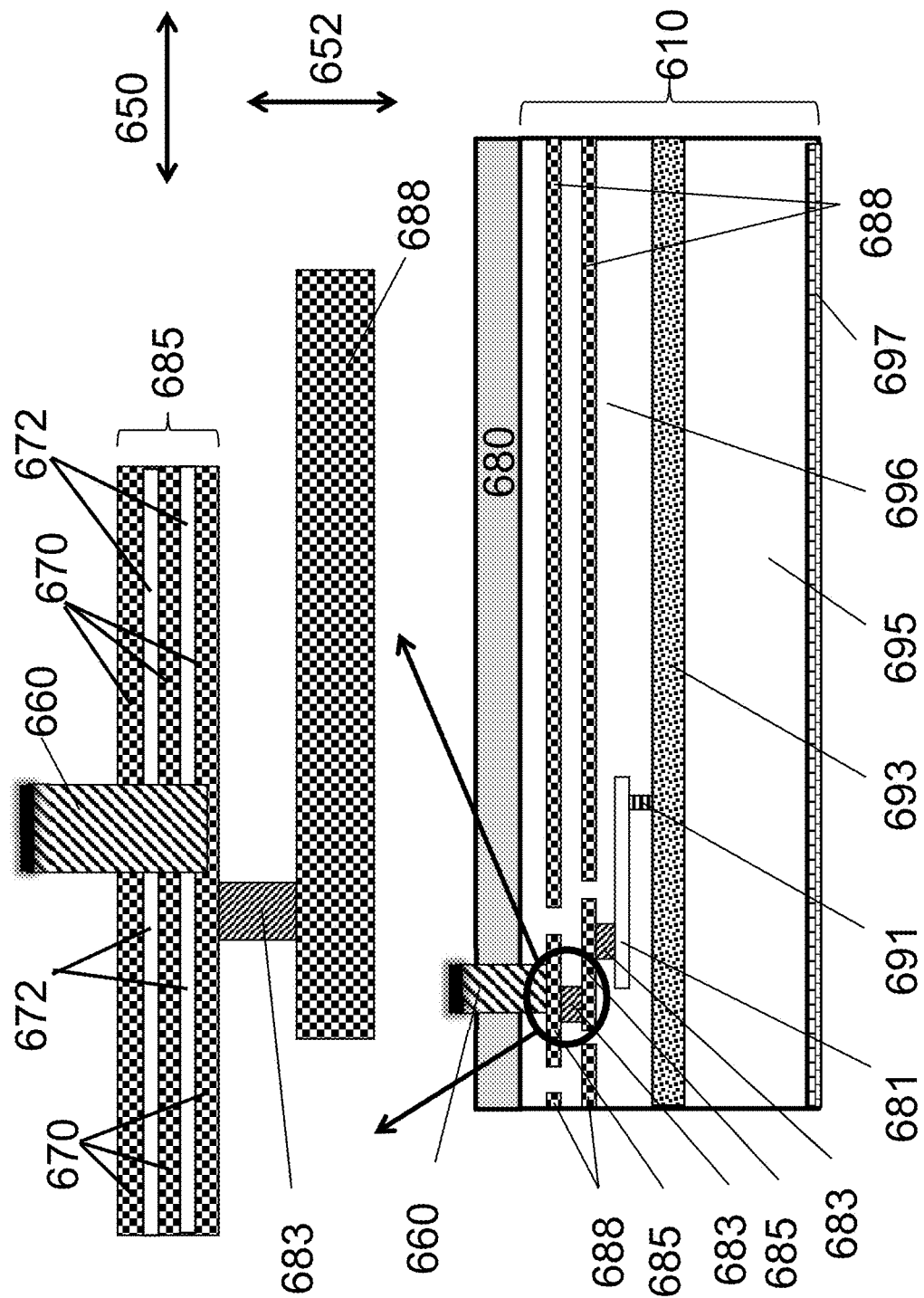
FIG. 6 is an exemplary drawing illustration of a layered shield layer or region.

As illustrated in FIG. 6, a layered shield layer (may be a portion of a TPS) may be constructed wherein the horizontal heat conductivity or heat spreading capability may be substantially greater in the horizontal direction than in the vertical direction. The horizontal direction is indicated by horizontal arrow 650 and the vertical direction is indicated by vertical arrow 652. A portion of FIG. 6 is showing the portion of a 3D device with shield & spreading structure below the second crystalline device layer, which may include TIL 680, a portion of thru layer vias (TLVs) 660, shield path connects 685, shield path via 683, BEOL isolation 696, shield path via 683, acceptor metal interconnect 681, first (acceptor) layer metal interconnect 691, acceptor wafer transistors and devices 693, acceptor substrate 695, and acceptor wafer heat sink 697 (which may have an external surface or connection to an external surface), of substrate 610. The external surface may be at the top, bottom or sides of the finished device. TIL 880 may include the upper and lower isolation layers as described in FIGS. 1-5 herein. The device may include an external surface from which heat transfer may take place by methods such as air cooling, liquid cooling, or attachment to another heat sink or heat spreader structure. As indicated in FIG. 6, the area within the circle is blown up to enable clarity of detail for the illustration. Layered shield region 685 may include layers or regions of heat conductive material and heat isolative material, for example heat conducting regions 670 and heat isolative regions 672. Heat conducting regions 670 may include materials with a high thermal conductivity greater than 10 W/m-K, such as, for example, (about 400 W/m-K), aluminum (about 237 W/m-K), Tungsten (about 173 W/m-K), Plasma Enhanced Chemical Vapor Deposited Diamond Like Carbon-PECVD DLC (about 1000 W/m-K), and Chemical Vapor Deposited (CVD) graphene (about 500 W/m-K), barrier metals such as TiN and TaN, and may be deposited in layers interspersed with heat isolative layers. Heat isolative regions 672 may include materials with a low thermal conductivity (less than 10 W/m-K), or substantially less thermally conductive than the material included in heat conducting regions 670, materials such as, for example, silicon oxide (about 1.4 W/m-K), aerogels (can be less than 100 or 10 mW/m-K), carbon doped oxides, disordered oxide and/or metal nanostructures (can be less than 100 or 10 mW/m-K). Accordingly, depending on material choices and construction (such as number of heat conductive/isolative layers and their thickness), layered shield region 685 may have a heat conductivity in the horizontal direction that is 2 times, or 4 times, 10 times, or 100 times greater than the heat conductivity in the vertical direction. Either or both of heat conducting regions 670 and heat isolative regions 672 may be electrically conductive. Heat conducting regions 670 and heat isolative regions 672 may be formed by lithographically defining and then etching the conductive and isolative layer stack using subtractive formation techniques known by those skilled in the art, and may also be formed in a damascene method. After the processing heat exposure of the layer being processed as described elsewhere in this specification, electrical connection between the various heat conducting regions 670 may be made by forming the deep TLV 660, patterned after thru layer vias (TLVs) 660, to short the various heat conduction regions 670. Deep TLV 660 may be formed by etching substantially to, within, or thru the bottom heat conducting region 670 of layered shield region 685. Thus layered shield region 685 may be formed wherein the horizontal heat conductivity or heat spreading capability may be substantially greater in the horizontal direction (indicated by horizontal arrow 650) than in the vertical direction (indicated by vertical arrow 652). Shield path connect 683 may be similar to shield path connects 685 and additional shield region 688 may be layered such as, for example, layered shield region 685 or shield layers 688 of FIG. 6. Layered shield region 685 may be utilized as part of a thermal conduction path, emf shield, back-bias circuits for second layer transistors, and other uses as described herein in relation to FIG. 6, and any other descriptions herein employing a shield layer or region.

Persons of ordinary skill in the art will appreciate that the illustrations in FIG. 6 are exemplary and are not drawn to scale. Such skilled persons will further appreciate that many variations may be possible such as, for example, subtractive region formation techniques may be preferred over damascene for forming layered shield region 685 as the shield regions may comprise the majority of the device area at that formation step, and CMP processes within the damascene techniques may be difficult without breaking the shield into small regions, which may affect the heat shielding capability. Two or more layered shield layers, properly designed and layered out with overlapping regions, may be useful for the damascene technique. Moreover, when the layered shield region 685 is formed by a damascene process flow, then electrical connection between the various heat conducting regions 670 may be made at the top surface of the damascene 'metal' line trench by just a slight over-etch (CMP smearing may not be enough to couple the conductive regions) during deep TLV 660 formation, as many of the various heat conducting regions 670 and heat isolative regions 672 may truncate at the top surface of the trench that is forming layered shield region 685. Furthermore, deep TLV 660 may be formed to be fully or partially on the outside edge of the layered shield region 685 in order to couple the various heat conducting regions 670. Many other modifications within the scope of the illustrated embodiments of the invention will suggest themselves to such skilled persons after reading this specification. Thus the invention is to be limited only by the appended claims.

Figure 7:
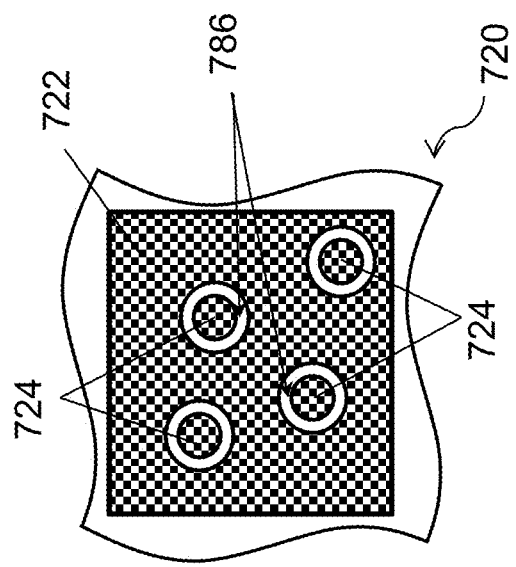
FIG. 7 is an exemplary drawing illustration of a shield layer or layers or regions that may have isolated TLV landing pads.

As illustrated in FIG. 7, the shield layer or layers or regions (may be a portion of a TPS) may have isolated TLV landing pads to enable signals from the second layer of devices to connect either to a lower shield layer or to the interconnect layers of the substrate or lower layer devices and circuits (topside view of shield layer/regions). In shield layer/region portion 720 a shield area 722 of the shield layer materials described above and in the incorporated references may include TLV connects 724 and isolation openings 786. Isolation openings 786 may be the absence of the material of shield area 722 and may include electrically and thermally isolative materials, for example, such as silicon oxide, silicon carbon oxides, and aerogels. TLV connects 724 and isolation openings 786 may be drawn in the database of the 3D-IC stack and may formed during the substrate/acceptor wafer processing. Patterning of shield layer or layers can impact their heat-shielding capacity. This impact may be mitigated, for example, by enhancing the top shield layer areal density, creating more of the secondary shield/heat sink layers, or attending to special CAD rules regarding their metal density, similar to CAD rules that are required to accommodate Chemical-Mechanical Planarization (CMP). These constraints would be integrated into a design and layout EDA tool. For example, the shield layer areal coverage could be much greater than a typical interconnect metallization layer (typically 50%). The shield layer could have an areal coverage density of about 75%, or about 70%, or about 85%, or greater than about 50%.

The various layers of a 3D device may include many types of circuitry, which may be formed by regions of transistors and other semiconductor device elements within that layer or in combination with other layers of the 3D device, and connections between the transistors within the same region, region to region and vertically (layer to layer) may be provided by layers of interconnect metallization and vertical connections such as TLVs and TSVs. In addition, power routing within the 3D device may utilize thicker and more conductive interconnect metallization than another layer, especially if the layer is closest to the source of external power and/or has a greater current load/supply requirement. Many individual device and interconnect embodiments for 3D devices have been described herein and in the incorporated patent references.

Figure 8:
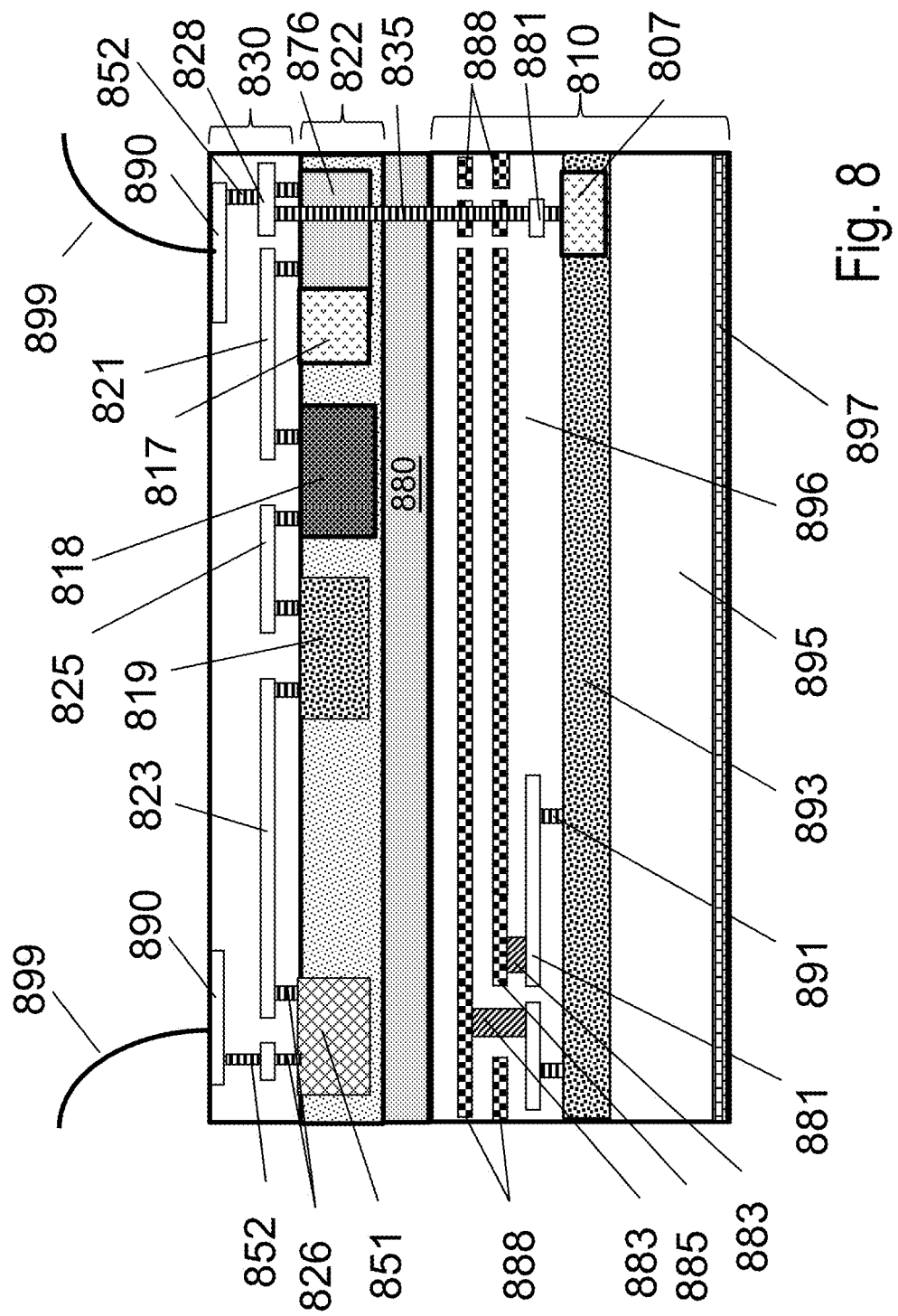
FIG. 8 is an exemplary illustration of some additional embodiments and combinations of devices, circuits, paths, and connections of a 3D device.

As illustrated in FIG. 8, some additional embodiments and combinations (further embodiments) of devices, circuits, paths, and connections are described and may utilize similar materials, constructions and methods as the incorporated references or discussed herein. With reference to embodiments described herein, for example with respect to FIGS. 1-5 herein, and in the incorporated patent references, a substrate layer, which may have a thicker body than other semiconductor layers above or within the 3D device, such as acceptor 810 may be formed and may include heat sink 897, acceptor substrate 895, acceptor wafer transistors and circuits 893, first (acceptor) layer metal interconnect 881 which may include first layer contacts 891, first layer vias 883, at least one shield layer/region 888 (two layers and many regions, such as lower level shield layer region 885, shown), interconnect insulator regions 896 and ESD diode structures 807. A second semiconductor layer may be transferred and constructed on top of the first layer with TIL 880 in-between and vertical layer to layer interconnections may be provided by TLV/TSV 835, only one is shown. TIL 880 may include the upper and lower isolation layers as described in FIGS. 1-5 herein. A layer of transistors and circuits 822 may include second layer input device structures 876, FD ESD structures 817, Phase Lock Loop circuits PLL 818, SERDES circuitry 819, and output device structure 851. Second interconnections layer 830 may include at least one layer/regions of metallization and associated contacts and via, for example, second layer metallization M1 segments 828, 821, 823, 825, second layer contacts 826, second layer vias 852, and conductive pads 890. The 3D device may be connected to external devices utilizing many structures known to those skilled in the art, for example, bond wires 899. Input device structures 876 and output device structure 851 may be connected to external devices through, for example, second layer contacts 826, second layer metallization M1 segments 828, second layer vias 852, conductive pads 890, and bond wires 899. A portion of the transistors within input device structures 876 and output device structure 851 may be larger in either or both width and length than most transistors within acceptor wafer transistors and circuits 893. Input device structures 876 (and output device structure 851) may be subjected to voltage and/or current transients from external devices or generated externally and traveling to the 3D device along bond wires 899. Input device structures 876 (and output device structure 851) may be protected by dissipating the transient energy in diode structures, such as ESD diode structures 807 on the relatively thicker (than for example, the second semiconductor layer) acceptor substrate 895, which may be connected by a multiplicity of connection stacks such as first (acceptor) layer metal interconnect 881 which may include first layer contacts 891, first layer vias 883, at least one shield layer/region 888, TLV/TSV 835, and second layer metallization M1 segments 828. Input device structures 876 (and output device structure 851) may be protected by dissipating the transient energy in a transient filtering circuitry such as for example, FD ESD structures 817, which may reside on a relatively thin semiconductor layer in the 3D device and may effectively utilize fully depleted transistors in the filter circuitry. FD ESD structures 817 may be coupled to input device structures 876 (and output device structure 851) by second layer interconnections (not shown). Input device structures 876 may be connected to PLL 818, for example, thru second layer metallization M1 segment 821 and second layer contacts 826. Input device structures 876 may be connected to SERDES circuitry 819, for example, thru second layer metallization (not shown). Output device structures 851 may be connected to SERDES circuitry 819, for example, thru second layer metallization M1 segment 823 and second layer contacts 826. Output device structures 851 may drive signals thru the connection to conductive pads 890 and then out to external devices thru bond wires 899. Transistors within a lower layer, for example within acceptor wafer transistors and circuits 893, may be connected (not shown) to the output device structure 851 and drive a signal to the output device structure 851, and a portion of the transistors of output device structure 851 may have a larger width and/or length than the transistors within acceptor wafer transistors and circuits 893. Power from external sources may be routed thru bond wires 899 to conductive pads 890 to the 3D device, wherein at least a portion of the second interconnections layer 830 may be constructed with thicker and/or wider metallization wiring (for example 4× wiring as described in incorporated patent references) so to provide the higher current carrying capability required for the second layer power distribution grid/network than that of the lower layer, in this example, first layer metallization wiring (for example 1× or 2× wiring as described in incorporated patent references). The width and/or length of the transistors of the second layer of transistors and circuits 822, for example a portion of those in second layer input device structures 876 and/or FD ESD structures 817 and/or output device structures 851, may be substantially larger than the width and/or length of transistors in acceptor wafer transistors and circuits 893.

Persons of ordinary skill in the art will appreciate that the illustrations in FIG. 8 are exemplary and are not drawn to scale. Such skilled persons will further appreciate that many variations may be possible such as, for example, a thick enough semiconductor layer to enable ESD diode style protection circuitry to be constructed need not only be on the base or substrate layer, but may reside elsewhere in the 3D device stack. Moreover, the output circuitry including output device structures 851 may wholly or partially reside on a semiconductor transistor layer that is not on top, and vertical connections including TLVs/TSV may be utilized to connect the output device structures 851 to conductive pads 890. Furthermore, the input circuitry including input device structures 876 may wholly or partially reside on a semiconductor transistor layer that is not on top, and vertical connections including TLVs/TSV may be utilized to connect the input device structures 876 to conductive pads 890. Similarly, SERDES circuitry 819 and PLL 818 may wholly or partially reside on a semiconductor transistor layer that is not on top, the choices being one of design choice and device characteristics driven. Furthermore, connection to external devices (signal and/or power supply) may be made on the backside of acceptor substrate 895. Moreover, connection to external devices form the 3D device may utilize many types of structures other than bond wires 899 shown in the illustration, for example, flip-chip and bumps, wireless circuitry. Thus the invention is to be limited only by the appended claims.

During processing the layer being processed, temperature uniformity of the heating source, for example, IR lamps, lasers, other radiative bodies, as reflected in the temperature uniformity of the layer being processed, for example 160, 360, 460, 580 may require improvement. The layer being processed temperature uniformity may be improved by placing a surrogate wafer or substrate, for example, containing silicon, and/or graphene, and/or highly thermally conductive materials (>100 W/m-K), in contact and above the layer being processed. This may be useful for anneals and other non-deposition type processes. A thermally conductive heat spreader layer may be integrated into the TIL, or upper isolation layer, to laterally spread the heat absorbed by the layer being processed. For example, a thin layer of graphene, and/or CNT, and/or tungsten, which may have a high melting point (>800 C) and a high thermal conductivity (>100 W/m-K) may be formed within or above the TIL and/or upper isolation layer. Moreover the heat spreader layer may include IR absorption capability, absorbing IR energy from the equipment heat source and/or IR energy from the layer being processed (as it itself is heating up), and help thermally stabilize the uniformity of heating and processing. The IR absorbing heat spreader layer may include graphene, $TiO_2$, carbon black, and IR absorbers incorporated into other materials. The IR absorbing heat spreader layer may be utilized to absorb IR energy from the heating sources of the processing equipment to thermally heat the layer being processed, for example, IR lamps from many directions (above, below), and may include additional wavelength radiation to assist the heating.

An embodiment of the invention is thermally enhanced processing equipment that may be utilized in combination or sub-combination with a thermal protective structure (TPS) or structures, and/or a thermally enhanced substrate (TES) which are described elsewhere in this document and in other related applications.

An important function of the thermally enhanced processing equipment is to conduct the amount of heat away from the back surface of the substrate so that the temperature of the substrate devices and metallization and isolation interconnection layers/regions and the devices and metallization and isolation interconnect layers and regions of any other circuit layer in the 3DIC stack, such as $2^{nd}$ layer L2, may be kept below the damaging thermal level, for example below 400° C. or below 370° C., by the protection structure (as shown in FIGS. 1-8). One component of the thermally enhanced processing equipment which may accomplish this is a cooling chuck that may be in direct contact with the back surface of the substrate. Another is the thermal isolation of the edge of the wafer being processed and the cooling chuck from the processing chamber and/or processing chamber volume. Thermally enhanced processing equipment may be designed to perform many of the typical semiconductor processes, for example, RTA (Rapid Thermal Anneal), RTP (Rapid Thermal Processing), RTO (Rapid Thermal Oxidation), spike and/or flash anneals, laser anneals, ALD (Atomic Layer Deposition), CVD (Chemical Vapor Deposition), thermal oxidation, anneals, salicidation, MOCVD, HVPE, selective epitaxial growth processes.

Figure 9:
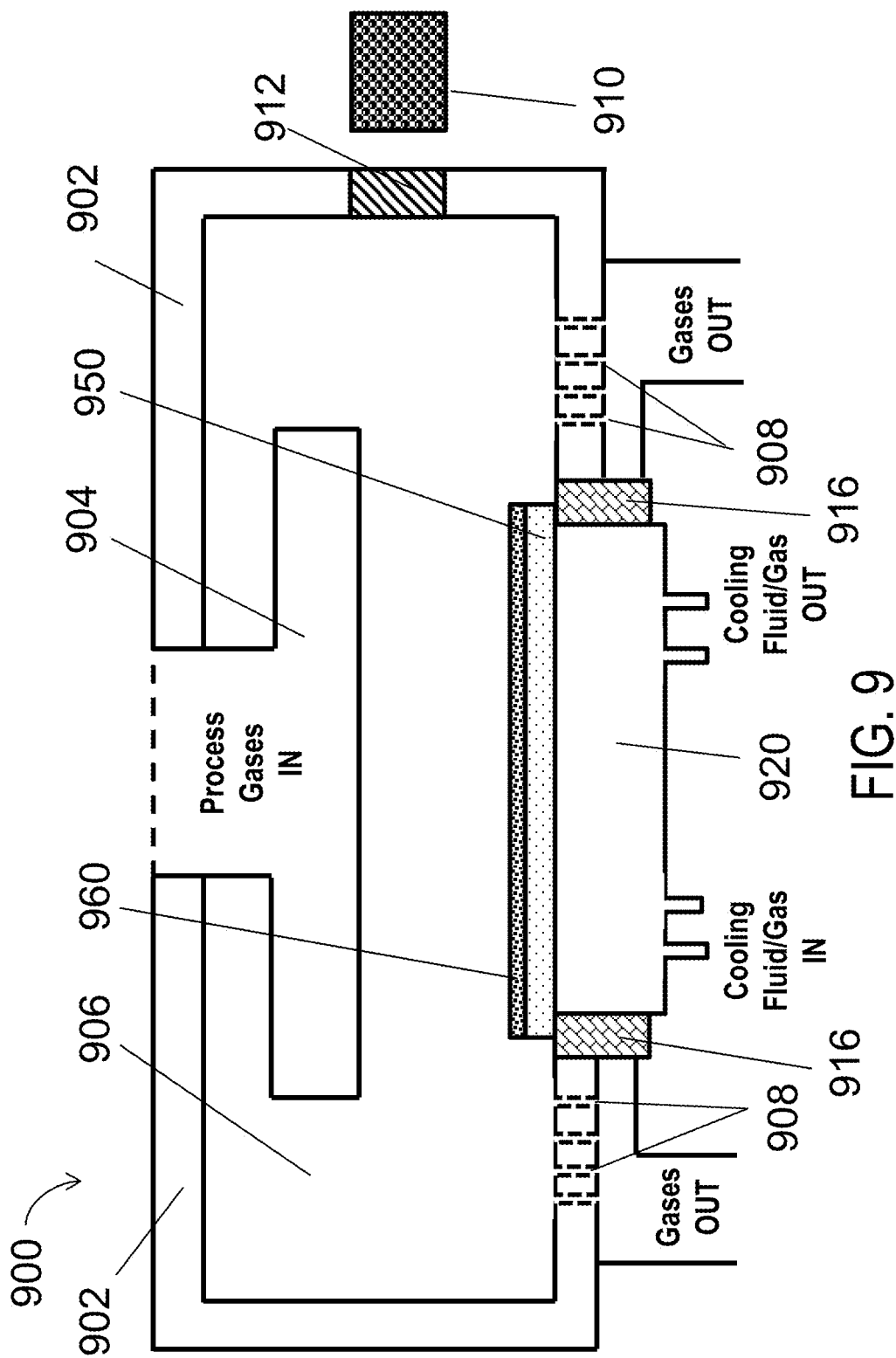
FIG. 9 is an exemplary drawing illustration of a portion of thermally enhanced processing equipment.

As illustrated in FIG. 9, a portion of an exemplary thermally enhanced processing equipment 900 is shown, and may include chamber walls 902, top electrode and/or manifold 904 that may supply process gases, biases and enable plasmas and other techniques for semiconductor processing. Process gasses may include inert gases, such as, for example, argon, mostly inert gasses, such as, for example, nitrogen, and reactive gases, such as, for example, $SiH_4$. The chamber walls 902 and/or chamber interior 906 may be heated, and/or the heaters (not shown) may be designed to heat the topside of the layer being processed 960 and/or other IR/heat absorbing layers above or below layer being processed 960, layers as described elsewhere herein. The heating may include methods such as induction, conduction, convective, optical (laser/flash/RT/IR/UV), microwave, and/or chemical. The optical heating element/methods may include specific wavelengths and/or spectrums, such as specific tuned IR spectrum portions so to optimally be absorbed by heat absorbing/spreading layers in the wafer being processed (may include substrate 950 and layer being processed 960), or the optical heating elements/methods may be broad spectrum. The chamber walls 902 may include exhaust ports 908 which may be connected to an exhaust and/or vacuum systems. A substrate movement robot 910 and robot arm (not shown) may be utilized to place and remove the substrate in the chamber thru the access door 912. Many other components to the processing equipment and processing are not shown as they are known to those of ordinary skill in the art. The processing equipment may include a cooled chuck that may be cooled by the movement of cooling fluid or gas thru a portion of the cooled chuck 920. The cooling fluid may include, for example, fluids such as water, fluorinert, and dielectric fluids, and the cooling gas may include, for example, helium or air. The cooled chuck 920 may be cooled by other methods, for example, electro-thermally. The cooling capacity may be less than, equal to or exceed the heating energy applied to the layer being processing, and in concert with the insulating capability of the TIL, thus allow control of the temperature gradient of the protection structure and the temperature of the thermally sensitive structures that require protection during processing. Cooled chuck 920 may be also called an actively cooled chuck. At least a portion of the cooled chuck 920 may be constructed from thermally conductive materials, for example, aluminum, stainless steel. Cooled chuck 920 may have a top surface shape similar to the substrate 950 bottom surface shape, for example, circular. The top surface extent of the cooled chuck 920, for example the diameter in the case of a circular substrate, may be slightly smaller than the backside surface extent of the substrate 950. For example, the diameter of the cooled chuck 920 may be smaller than the diameter of the substrate 950 by at least about 0.1 mm, about 0.5 mm, about 1.0 mm, about 1.5 mm, about 2.0 mm, or about 3 mm. A substantial majority of the backside surface of the substrate 950 may be in direct contact and thermally conductively coupled (including a gaseous Helium cool) to the topside surface of the cooled chuck 920. There may or may not be thermally conductive material (for example, thermally conductive polymers) disposed between the backside surface of the substrate 950 and the topside of cooled chuck 920. Cooled chuck 920 may include a vacuum or electrostatic pull down capability, and may include pegs that may move the substrate 950 vertically up and down to enable movement of the substrate 950 via the robot arm into and out of the processing chamber. Thermally isolative material 916, for example, high temperature Teflon, aerosol ceramics, oxides, nitrides, may be attached to all or a portion of the cooled chuck 920 sidewalls and may be utilized to thermally isolate the cooled chuck 920 from the chamber walls 902 and/or processing chamber interior 906. The cooled chuck 920 to chamber wall 902 thermal isolation may include a vacuum space. The substrate 950 edge may include a layer (not shown) of thermal isolation, for example silicon oxide, silicon carbon oxides, silicon nitrides, which may have a thickness of at least about 50 nm, about 100 nm, about 200 nm, about 300 nm, about 500 nm, about 1 um, about 2 um. The heating elements or heat applied may be duty cycled with the cooling in place. The heat duty cycle may be about 100% heat on, or about 75% heat on, or about 50% heat on, or about 25% heat on, or about 10% heat on. The cooled chuck 920 may be designed to monitor the temperature in various regions of the cooled chuck 920, and adjustments in the cooling rate, for example by flow control of the coolant inlets in that check region, may be made in a feedback manner to improve the temperature uniformity of the wafer being processed. This cooling feedback system may be integrated with selective control of the heating element/mechanism of the equipment to further improve across the wafer thermal uniformity control. These control systems may also be utilized to provide a consistent and controllable, but intentionally non-uniform temperature gradient across the wafer (includes substrate 950 and layer being processed 960), which may improve the ultimate process result of thickness, etch, etc., process uniformity. Temperature monitoring of the liquid or gas coolant as it exits cooled chuck 920 may also be utilized in a feedback system that then may control the input coolant volume, flow rate, and temperature in that region. Cooling of cooled chuck 920 may include liquid vaporization techniques and phase change methods, for example, as outlined in the DARPA ICECool program for 3DICs, but applied to a macro environment of a wafer chuck.

The substrate of the base layer, for example, substrate 100, substrate 300, substrate 400 of FIGS. 1, 2, 3, 4 respectively, may also be thermally enhanced by lowering its average thermal conductivity and/or by bringing the cooling fluid or gas directly into it, thereby shortening the distance from the heat needing to be conducted and the cooling. The Thermally Enhanced Substrate (TES) may include embedded thermal vias or layers, for example, including vias/layers formed with highly thermally conducting materials (thermal conductivity>400 W/m-K), for example, such as graphene, or carbon nanotubes. Structures to flow and route cooling fluids and/or vapors/gases may be formed. For example, the single phase microchannels as described by E. G. Colgan, et al., "A Practical Implementation of Silicon Microchannel Coolers for High power Chips," IEEE Transactions on Components and Packaging Technologies, vol. 30, no. 2, pp. 218-225 (June 2007), or U.S. Pat. No. 7,344,957 to G. G. Barna "SOI Wafer with Cooling Channels and a Method of Manufacture thereof", or U.S. Pat. No. 6,242,778 to Marmillion et al., "Cooling Method for Silicon On Insulator Devices," may be utilized. The TES microchannels may be utilized for processing heat removal and for operational heat removal. Cooling of TES thru the microchannels may include liquid vaporization techniques and phase change methods, for example, as outlined in the DARPA ICECool program for 3DICs, but applied to a microchannel enabled TES on a cooled chuck.

The TES that has coolant microchannels may be designed to have a backside pattern of input and output holes/ports that will align with the equipment chuck and its input and output ports for the cooling medium. This pattern may be designed to be an industry standard to mitigate interface issues. The cooling medium may be may include, for example, fluids such as water, fluorinert, and dielectric fluids), and the cooling gas may include, for example, helium or air. Clogged TES microchannels (and/or cooling chuck channels) may be detected by observing the delta P and/or flow rate changes of individual or groups of microchannel ports. As well, these channels may be kept clean by alternating liquid and gas applications, with continuous flow or pulsing of the mediums. The cleaning gases and/or fluids may be heated during the cleaning cycle. Upon completion of the processing and thermal stabilization of the substrate being processed, the substrate and chuck mircochannels may be dried with heated gases. This drying may include two portions, a blow of gases while in one chamber, and then after transport to a second chamber, a longer and heated gas dry of the microchannels. The substrate may also be heated to about 200° C. to assist the drying process.

A TES which has coolant microchannels may include a pattern of microchannels wherein the microchannel pattern is aligned with pre-planned and placed thermal vias of the device structure above. For example, the substrate 100 microchannel pattern at the surface and top about third of the substrate may be designed to be aligned to and of similar pattern as, for example, the thermal via stacks via landing pads 112 and/or thermal vias in the scribelane 114, and/or in-die thermal via stacks 116 and/or fill-in thermal paths 117.

A TES with microchannels structure may be formed by processing a silicon wafer with the microchannel holes, trenches, and/or coolant tunnels and then layer transferring, for example, by ion-cut or other processes, the first layer of devices onto the prepared microchannel TES substrate. This minimizes the stress of microchannel formation on the base layer transistors and devices.

A TES with microchannels structure may be formed by processing a silicon wafer with the microchannel holes, trenches, and/or coolant tunnels, thinning an intended processing substrate to about 50 um, and then bonding the silicon wafer with microchannels to the thinned intended processing substrate. The thickness of the silicon wafer with microchannels may be adjusted before or after the bonding step to bring the bonded structure to the SEMI standard thickness and flatness specifications. After the thermal processing is completed, the silicon wafer with microchannels may be debonded/separated from the intended processing substrate. This may allow the use and reuse of an expensive isotopically pure material for the silicon wafer with microchannels.

A TES may include an SOI wafer that has holes/channels in the substrate material (for example silicon, germanium) and trenches/microchannels in the BOX to run the coolant from the chuck, thru the substrate holes/channels, thru the BOX microchannels/trenches, and back to the chuck.

A TES may also include isotopically pure or nearly pure layers, which may enhance the thermal conductivity of the substrate.

If the substrate includes a thermally isolative layer, or example a BOX of an SOI substrate, then thermal vias may be constructed that go thru the silicon layer and the BOX to thermally connect to the substrate of the SOI wafer. The thermal vias may also be constructed so that they are thermally conductive but not electrically conductive, for example, with reverse biased junctions, Schottky barriers, or electrically isolative barrier layers/materials, for example, such as described in U.S. Pat. No. 8,674,470, the contents of which are incorporated by reference. The use of an SOI wafer with thru thermal vias may prevent the up-flow of heat from the substrate to the base layer devices.

The TPS, TIL, TES and thermally enhanced processing equipment, or sub combinations thereof, may be utilized for transistor, device, and structure processing steps including those found in entire process flows, such as, for example, 28 nmFDSOI with UTBBOX devices, 22 nm FinFet, any type of process flow such as CMOS, bipolar, SOI, bulk, heterogeneous integration, GaN on silicon, and to any unit process within those process flows, including SmartCut, 2D or 3D formations process flows. A high temperature unit process may be defined as greater than about 700° C. (of the layer being processed), and moderate temperature unit process as less than about 700° C. and greater than about 400° C. or 370° C., and a low temperature unit process as less than about 400° C. or 370° C. There is some debate by those in the art about whether 370° C. or 400° C. is the temperature at which the interconnect metallization and/or low-k inter-metal dielectric (IMD) is damaged. A low temperature process in this application is one that will not damage the interconnect metallization and/or low-k inter-metal dielectric without a protection structure in place.

The TPS, TIL, TES and thermally enhanced processing equipment, or sub combinations thereof, may be utilized to provide a PadOx that may be employed in the STI formation and/or Well formation steps for transistor formation, a 22 nm FinFet transistor for example. The PadOx may be grown on the layer being processed as a furnace based thermal oxide or a rapid thermal oxidation (RTO) process at a temperature of about 800° C. for about one minute. The process temperature may be greater than about 700° C., or may be greater than about 1000° C. The process time may be greater than about 30 seconds or greater than about 5 minutes.

The TPS, TIL, TES and thermally enhanced processing equipment, or sub combinations thereof, may be utilized to provide $Si_3N_4$ LPCVD depositions that may be employed in the STI formation and/or Well formation steps for transistor formation, a 22 nm FinFet transistor for example. The $Si_3N_4$ film may be deposited on the layer being processed as a furnace based LPCVD deposition or a rapid thermal deposition (RTP) process at a temperature of about 700° C. for about 20 minutes. The process temperature may be greater than about 600° C., or may be greater than about 750° C. The process time may be greater than about 10 minutes or greater than about 30 minutes.

The TPS, TIL, TES and thermally enhanced processing equipment, or sub combinations thereof, may be utilized to provide an STI liner oxide that may be employed in the STI formation steps for transistor formation, a 22 nm FinFet transistor for example. The STI liner oxide may be grown on the layer being processed as a furnace based thermal oxide or a rapid thermal oxidation (RTO) process at a temperature of about 800° C. for about 5 minutes. The process temperature may be greater than about 700° C., or may be greater than about 1000° C. The process time may be greater than about 30 seconds or greater than about 10 minutes.

The TPS, TIL, TES and thermally enhanced processing equipment, or sub combinations thereof, may be utilized to provide an STI oxide densification (of the TEOS, SOG, or flowable CVD oxide material) that may be employed in the STI formation steps for transistor formation, a 22 nm FinFet transistor for example. The STI oxide densification anneal may be applied to the layer being processed as a furnace based thermal anneal or a rapid thermal anneal (RTA) process at a temperature of about 1000° C. for about 20 minutes. The process temperature may be greater than about 850° C., or may be greater than about 1050° C. The process time may be greater than about 30 seconds or greater than about 10 minutes.

The TPS, TIL, TES and thermally enhanced processing equipment, or sub combinations thereof, may be utilized to provide a Well Implant Activation step (for example, of the well ion implants) that may be employed in the well formation steps for transistor formation, a 22 nm FinFet transistor for example. The Well Implant Activation anneal may be applied to the layer being processed as a furnace based thermal anneal or a rapid thermal anneal (RTA) process at a temperature of about 1000° C. for about 10 seconds. The process temperature may be greater than about 850° C., or may be greater than about 1050° C. The process time may be greater than about 30 seconds or greater than about 4 minutes.

The TPS, TIL, TES and thermally enhanced processing equipment, or sub combinations thereof, may be utilized to provide a dummy gate oxide that may be employed in the gate last HKMG steps for transistor formation, a 22 nm FinFet transistor for example. The dummy gate oxide may be grown on the layer being processed as a furnace based thermal oxide or a rapid thermal oxidation (RTO) process at a temperature of about 800° C. for about 2 minutes. The process temperature may be greater than about 700° C., or may be greater than about 1000° C. The process time may be greater than about 30 seconds or greater than about 8 minutes.

The TPS, TIL, TES and thermally enhanced processing equipment, or sub combinations thereof, may be utilized to provide amorphous silicon LPCVD/PVD/APCVD depositions that may be employed in the dummy gate and other steps for transistor formation, a 22 nm FinFet transistor for example. The amorphous silicon film may be deposited on the layer being processed as a furnace/chamber based deposition or a rapid thermal deposition (RTP) process at a temperature of about 600° C. for about 15 minutes. The process temperature may be greater than about 550° C., or may be greater than about 625° C. The process time may be greater than about 10 minutes or greater than about 30 minutes.

The TPS, TIL, TES and thermally enhanced processing equipment, or sub combinations thereof, may be utilized to provide selective epitaxial depositions, such as SiGe and SiC, that may be employed in the raised source and drain and channel strain steps for transistor formation, a 22 nm FinFet transistor for example. The epitaxial films may be deposited on the layer being processed as a chamber based deposition or a rapid thermal deposition (RTP) process at a temperature of about 600° C. for about 13 minutes. The process temperature may be greater than about 500° C., or may be greater than about 650° C. The process time may be greater than about 7 minutes or greater than about 20 minutes.

The TPS, TIL, TES and thermally enhanced processing equipment, or sub combinations thereof, may be utilized to provide a salicidation formation step (for example, of the Ni or Ti self-aligned salicide ready films) that may be employed in a transistor formation, a 22 nm FinFet transistor for example. The salicidation anneal may be applied to the layer being processed as a furnace based thermal anneal or a rapid thermal anneal (RTA) process at a temperature of about 450° C. for about 10 seconds. The process temperature may be greater than about 400° C., or may be greater than about 440°

C., or may be greater than about 475° C. The process time may be greater than about 30 seconds or greater than about 6 minutes.

The TPS, TIL, TES and thermally enhanced processing equipment, or sub combinations thereof, may be utilized to provide a S/D and/or Halo and/or Vt implant Activation step that may be employed in the source, drain, and channel doping steps for transistor formation, a 22 nm FinFet transistor for example. The Implant Activation anneal may be applied to the layer being processed as a furnace based thermal anneal or a rapid thermal anneal (RTA) process at temperature of about 950° C. for about 1 second and a spike anneal for about 3 ms at 1350° C. Optical annealing, such as a laser, may be utilized. The process temperature may be greater than about 900° C., or may be greater than about 1075° C. The process time may be greater than about 5 ms, or greater than about 2 seconds or greater than about 5 seconds.

The TPS, TIL, TES and thermally enhanced processing equipment, or sub combinations thereof, may be utilized to provide a Bottom Interface Layer that may be employed in the gate last HKMG steps for transistor stack formation, a 22 nm FinFet transistor for example. The BIL may be grown on the layer being processed as a furnace based thermal oxide or a rapid thermal oxidation (RTO) process at a temperature of about 825° C. for about 2 seconds. The process temperature may be greater than about 775° C., or may be greater than about 850° C. The process time may be greater than about 3 seconds or greater than about 1 minute. The BIL may be nitrogen stuffed as part of the process.

The TPS, TIL, TES and thermally enhanced processing equipment, or sub combinations thereof, may be utilized to provide a HfO$_2$ N anneal (to fix N in the ALD HfO$_2$ deposited film) that may be employed in the gate last HKMG steps for transistor stack formation, a 22 nm FinFet transistor for example. The HfO$_2$ N anneal may be applied to the layer being processed as a rapid thermal anneal (RTA) process at a temperature of about 700° C. for about 30 seconds. The process temperature may be greater than about 720° C., or may be greater than about 680° C. The process time may be greater than about 20 seconds or greater than about 1 minute. The process gases may include nitrogen.

The TPS, TIL, TES and thermally enhanced processing equipment, or sub combinations thereof, may be utilized to provide a SmartCut, SmartStacking, or Ion-Cut cleave anneal step that may be employed in the layer transfer steps to form the eventual layer being processed, in a monolithic 3D process as found in referenced patents and patent applications, for example. The cleave anneal may be applied to the donor substrate/wafer/layer processed as a furnace based thermal anneal or a rapid thermal anneal (RTA) process at a temperature of about 500° C. for about 1 minute. The process temperature may be greater than about 850° C., or may be greater than about 1050° C. The process time may be greater than about 30 seconds or greater than about 8 minutes. This process may also be employed in the formation substrates, for example, SOI or GeOI engineered substrates.

The TPS, TIL, TES and thermally enhanced processing equipment, or sub combinations thereof, may be utilized to provide an anneal of the lattice damage caused by the H+ ion implant used during the SmartCut, SmartStacking, or Ion-Cut that may be employed in the layer transfer steps to form the eventual layer being processed, in a monolithic 3D process as found in referenced patents and patent applications, for example. The lattice damage anneal may be applied to the donor substrate/wafer/layer processed as a furnace based thermal anneal or a rapid thermal anneal (RTA) process at a temperature of about 500° C. for about 10 minutes. The process temperature may be greater than about 800° C., or may be greater than about 1025° C. The process time may be greater than about 25 seconds or greater than about 2 minutes. This process may also be employed in the formation substrates, for example, SOI or GeOI engineered substrates.

The TPS, TIL, TES and thermally enhanced processing equipment, or sub combinations thereof, may be utilized to provide a heterogeneous stack structure, such as, for example, GaN on silicon or GaN on diamond on silicon. Epitaxy of GaN utilizing methods such as MBE (typically about 750-900° C.), MOCVD (typically about 950-1150° C.), Plasma Assisted MOCVD (typically about 700° C.), and HVPE (typically about 1150° C.) may be employed to form devices such as blue and green laser diodes, LEDs, power electronics, and RF electronics as a layer or stratum in the 3D devices stack structure. Formation of superlattices and buffer layers may be conventionally processed. Thus, optical devices, RF devices and power devices may be tightly integrated with advanced logic devices to form a 3D stacked system, for example, a single chip cell phone device.

The TPS, TIL, TES and thermally enhanced processing equipment, or sub combinations thereof, may be utilized to form and process FinFets, and to provide for control of the FinFet drive current of each desired device by adjusting the height of the fin. For example, methods such as described within incorporated reference U.S. Pat. No. 8,674,470 (such as with respect to FIG. 36) may be utilized, as well as other methods.

The TPS, TIL, TES and thermally enhanced processing equipment, or sub combinations thereof, may be utilized to form and process stacked horizontally oriented and vertically oriented memories, made with either mono-crystalline silicon or recrystallized silicon, on top of logic where the logic and/or vertical interconnects can be made with the state-of-the art metallization schemes, for example DD copper. Methods and devices such as that utilized by Samsung for its V-NAND or Toshiba/SanDisk for their BiCS NAND memories, as well as others, may now be constructed on top of and utilize the SOA logic metallization throughout the device (vertically and horizontally), thereby providing faster access times, less energy per memory bit move, and faster reaction to stacked memory design issues, for example, the word-line crosstalk and degeneration discharge schemes common in vertically stacked memories.

Some embodiments of the invention may include alternative techniques to build IC (Integrated Circuit) devices including techniques and methods to construct 3D IC systems. Some embodiments of the invention may enable device solutions with far less power consumption than prior art. The device solutions could be very useful for the growing application of mobile electronic devices and mobile systems such as, for example, mobile phones, smart phone, and cameras, those mobile systems may also connect to the internet. For example, incorporating the 3D IC semiconductor devices according to some embodiments of the invention within the mobile electronic devices and mobile systems could provide superior mobile units that could operate much more efficiently and for a much longer time than with prior art technology.

Smart mobile systems may be greatly enhanced by complex electronics at a limited power budget. The 3D technology described in the multiple embodiments of the invention would allow the construction of low power high complexity mobile electronic systems. For example, it would be possible to integrate into a small form function a complex logic circuit with high density high speed memory utilizing some of the 3D DRAM embodiments of the invention and add some nonvolatile 3D NAND charge trap or RRAM as described in some embodiments of the referenced and incorporated patents and patent publications and applications. Mobile system applications of the 3DIC technology described herein may be found at least in FIG. 156 of U.S. Pat. No. 8,273,610, the contents of which are incorporated by reference.

In this document, the connection made between layers of, generally single crystal, transistors, which may be variously named for example as thermal contacts and vias, Through Layer Via (TLV), TSV (Through Silicon Via), may be made and include electrically and thermally conducting material or may be made and include an electrically non-conducting but thermally conducting material or materials. A device or method may include formation of both of these types of connections, or just one type. By varying the size, number, composition, placement, shape, or depth of these connection structures, the coefficient of thermal expansion exhibited by a layer or layers may be tailored to a desired value. For example, the coefficient of thermal expansion of the second layer of transistors may be tailored to substantially match the coefficient of thermal expansion of the first layer, or base layer of transistors, which may include its (first layer) interconnect layers.

Base wafers or substrates, or acceptor wafers or substrates, or target wafers substrates herein may be substantially comprised of a crystalline material, for example, mono-crystalline silicon or germanium, or may be an engineered substrate/wafer such as, for example, an SOI (Silicon on Insulator) wafer or GeOI (Germanium on Insulator) substrate.

Optical annealing beams or systems, such as, for example, a laser-spike anneal beam from a commercial semiconductor material oriented single or dual-beam continuous wave (CW) laser spike anneal DB-LSA system of Ultratech Inc., San Jose, Calif., USA (10.6 um laser wavelength), or a short pulse laser (such as 160 ns), with 308 nm wavelength, and large area (die or step-field sized, including 1 cm$^2$) irradiation such as offered by Excico of Gennevilliers, France, may be utilized in many of the processes described herein, as well as Ultrasound Treatments (UST), megasonic treatments, and/or microwave treatments.

It will also be appreciated by persons of ordinary skill in the art that the invention is not limited to what has been particularly shown and described hereinabove. For example, drawings or illustrations may not show n or p wells for clarity in illustration. Moreover, transistor channels illustrated or discussed herein may include doped semiconductors, but may instead include undoped semiconductor material. Further, any transferred layer or donor substrate or wafer preparation illustrated or discussed herein may include one or more undoped regions or layers of semiconductor material. Moreover, epitaxial regrow of source and drains may utilize processes such as liquid phase epitaxial regrowth or solid phase epitaxial regrowth, and may utilize flash or laser processes to freeze dopant profiles in place and may also permit non-equilibrium enhanced activation (superactivation). Further, transferred layer or layers may have regions of STI or other transistor elements within it or on it when transferred. Rather, the scope of the invention includes both combinations and sub-combinations of the various features described hereinabove as well as modifications and variations which would occur to such skilled persons upon reading the foregoing description. Thus the invention is to be limited only by the appended claims.

We claim:

1. A method for processing a semiconductor device, the method comprising:
   providing a first semiconductor layer comprising first transistors;
   forming interconnection layers on said first transistors, wherein said interconnection layers comprise copper or aluminum;
   forming a shielding heat conducting layer on said interconnection layers;
   forming an isolation layer on said shielding heat conducting layer;
   forming a second semiconductor layer on said isolation layer, and
   processing said second semiconductor layer at a temperature greater than about 400° C.,
      wherein said interconnection layers are kept at a temperature below about 400° C.,
      wherein said processing said second semiconductor layer comprises use of processing equipment comprising a chuck to hold said device and a processing chamber, said processing chamber comprises a thermal isolation structure to isolate said chuck from said processing chamber.

2. The method according to claim 1, wherein said processing said second semiconductor layer comprises a rapid thermal anneal at greater than 440° C.

3. The method according to claim 1, wherein said processing said second semiconductor layer comprises a thermal anneal at greater than about 500° C. to perform an ion-cut cleave.

4. The method according to claim 1, wherein said device comprises dicing streets and wherein said keeping said interconnection layers at a temperature below 400° C. comprises having a plurality of thermal vias disposed within said dicing streets to remove heat from said shielding heat conducting layer.

5. The method according to claim 1, wherein said shielding heat conducting layer is kept at a temperature below about 400° C.

6. The method according to claim 1, wherein said first transistors are kept at a temperature below about 400° C.

7. The method according to claim 1, wherein said shielding heat conducting layer is constructed to provide at least 2 times higher heat conduction in the horizontal direction than in the vertical direction.

8. A method for processing a semiconductor device, the method comprising:
   providing a first semiconductor layer comprising first transistors;
   forming interconnection layers on said first transistors, wherein said interconnection layers comprise copper or aluminum;
   forming a shielding heat conducting layer on said interconnection layers;
   forming an isolation layer on said shielding heat conducting layer;
   forming a second semiconductor layer on said isolation layer, and
   processing said second semiconductor layer at a temperature greater than about 400° C.,
      wherein said interconnection layers are kept at a temperature below about 400° C.,
      wherein said processing said second semiconductor layer comprises use of processing equipment comprising a chuck to hold said device and a processing chamber, said processing chamber comprises a thermal isolation structure to isolate said chuck from said processing chamber, and wherein said keeping said shielding layer at a temperature below about 400° C. comprises cooling a vacuum chuck holding said device and having a plurality of thermal vias connecting said first semiconductor layer to said shielding heat conducting layer.

9. The method according to claim 8, wherein said processing said second semiconductor layer comprises a rapid thermal anneal at greater than 440° C.

10. The method according to claim 8, wherein said processing said second semiconductor layer comprises a thermal anneal at greater than about 500° C. to perform an ion-cut cleave.

11. The method according to claim 8, wherein said device comprises dicing streets and wherein said keeping said interconnection layers at a temperature below 400° C. comprises having a plurality of thermal vias disposed within said dicing streets to remove heat from said shielding heat conducting layer.

12. The method according to claim 8, wherein said shielding heat conducting layer is kept at a temperature below about 400° C.

13. The method according to claim 8, wherein said first transistors are kept at a temperature below about 400° C.

14. The method according to claim 8, wherein said shielding heat conducting layer is constructed to provide at least 2 times higher heat conduction in the horizontal direction than in the vertical direction.

15. A method for processing a semiconductor device, the method comprising:
   providing a first semiconductor layer comprising first transistors;
   forming interconnection layers on said first transistors,
      wherein said interconnection layers comprise copper or aluminum;
   forming a shielding heat conducting layer on said interconnection layers;
   forming an isolation layer on said shielding heat conducting layer;
   forming a second semiconductor layer on said isolation layer, and
   processing said second semiconductor layer at a temperature greater than about 400° C.,
      wherein said interconnection layers are kept at a temperature below about 400° C.,
      wherein said processing said second semiconductor layer comprises use of processing equipment comprising a chuck to hold said device and a processing chamber, said processing chamber comprises a thermal isolation structure to isolate said chuck from said processing chamber, and
      wherein said chuck is actively cooled.

16. The method according to claim 15, wherein said processing said second semiconductor layer comprises a rapid thermal anneal at greater than 440° C.

17. The method according to claim 15, wherein said device comprises dicing streets and wherein said keeping said interconnection layers at a temperature below 400° C. comprises having a plurality of thermal vias disposed within said dicing streets to remove heat from said shielding heat conducting layer.

18. The method according to claim 15, wherein said shielding heat conducting layer is kept at a temperature below about 400° C.

19. The method according to claim 15, wherein said first transistors are kept at a temperature below about 400° C.

20. The method according to claim 15, wherein said shielding heat conducting layer is constructed to provide at least 2 times higher heat conduction in the horizontal direction than in the vertical direction.

* * * * *